United States Patent
Kelem et al.

(10) Patent No.: US 7,548,084 B2
(45) Date of Patent: *Jun. 16, 2009

(54) FAULT TOLERANT INTEGRATED CIRCUIT ARCHITECTURE

(75) Inventors: Steven Hennick Kelem, Los Altos Hills, CA (US); Jaime C. Cummins, Saratoga, CA (US); John L. Watson, Edgewood, WA (US); Robert Plunkett, Sunnyvale, CA (US); Stephen L. Wasson, Marina, CA (US); Brian A. Box, Seabrook, NH (US); Enno Wein, San Jose, CA (US); Charles A. Furciniti, Bedford, NH (US)

(73) Assignee: Element CXI, LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/766,310

(22) Filed: Jun. 21, 2007

(65) Prior Publication Data

US 2008/0036488 A1 Feb. 14, 2008

Related U.S. Application Data

(63) Continuation-in-part of application No. 11/471,875, filed on Jun. 21, 2006, now Pat. No. 7,429,870, and a continuation-in-part of application No. 11/471,832, filed on Jun. 21, 2006, now Pat. No. 7,427,871.

(51) Int. Cl.
*H03K 19/003* (2006.01)
(52) U.S. Cl. .................. 326/9; 326/10; 326/39
(58) Field of Classification Search ................ 326/9–10, 326/39–41
See application file for complete search history.

(56) References Cited

U.S. PATENT DOCUMENTS

2004/0071142 A1* 4/2004 Moriwaki et al. ........... 370/392

* cited by examiner

*Primary Examiner*—Anh Q Tran
(74) *Attorney, Agent, or Firm*—Nancy R. Gamburd; Gamburd Law Group LLC

(57) ABSTRACT

The exemplary embodiments provide a resilient integrated circuit. An exemplary IC comprises a plurality of composite circuit elements, a state machine element (SME), and a plurality of communication elements. Each composite circuit element comprises an element interface and a selected circuit element which may vary by element type, and which may be configurable. The state machine element assigns various functions based on element type, such as assigning a first configuration to a first element type, assigning a second configuration to a second element type, and providing a first data link for the corresponding assignments. In response to detection of a fault or failure, the state machine element re-assigns the first configuration to another composite circuit element and creates a second data link for performance of the same function. The assignment, routing, fault detection, and re-assignment and data re-routing can occur in real time for a wide variety of programs and algorithms, providing for the IC to continue the same functioning despite defects which may arise during operation.

74 Claims, 21 Drawing Sheets

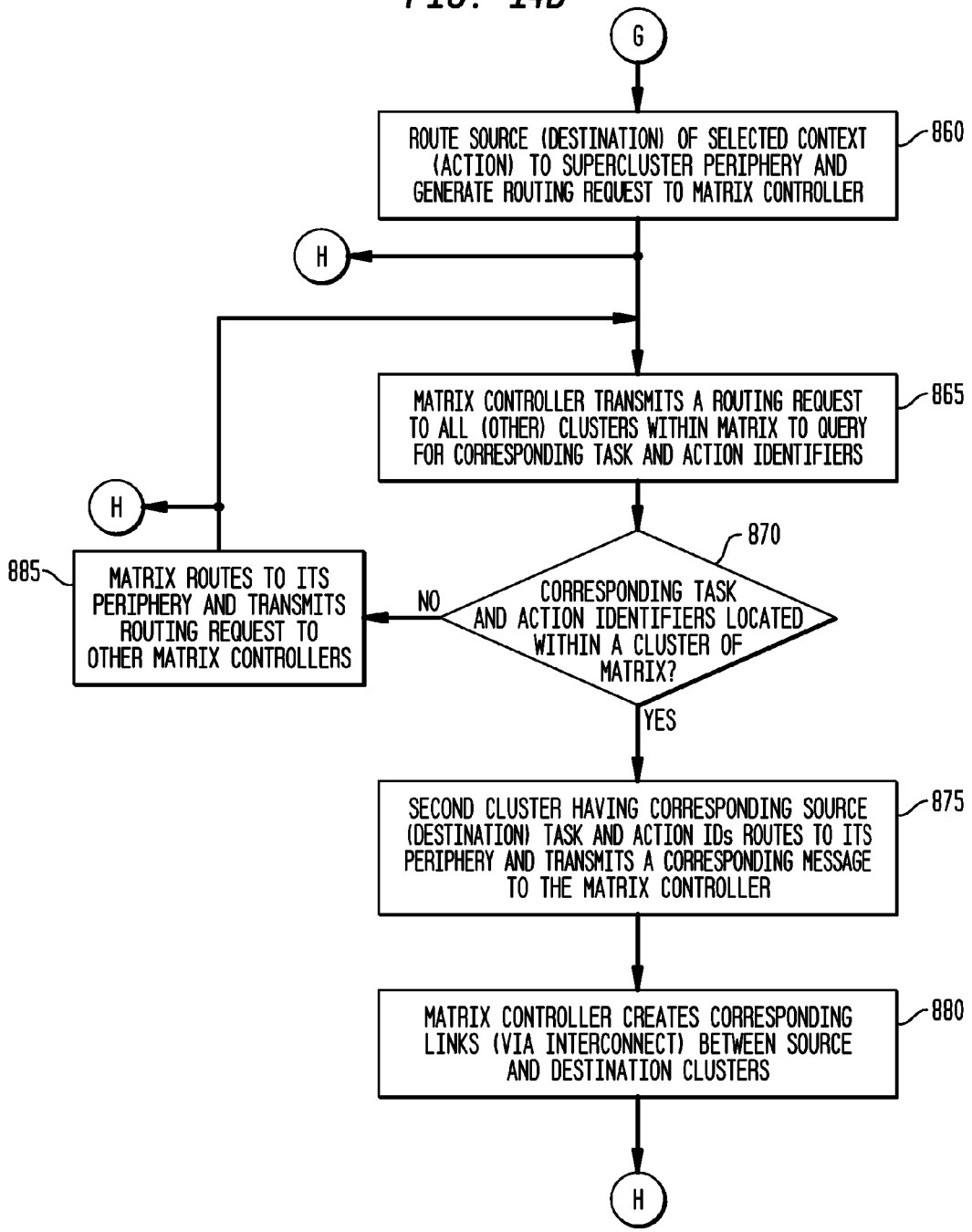

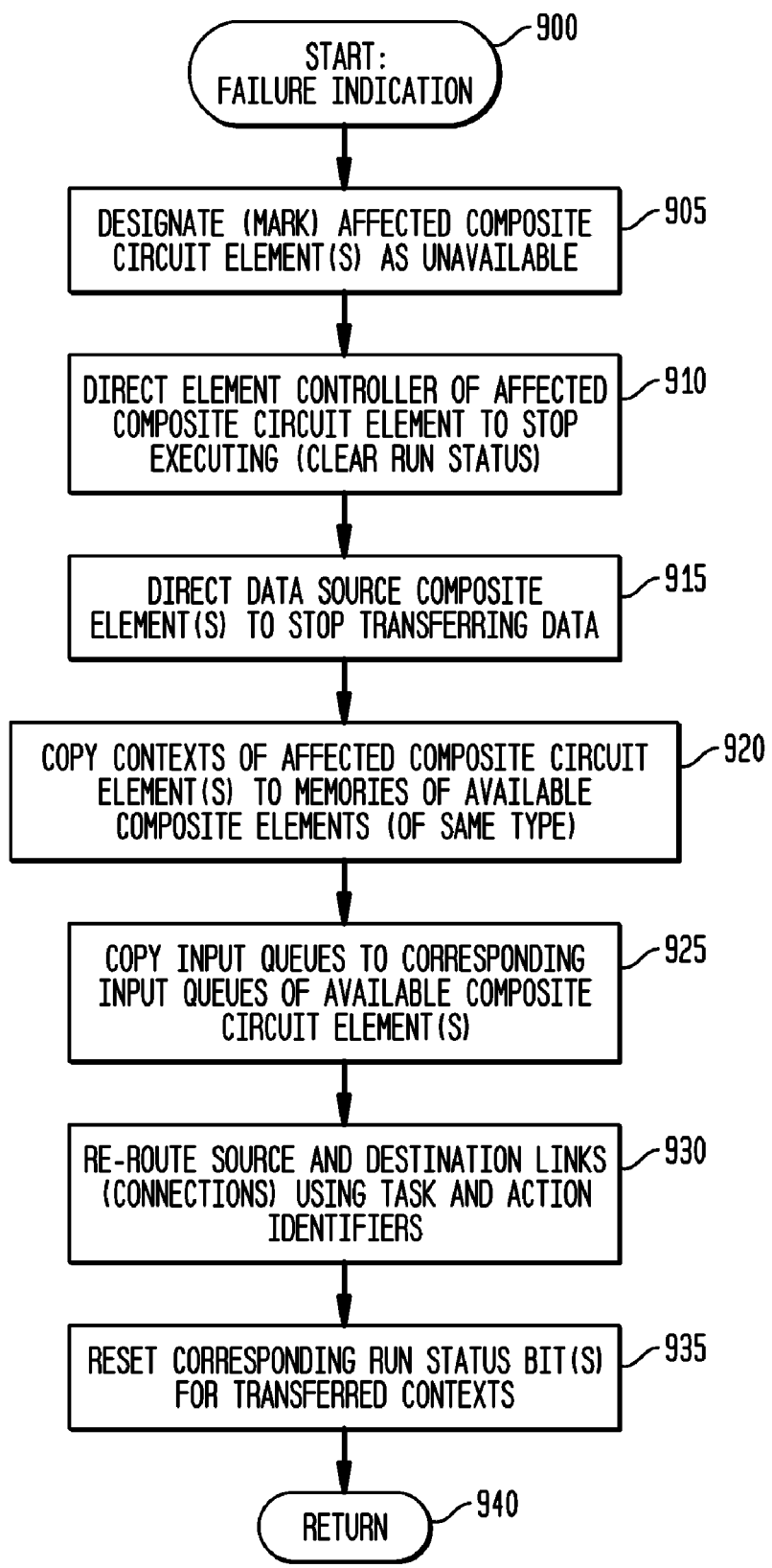

FIG. 16

| 1010 | 1015 | 1020 | 1025 | 1030 | 1035 | 1040 | 1045 | 1050 | 1055 | 1060 | 1065 | 1070 | 1075 | 1080 | 1085 |
|---|---|---|---|---|---|---|---|---|---|---|---|---|---|---|---|
| ELEMENT CONFIG. | TASK ID | ACTION ID | SOURCE (DESTINATION) ADDRESS | FORK | SI | S0 | CY | RUN STATUS | PRIORITY | STATE READY | NEXT | LAST CONTEXT | INTERRUPTS | SINGLE-STEP | CONSTANT |

1000

US 7,548,084 B2

FAULT TOLERANT INTEGRATED CIRCUIT ARCHITECTURE

CROSS-REFERENCE TO RELATED APPLICATIONS

This application is a continuation-in-part of and claims priority to Kelem, Steven Hennick et al., U.S. patent application Ser. No. 11/471,832, filed Jun. 21, 2006 and issued Sep. 23, 2008 as U.S. Pat. No. 7,427,871, entitled "Fault Tolerant Integrated Circuit Architecture" (the "first related application"), which is commonly assigned herewith, the contents of all of which are incorporated herein by reference, and with priority claimed for all commonly disclosed subject matter.

This application is also a continuation-in-part of and claims priority to Kelem, Steven Hennick et al., U.S. patent application Ser. No. 11/471,875, filed Jun. 21, 2006 and issued Sep. 30, 2008 as U.S. Pat. No. 7,429,870, entitled "Resilient Integrated Circuit Architecture" (the "second related application"), which is commonly assigned herewith, the contents of all of which are incorporated herein by reference, and with priority claimed for all commonly disclosed subject matter.

FIELD OF THE INVENTION

The present invention relates, in general, to integrated circuits and, more particularly, to integrated circuitry having distributed and configurable circuit elements, distributed communication circuit elements, and distributed control circuit elements, for transferable functionality, fault tolerance and resilience.

BACKGROUND OF THE INVENTION

Historically, integrated circuits ("ICs") which are configurable post-fabrication have been dominated by field programmable gate arrays ("FPGAs"), which provide an array of identical logic gates or other elements. In some integrated circuit embodiments, the gate array is also coupled to one or more microprocessor cores, for the FPGA components to provide configurable, application-specific acceleration of selected computations. The logic elements in an FPGA are typically very "fine-grained", as gate arrays which can be connected through data inputs and outputs ("I/O") to provide a more advanced function such as addition, subtraction or comparison, without separate hard-wired, application-specific components directly providing such advanced functions. The process for configuring the gate arrays of FPGAs is comparatively slow, typically through a serial configuration bus, so that FPGAs generally have not been capable of real-time re-configuration for immediate changes in functionality.

In other circumstances, configurable ICs have involved large-scale (or "coarse-grained") configurable logic elements which are capable of significant functionality, such as multimedia processing, arithmetic processing, and communication functionality. While these large-scale configurable logic elements provide extremely capable acceleration, each group of configurable logic elements is typically different and requires separate programming to carry out its functions. In addition, such large-scale configurable logic elements are not translatable to other functions, exhibiting similar constraints of application-specific ICs ("ASICs").

Configurable capabilities have also been added to microprocessor, ASIC and memory ICs. For example, in memory ICs, extra or redundant rows and columns are fabricated; when subsequent testing may reveal that selected rows and columns have defects, those affected IC regions are disabled, with the balance of the memory IC being useable potentially and, with the redundancy, may still meet the memory capacity specification. In other circumstances, some amount of configurability may be added to correct for design errors and other defects after the IC has been fabricated, or to allow modification of inputs and outputs, such as for configurable I/O and configurable data path widths.

In addition, after configuration and during operation, such FPGAs, ASICs, processors, and other configurable logic do not exhibit resiliency. For example, if a portion of the IC becomes defective during operation, the entire IC fails instantly, losing all functionality. While the IC may be taken off line or removed, diagnosed, and depending upon the damage, possibly reconfigured, such ICs are not capable of real-time reconfiguration and transferring of functionality to unaffected portions of the IC.

Another technology created by IBM and referred to as "eFuse" utilizes electromigration to create microscopic electrical fuses which disable selected or defective portions of the IC, with software utilized to open or close gates to re-route chip logic to the remaining good portions of the IC, such as to correct design flaws, fabrication defects, and manage power consumption. For example, the eFuse technology can disable defective memory rows and columns, and eFuse software can change memory addresses so that data will be stored in the non-defective portions of the memory.

None of these technologies, however, addresses the increasing number of defects which are now arising in sub-100 nm IC fabrication. More particularly, as IC feature size continues to decrease below 90 nm, there are increasing levels of defects and decreased IC yields. In addition, while an IC initially may be sufficiently free of defects to operate for its intended use, the smaller feature size also increases the probability of IC failure during operation, such as due to tunneling and electromigration effects.

In addition, while each of these prior art technologies have their own advantages, such as an ability to correct design flaws and to work-around minor fabrication defects, none of these prior art technologies provide sustainable resiliency over time, during IC operation. Whether defects were created during fabrication or much later, during IC usage, these known technologies simply cannot accommodate both certain kinds of defects and certain levels of defects, and the entire IC fails completely. Such failure is often catastrophic, such that the entire IC fails instantly and without warning. For example, if a region of a microprocessor fails, the entire microprocessor becomes instantly useless.

To attempt to provide some level of resiliency, these various technologies have simply added some redundancy. For example, multiple processors will be placed on the same IC, such that if a defect causes one processor to fail, a redundant processor is available to take over. In these circumstances, however, either the redundant processor was previously completely idle and unused, or its prior functioning has been superseded and completely lost. In either event, this resiliency is at the expense of approximately twice the IC area and significantly increased manufacturing costs. In addition, such basic redundancy efforts do not account for defects which may occur within all redundant components, as even small defects may cause such components to fail.

As a consequence, a need remains for an integrated circuit architecture which is significantly resilient and robust despite fabrication or usage defects which can affect any components, without the expense of otherwise unused redundancy. Such an IC should provide for ongoing adaptation, such that when a defect arises, functionality may be transferred to an unaffected region in real-time or near-real time. Such technology should provide for configuration (programming or other software) for the IC which allows such transferable functionality, without requiring the entire program to be transferred to a completely redundant processor. In addition, such an IC should provide for a graceful degradation with increasing defects or problems, rather than a catastrophic failure.

SUMMARY OF THE INVENTION

The exemplary embodiments of the present invention provide an integrated circuit architecture which is capable of significant resiliency, without otherwise unused redundancy. The exemplary IC embodiment may be adapted on an ongoing basis, as may be necessary in the event of a defect, or as may be desirable for incorporation of a new program or function. For example, in the event a defect arises, functionality may be transferred to an unaffected region in real-time or near-real time. The exemplary architecture and software for the IC also allows such transferable functionality, without requiring the entire program to be transferred to a completely redundant processor or otherwise unused computational block. In addition, the exemplary IC embodiments provide for a graceful degradation and notification with increasing defects or problems, which may occur during use (in addition to fabrication), rather than a catastrophic failure.

In an exemplary embodiment, an apparatus is provided which comprises a plurality of composite circuit elements, a plurality of communication elements coupled to the plurality of composite circuit elements; and a state machine element coupled to the plurality of composite circuit elements and to the plurality of communication elements. Each composite circuit element comprises a corresponding element interface and a corresponding circuit element of a plurality of circuit element types, with each composite circuit element having at least one input and at least one output, and with a first composite circuit element of the plurality of composite circuit elements having a first circuit element type of the plurality of circuit element types and a second composite circuit element of the plurality of composite circuit elements having a second circuit element type of the plurality of circuit element types. The state machine element is adapted to assign a first action to the first composite circuit element, to assign a second action to the second composite circuit element, and to provide for a first virtual data link through a selected communication element, of the plurality of communication elements, from the at least one output of the first composite circuit element to the at least one input of the second composite circuit element.

In an exemplary embodiment, the plurality of circuit element types comprises at least one of the following circuit element types: a plurality of configurable element types, a memory element type, a plurality of communication element types; and a plurality of non-configurable element types. For example, the first circuit element type is a first configurable element type of the plurality of configurable element types, the second circuit element type is a second configurable element type of the plurality of configurable element types, and wherein the state machine element is further adapted to assign the first action as a first configuration of the first composite circuit element and assign the second action as a second configuration of the second composite circuit element. The state machine element may be further adapted to obtain the first configuration and first configurable element type from a first symbolic netlist element and to obtain the second configuration and second configurable circuit element type from a second symbolic netlist element during a run-time binding of the first action and the second action. In addition, the first symbolic netlist element further comprises a pointer designating the first virtual data link as a data communication to the at least one input of the second composite circuit element, and the second symbolic netlist element may further comprise a pointer designating the virtual data link as a data communication from the at least one output of the first composite circuit element.

The state machine element may be further adapted to assign the first action to the first composite circuit element and assign the second action to the second composite circuit element following a determination that both the first composite circuit element and the second composite circuit element are operating properly. The operational determination is at least one of the following determinations: a periodic diagnostic performed by at least one composite circuit element of the plurality of composite circuit elements; a background diagnostic performed as a selected context of at least one composite circuit element of the plurality of composite circuit elements; or a comparison test performed by a plurality of composite circuit elements of the same circuit element type.

The state machine element is further adapted, in response to a detected fault of the first composite circuit element, to assign the first action to a third composite circuit element of the plurality of composite circuit elements, the third composite circuit element having a circuit element of the first circuit element type, and the state machine element further adapted to provide for a second virtual data link through a communication element, of the plurality of communication elements, from the at least one output of the third composite circuit element to the at least one input of the second composite circuit element. Alternatively, the state machine element is further adapted, in response to a detected fault of the first circuit element, to assign the first action to a third composite circuit element of the plurality of composite circuit elements, the third composite circuit element having a circuit element of a third circuit element type, and the state machine element further adapted to provide for a third virtual data link through a communication element, of the plurality of communication elements, from the at least one output of the third composite circuit element to the at least one input of the second composite circuit element. In an exemplary embodiment, the state machine element is further adapted to use a stored transformation table having a reference to the third composite circuit element for transfer of the first action.

The plurality of composite circuit elements also may be adapted to store periodically a then current state and, in response to a detected fault, to retrieve the stored state and recommence operation using the stored state.

Also in an exemplary embodiment, each corresponding element interface comprises: a first memory coupled to the corresponding circuit element, the first memory adapted to store a plurality of configurations as corresponding contexts; an element controller coupled to the corresponding circuit element; and a second memory coupled to the corresponding circuit element, the second memory adapted to provide a plurality of input queues for data input to the corresponding circuit element. Each corresponding context defines a configuration of the corresponding circuit element, and either one or more data input sources or one or more data output destinations. The element interface may further comprise a third memory coupled to the circuit element, the third memory adapted to provide a plurality of output queues for data output from the circuit element. Alternatively, the element interface may include the third memory for output queues, without including the second memory for input queues. In an exemplary embodiment, the element controller is adapted, for a selected context of the plurality of contexts, to direct an execution of the selected context by the circuit element when a selected input queue corresponding to the selected context has input data, when a selected output queue corresponding to the selected context has capacity to store output data, and when a status bit corresponding to the selected context is set for execution. Also, the element controller may be further adapted to store a current state of a partial execution of a first context in the first memory, execute a second context, and retrieve the current state and resume execution of the first context.

The element controller may be further adapted to arbitrate among a plurality of contexts which are ready for execution and to select a corresponding context for execution as a result of the arbitration. For example, the arbitration implements at least one of the following arbitration methods: a round-robin, a priority, a most recently executed, a least recently executed, or a scheduled execution.

Similarly, in an exemplary embodiment, each communication element of the plurality of communication elements further comprises a corresponding element interface and a corresponding communication circuit element, and the state machine element further comprises a corresponding element interface and a corresponding state machine circuit element.

In an exemplary embodiment, the plurality of communication elements further comprise: a plurality of first communication elements, the plurality of first communication elements adapted both to route at least one first data word and to switch at least one second data word; and a full interconnect element coupled to the plurality of composite circuit elements and to the plurality of first communication elements, the full interconnect element adapted to couple any output of a composite circuit element of the plurality of composite circuit elements to any input of another composite circuit element of the plurality of composite circuit elements or to the plurality of first communication elements. The full interconnect element may be distributed among a plurality of switches, pass transistors, multiplexers or demultiplexers. In other exemplary embodiments, the full interconnect element is a crossbar switch. Also, the full interconnect element may be adapted to provide at least one of the following physical data links: a plurality of one-to-one input and output data links, a one-to-many broadcast data link, a many-to-one data link.

The state machine element may provide for the first virtual data link through either a selected first communication element of the plurality of first communication elements or through the full interconnect element. A selected communication element may be further adapted to determine from the first virtual data link at least one first physical data link, of a plurality of physical data links, from the at least one output of the first composite circuit element to the at least one input of the second composite circuit element. In addition, the selected communication element is further adapted to create the plurality of physical data links at a selected time or a selected clock cycle using a routing table stored in a corresponding memory.

In exemplary embodiments, the plurality of communication elements further comprise a plurality of second communication elements which are adapted to route or switch at least one third data word between a first array of the plurality of composite circuit elements and a second array of the plurality of composite circuit elements. The plurality of communication elements may also comprise an intercluster queue adapted to buffer at least one third data word from a first array of the plurality of composite circuit elements and transfer the at least one third data word to an adjacent second array of the plurality of composite circuit elements In another exemplary embodiment, the plurality of communication elements further comprise a plurality of cluster queues; and a full interconnect element coupled to the plurality of composite circuit elements, the full interconnect element adapted to couple any output of a composite circuit element of the plurality of composite circuit elements to any input of another composite circuit element of the plurality of composite circuit elements or to the plurality of cluster queues. The full interconnect element may be distributed among a plurality of switches, pass transistors, multiplexers or demultiplexers, or may be a crossbar switch, and also may be adapted to provide at least one of the following physical data links: a plurality of one-to-one input and output data links, a one-to-many broadcast data link, a many-to-one data link. The plurality of communication elements also may further comprise: a message manager circuit coupled to the state machine element, the message manager circuit adapted both to route at least one first data word and to switch at least one second data word. In addition, the plurality of communication elements may also include one or more intercluster queues adapted to buffer at least one third data word from a first array of the plurality of composite circuit elements and transfer the at least one third data word to an adjacent second array of the plurality of composite circuit elements. The state machine element also may be further adapted to provide for the first virtual data link through either a selected cluster queue of the plurality of cluster queues or through the full interconnect element.

Exemplary embodiments may also include a message manager circuit coupled to the state machine element, the message manager circuit adapted to provide a communication interface to an external bus or an external memory. In addition, the message manager circuit may also provide a uniform address space for a distributed plurality of memory composite circuit elements.

In exemplary embodiments, the plurality of circuit element types may comprise any of the following circuit element types: a configurable arithmetic logic unit, a configurable multiplier, a configurable bit reordering element a configurable multiply and accumulate element, a configurable Galois multiplier, a configurable barrel shifter, a configurable look-up table, a programmable controller, a configurable controller, and a configurable plurality of arithmetic logic units.

In exemplary embodiments, the state machine element may be coupled to the plurality of composite circuit elements either directly or through at least one communication element of the plurality of communication elements. In other exemplary embodiments, the state machine element is an external controller or external processor coupled to the plurality of composite circuit elements through at least one communication element of the plurality of communication elements. Typically, the state machine element further comprises: a finite state machine circuit and a memory adapted to store state information.

In exemplary embodiments, another operating mode is provided. In this mode, the state machine element provides for a first physical data link through the selected communication element from the at least one output of the first composite circuit element to the at least one input of the second composite circuit element, and wherein the state machine element is further adapted to provide for execution of the first action and the second action.

In another exemplary embodiment, an inventive apparatus comprises: (1) a plurality of circuit arrays, each circuit array of the plurality of circuit arrays comprising: (a) a plurality of composite circuit elements, each composite circuit element comprising an element interface and a circuit element of a plurality of circuit element types, each composite circuit element having at least one input and at least one output, the plurality of circuit element types comprising a plurality of configurable element types; (b) a full interconnect element coupled to the plurality of composite circuit elements, the full interconnect element adapted to couple any output of a first composite circuit element of the plurality of composite circuit elements to any input of a second composite circuit element of the plurality of composite circuit elements; (c) a plurality of first communication elements coupled to the full interconnect element; (d) a state machine element coupled to the plurality of composite circuit elements, to the full interconnect element, and to the plurality of first communication elements; and (2) an interconnect coupled to the plurality of circuit arrays, the interconnect comprising a plurality of second communication elements coupled to the plurality of first communication elements, the plurality of second communication elements adapted to transfer data from a first circuit array to a second circuit array of the plurality of circuit arrays.

In another exemplary embodiment, an inventive apparatus comprises a plurality of circuit arrays, at least two circuit arrays of the plurality of circuit arrays comprising: (a) a plurality of configurable composite circuit elements, each composite circuit element comprising an element interface and a configurable circuit element of a plurality of configurable circuit element types, each composite circuit element having a plurality of inputs and a plurality of outputs; (b) an interconnect element coupled to the plurality of configurable composite circuit elements, the interconnect element adapted to couple an output of a first configurable composite circuit element of the plurality of configurable composite circuit elements to an input of a second configurable composite circuit element of the plurality of configurable composite circuit elements; (c) a plurality of first communication elements coupled to the interconnect element; and (d) a state machine element coupled to the plurality of configurable composite circuit elements, to the full interconnect element, and to the plurality of first communication elements, the state machine element adapted to assign a first action to a first configurable composite circuit element of a first circuit element type of the plurality of configurable circuit element types, to assign a second action to a second configurable composite circuit element of a second circuit element type of the plurality of configurable circuit element types, and to provide for a first data link from a first output of the plurality of outputs of the first composite circuit element to a first input of the plurality of inputs of the second composite circuit element, the first data link through the interconnect element or through a first communication element of the plurality of first communication elements.

In another exemplary embodiment, an inventive integrated circuit comprises: (1) a plurality of circuit arrays, with each circuit array of the plurality of circuit arrays comprising: (a) a plurality of composite circuit elements, each composite circuit element comprising an element interface and a circuit element of a plurality of circuit element types, each composite circuit element having at least one input and at least one output, the plurality of circuit element types comprising a plurality of configurable element types; (b) a full interconnect element coupled to the plurality of composite circuit elements, the full interconnect element adapted to couple any output of a first composite circuit element of the plurality of composite circuit elements to any input of a second composite circuit element of the plurality of composite circuit elements; (c) a plurality of first communication elements coupled to the full interconnect element; (d) a state machine element coupled to the plurality of composite circuit elements, to the full interconnect element, and to the plurality of first communication elements, the state machine element adapted to assign a first action to a first composite circuit element of a first circuit element type of the plurality of circuit element types, to assign a second action to a second composite circuit element of a second circuit element type of the plurality of circuit element types, to provide for a first data link from the at least one output of the first composite circuit element to the at least one input of the second composite circuit element, and in response to a detected fault of the first composite circuit element, to assign the first action to a third composite circuit element of the plurality of composite circuit elements and provide for a second data link from the at least one output of the third composite circuit element to the at least one input of the second composite circuit element; and (2) an interconnect coupled to the plurality of circuit arrays, the interconnect comprising a plurality of second communication elements coupled to the plurality of first communication elements, the plurality of second communication elements adapted to transfer data from a first circuit array to a second circuit array of the plurality of circuit arrays.

In another exemplary embodiment, an inventive apparatus comprises: a plurality of composite circuit elements, each composite circuit element comprising an element interface and a circuit element of a plurality of circuit element types, each composite circuit element having an input and an output; and a state machine element coupled to the plurality of composite circuit elements, the state machine element adapted to assign a first function to a first composite circuit element of a first element type of the plurality of element types, to assign a second function to a second composite circuit element of a second element type of the plurality of element types, and to provide a first data link from the output of the first composite circuit element to the input of the second composite circuit element.

In another exemplary embodiment, an inventive apparatus comprises: a plurality of composite circuit elements, each composite circuit element comprising a corresponding element interface and a corresponding circuit element of a plurality of circuit element types, a first composite circuit element of the plurality of composite circuit elements having a first circuit element type of the plurality of circuit element types, a second composite circuit element of the plurality of composite circuit elements having a second circuit element type of the plurality of circuit element types; a plurality of communication elements coupled to the plurality of composite circuit elements; and a state machine element coupled to the plurality of communication elements, the state machine element adapted during run time to assign a first action to the first composite circuit element, to assign a second action to the second composite circuit element, and to provide for a first data link between the first composite circuit element and the second composite circuit element.

In another exemplary embodiment, an inventive apparatus comprises: a plurality of composite circuit elements, each composite circuit element comprising an element interface and a circuit element of a plurality of circuit element types; and a state machine element coupled to the plurality of composite circuit elements, the state machine element adapted to assign a first function to a first composite circuit element, to assign a second function to a second composite circuit element, and to provide a first data link between the first composite circuit element and the second composite circuit element; the state machine element further adapted to, in response to an unavailability of the first composite circuit element, to assign the first function to a third composite circuit element of the plurality of composite circuit elements and to provide for a second data link between the third composite circuit element and the second composite circuit element.

In another exemplary embodiment, an inventive apparatus comprises: a plurality of communication elements; a plurality of composite circuit elements coupled to the plurality of communication elements, each composite circuit element comprising an element interface and a circuit element of a plurality of circuit element types, a first composite circuit element of the plurality of composite circuit elements having an assigned first action, a second composite circuit element of the plurality of composite circuit elements having an assigned second action, the first composite circuit element having a first data link to the second composite circuit element; and a state machine element coupled to the plurality of communication elements, the state machine element adapted to, in response to an unavailability of the first composite circuit element, to assign the first action to a third composite circuit element of the plurality of composite circuit elements and to provide for a second data link between the third composite circuit element and the second composite circuit element.

In exemplary embodiments, the first composite circuit element may be unavailable due to a detected fault. The fault may be detected by at least one of the following operational determinations: a periodic diagnostic performed by at least one composite circuit element of the plurality of composite circuit elements; a background diagnostic performed as a selected context of at least one composite circuit element of the plurality of composite circuit elements; or a comparison test performed by a plurality of composite circuit elements of the same circuit element type. In exemplary embodiments, the state machine element is further adapted to discontinue all activity of the first composite circuit element and to designate the first composite circuit element as unavailable in a stored availability table or map. In addition, the first composite circuit element may be unavailable due to an assignment by the state machine element of a third action having a higher priority than the first action.

In exemplary embodiments, the first composite circuit element and the third composite circuit element each have a first configurable element type of the plurality of configurable element types, the second composite circuit element has a second configurable element type of the plurality of configurable element types, and the state machine element is further adapted to assign the first action as a first configuration of the third composite circuit element. The state machine element may be further adapted to obtain the first configuration and first configurable element type from a first symbolic netlist element. The first symbolic netlist element may further comprise a symbolic pointer designating the second data link as a virtual data communication between the third composite circuit element and the second composite circuit element In exemplary embodiments, the first composite circuit element has a first configurable element type of the plurality of configurable element types, the second composite circuit element has a second configurable element type of the plurality of configurable element types, the third composite circuit element has a third configurable element type of the plurality of configurable element types, and the state machine element is further adapted to assign the first action as a first configuration of the third composite circuit element. The state machine element may be further adapted to use a stored transformation table having a reference to the third composite circuit element for transfer of the first action.

In another exemplary embodiment, an inventive apparatus comprises: a plurality of first communication elements; an interconnect element coupled to the plurality of first communication elements; a plurality of configurable composite circuit elements coupled to the plurality of first communication elements and to the interconnect element, each configurable composite circuit element comprising an element interface and a configurable circuit element of a plurality of configurable circuit element types, each composite circuit element having at least one input and at least one output, a first configurable composite circuit element of the plurality of configurable composite circuit elements having a first action, a second configurable composite circuit element of the plurality of configurable composite circuit elements having a second action, the at least one output of the first configurable composite circuit element having a first data link to the at least one input of the second configurable composite circuit element through the interconnect element or a selected communication element of the plurality of communication elements; and a state machine element coupled to the plurality of configurable composite circuit elements, to the interconnect element and to the plurality of communication elements, the state machine element adapted to, in response to a detected fault of the first configurable composite circuit element, to assign the first action to a third configurable composite circuit element of the plurality of composite circuit elements and to provide for a second data link from the at least one output of the third composite circuit element to the at least one input of the second composite circuit element through the interconnect element or a selected communication element of the plurality of communication elements.

In exemplary embodiments, when the first configurable composite circuit element and the third configurable composite circuit element have the same configurable circuit element type, the state machine element is further adapted to transfer at least one configuration of the first configurable composite circuit element to the third configurable composite circuit element. In addition, the state machine element may be further adapted to maintain a count of available configurable composite circuit elements of the plurality of configurable composite circuit element, and in response to detection of the fault of the first configurable composite circuit element having a plurality of contexts for performance of corresponding functions, to provide the plurality of contexts to one or more available configurable composite circuit elements of the plurality of configurable composite circuit elements to perform the corresponding functions.

In another exemplary embodiment, an inventive apparatus comprises: (1) a plurality of circuit arrays, each circuit array of the plurality of circuit arrays comprising: an interconnect element; a plurality of first communication elements coupled to the interconnect element; a plurality of composite circuit elements coupled to the interconnect element, each composite circuit element comprising an element interface and a circuit element of a plurality of circuit element types, a first composite circuit element of the plurality of composite circuit elements having a first action, a second composite circuit element of the plurality of composite circuit elements having a second action, the first composite circuit element having a first data link to the second configurable composite circuit element through the interconnect element or a selected first communication element of the plurality of first communication elements; and a state machine element coupled to the plurality of composite circuit elements, to the full interconnect element, and to the plurality of first communication elements, the state machine element adapted to, in response to an unavailability of the first composite circuit element, to assign the first action to a third composite circuit element of the plurality of composite circuit elements and to provide for a second data link between the third composite circuit element and the second composite circuit element through the interconnect element or a selected first communication element of the plurality of first communication elements; and (2) a plurality of second communication elements coupled to the plurality of first communication elements, the plurality of second communication elements adapted to transfer data from a first circuit array to a second circuit array of the plurality of circuit arrays.

In exemplary embodiments, a first state machine element of the first circuit array is further adapted provide for the first data link by transferring a routing request, through a second communication element, to a plurality of other state machine elements of other circuit arrays of the plurality of circuit arrays and by routing the first data link to a first communication element.

In another exemplary embodiment, an inventive self-healing integrated circuit is provided, the integrated circuit comprising: a first plurality of composite circuit elements, a first composite circuit element of the first plurality of composite circuit elements adapted to perform a first function; a plurality of communication elements coupled to the first plurality of composite circuit elements; a second plurality of composite circuit elements coupled to the first composite circuit element through a first plurality of data links through at least one communication element of the plurality of communication elements for performance of the first function; and a state machine element coupled to the first plurality of composite circuit elements and adapted, in response to an unavailability of the first composite circuit element, to adapt a second composite circuit element of the first plurality of composite circuit elements to provide the first function and to provide a second plurality of data links between the second composite circuit element and the second plurality of composite circuit elements for performance of the first function.

In another exemplary embodiment, an inventive apparatus comprises: a plurality of composite circuit elements, each composite circuit element comprising an element interface and a circuit element of a plurality of circuit element types; and a state machine element coupled to the plurality of composite circuit elements, the state machine element adapted to assign a first function to a first composite circuit element, to assign a second function to a second composite circuit element, and to provide a first data link between the first composite circuit element and the second composite circuit element; the state machine element further adapted to, in response to a detected fault of the first composite circuit element, to assign the first function to a third composite circuit element of the plurality of composite circuit elements and to provide for a second data link between the third composite circuit element and the second composite circuit element.

These and additional embodiments are discussed in greater detail below. Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings and examples which form a portion of the specification, wherein like reference numerals are used to identify identical components in the various views, and wherein reference numerals with alphabetic characters are utilized to identify additional types, instantiations or variations of a selected component embodiment in the various views, in which:

FIG. 14, divided into FIG. 14A, FIG. 14B, FIG. 14C and FIG. 14D, is a flow diagram illustrating an exemplary algorithm or symbolic netlist run-time binding process in accordance with the teachings of the present invention.

FIG. 15 is a flow diagram illustrating a first exemplary re-assignment and re-binding process in accordance with the teachings of the present invention.

FIG. 16 is a diagram illustrating an exemplary configuration and control word in accordance with the teachings of the present invention.

DETAILED DESCRIPTION OF EXEMPLARY EMBODIMENTS

Figure 1:
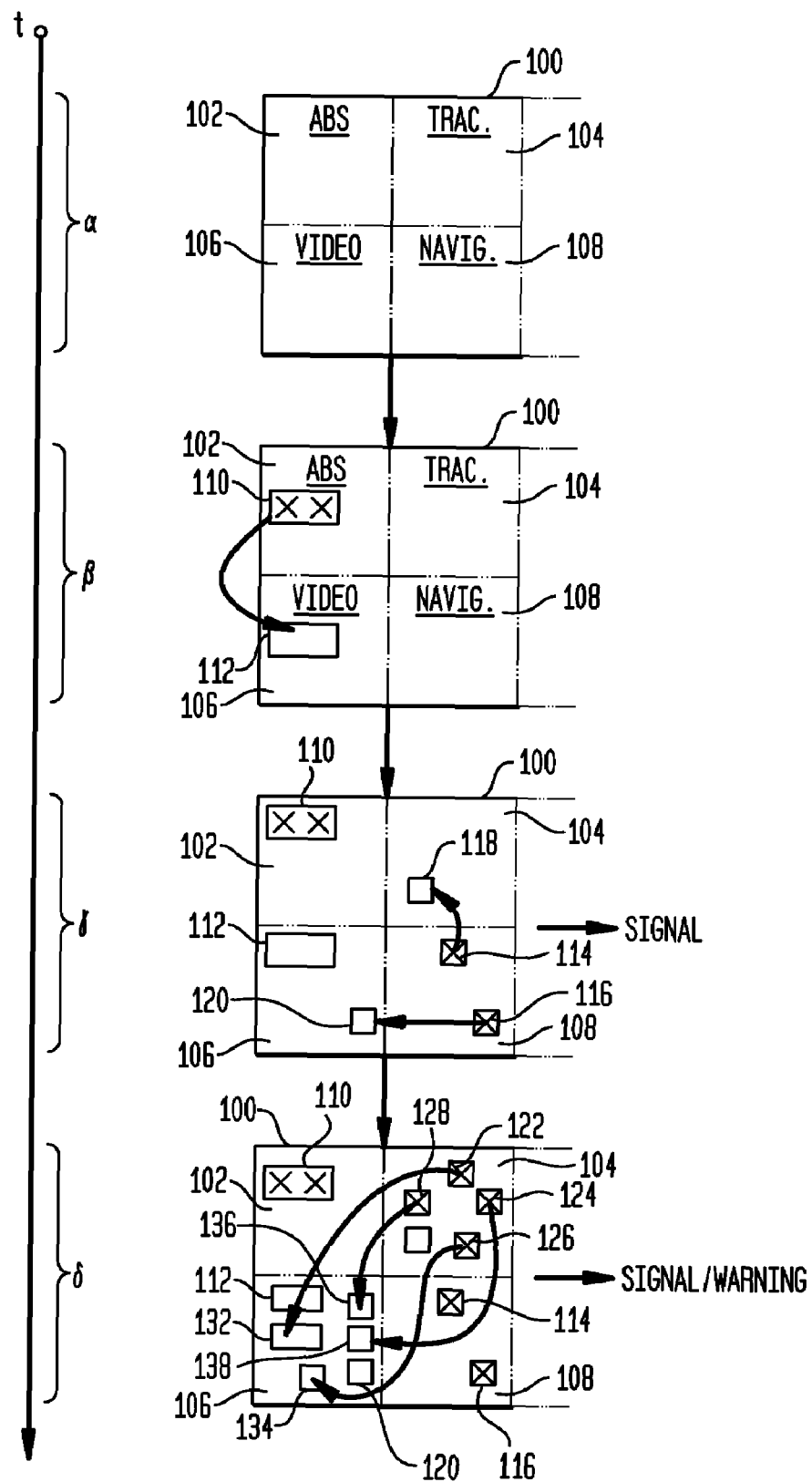
FIG. 1 is a diagram illustrating, at a high or conceptual level, resiliency of an exemplary apparatus embodiment in accordance with the teachings of the present invention.

While the present invention is susceptible of embodiment in many different forms, there are shown in the drawings and will be described herein in detail specific examples and embodiments thereof, with the understanding that the present disclosure is to be considered as an exemplification of the principles of the invention and is not intended to limit the invention to the specific examples and embodiments illustrated, and that numerous variations or modifications from the described embodiments may be possible and are considered equivalent. In this respect, before explaining at least one embodiment consistent with the present invention in detail, it is to be understood that the invention is not limited in its application to the details of construction and to the arrangements of components set forth above and below, illustrated in the drawings, or as described in the examples. Methods, systems and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

As indicated above, one of the most novel features of the IC architecture of the present invention is its resiliency, providing adaptation for manufacturing defects, flaws which may arise during usage of the IC, and adaptability for new features, services, algorithms, and other events. The resiliency and robustness of the inventive IC architecture allows for increasing yields from IC fabrication, as the inventive ICs fabricated with various defects will nonetheless be quite useable and fully functional.

In addition, during operation, this resiliency may be described as "neural" or biological self-healing, because in the event a portion of the IC is damaged or otherwise becomes unusable, another portion of the IC is effectively "recruited" or reassigned to take over and perform the functions of the damaged portion. In addition, as discussed in greater detail below, as the functions are reassigned, new control and data pathways are also created, so that the transferred operations continue to perform seamlessly with other IC operations. Such adaptive resilience and self-healing may occur in real-time or near real-time, depending upon the selected embodiment. This allows the IC to continue to operate without disruption provided that sufficient computing resources remain operational. Such resiliency provides for a graceful degradation of performance in the event of damage to the IC, rather than a catastrophic failure, and is especially significant in health and safety applications.

As discussed in greater detail below, several features of the exemplary embodiments of the present invention enable such resiliency, continued operation and eventual graceful degradation. First, the IC or other device is comprised of a plurality of "composite" circuit elements (which comprise various types of computational elements, a uniform I/O interface, and a uniform control structure); these composite circuit elements are effectively interchangeable or fungible, such that in the event of a loss of functionality of an element, its functions can be taken over by another composite circuit element (either identical or similar), when available. Second, the plurality of computational elements is selected to enable the performance of virtually any functionality, that is, they are computationally complete. Third, control functionality is distributed among a plurality of circuit "cluster" controllers, referred to herein as "state machine elements" or "finite state machine elements", such that control functionality may be transferred between and among these distributed controllers, as needed. Fourth, the composite circuit elements and/or their interconnections are configurable, to aid in the transfer of functionality and any corresponding routing of data and control paths. Fifth, all selected operations are assigned and bound within the device at the initial run-time, and may be re-assigned and re-bound subsequently as may be needed to transfer corresponding functionality to other composite circuit elements and continue operations.

Figure 2:
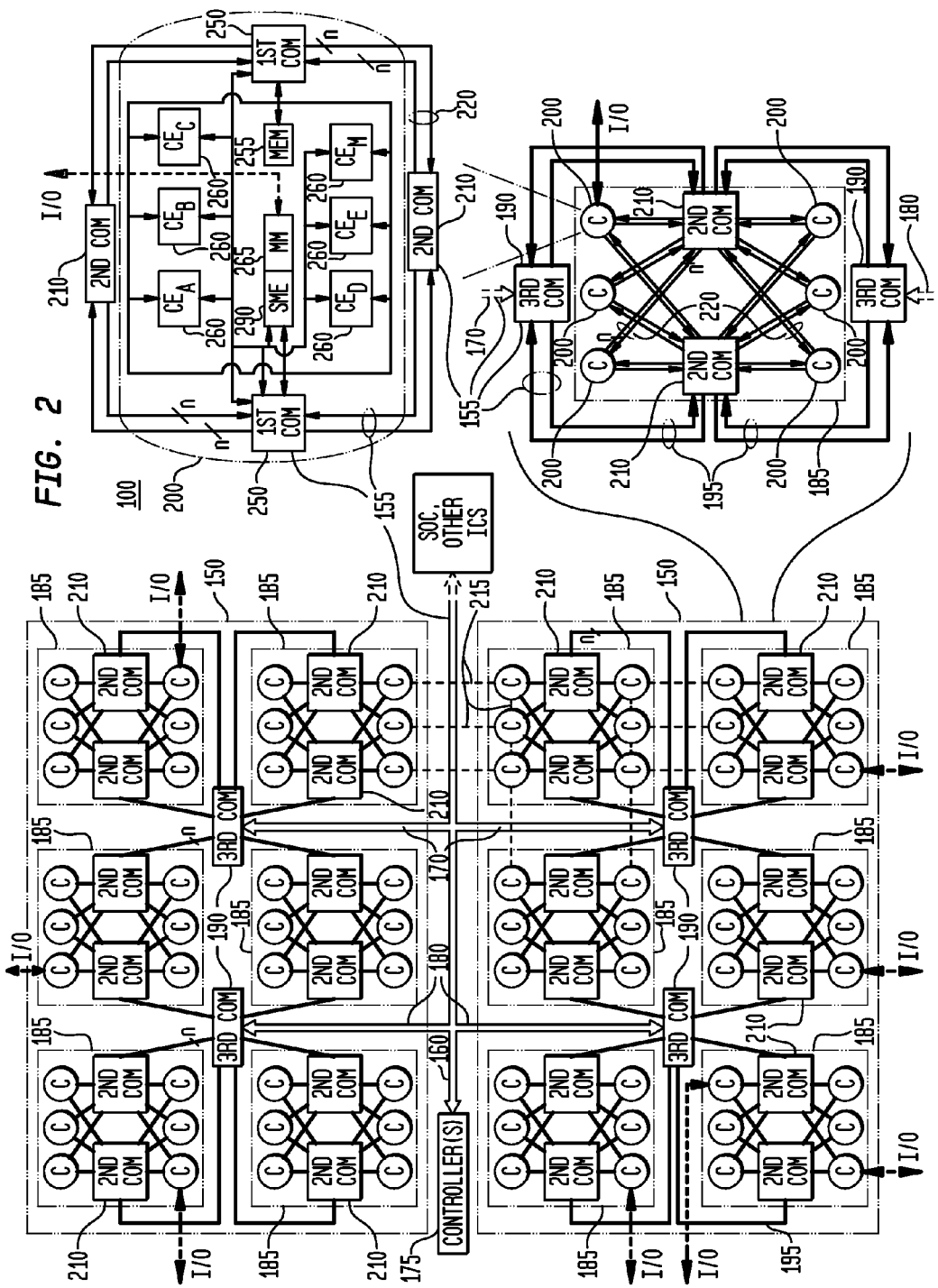
FIG. 2 is a block diagram illustrating an exemplary first apparatus embodiment in accordance with the teachings of the present invention.
Figure 3:
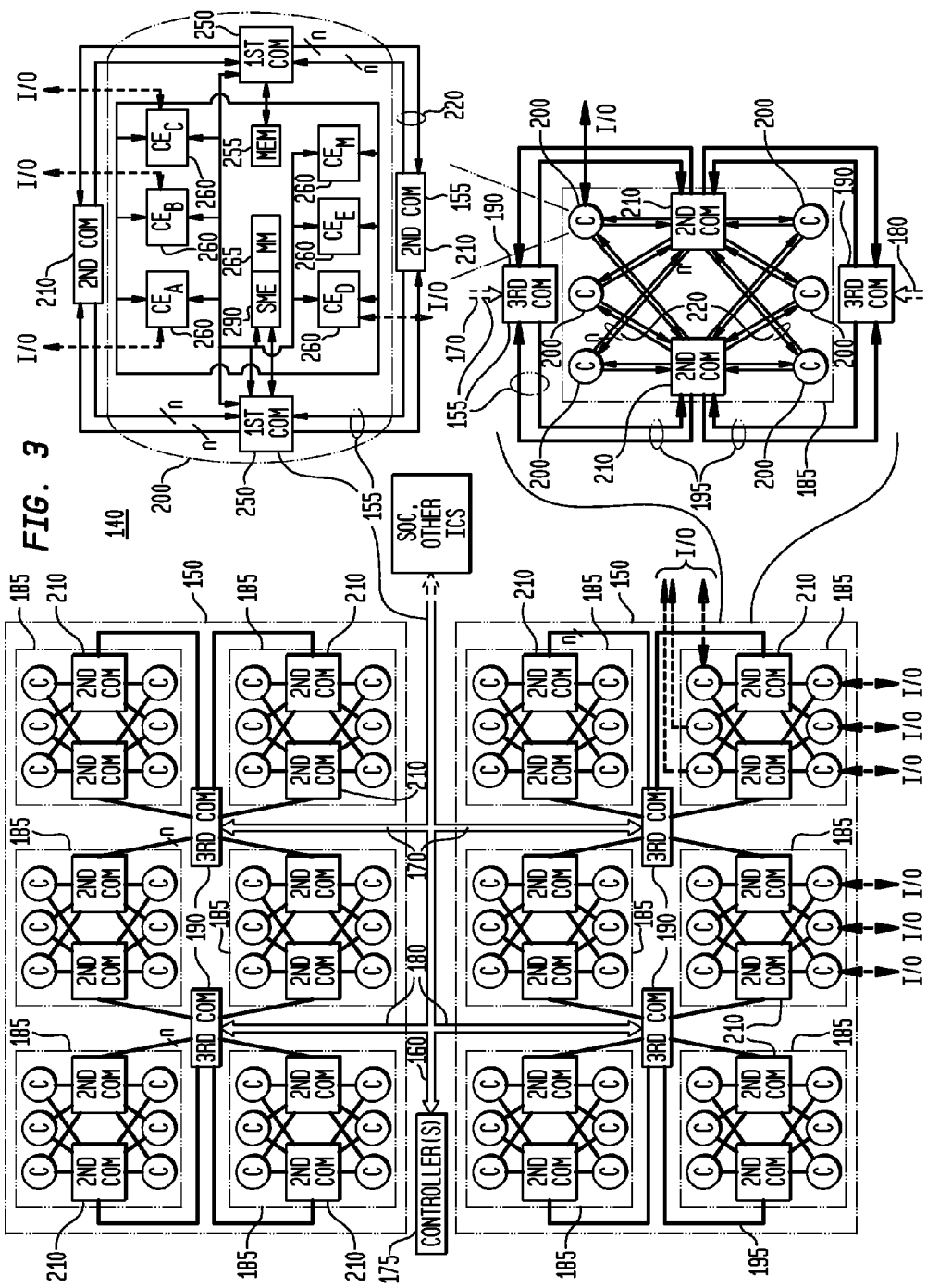
FIG. 3 is a block diagram illustrating an exemplary second apparatus embodiment in accordance with the teachings of the present invention.

FIG. 1 is a diagram illustrating, at a high or conceptual level, such resiliency of an exemplary apparatus 100 embodiment in accordance with the teachings of the present invention. As illustrated in FIG. 1, various parts of the apparatus 100, embodied as an IC, such as various matrices 150 illustrated and discussed with reference to FIGS. 2-3, are utilized to perform concurrently a plurality of functions, such as those which may be associated with a typical automobile, other vehicle, or computerized or complex system. During time period "α", an IC portion 102 is providing anti-lock braking (ABS) functionality, an IC portion 104 is providing traction control functionality, an IC portion 106 is providing video or other multimedia functionality, and an IC portion 108 is providing navigation functionality, such as through a satellite or radio link.

During time period "β", a region 110 (marked with "X's") of IC portion 102 has become unusable, such as due to physical wear or other damage to the IC. Such damage may be determined through self-testing or through other means discussed in greater detail below. As ABS is a high priority function, the functionality performed within region 110 is then reassigned (or bound) to region 112, which previously had been performing video functionality, which has a lower priority for operation in a vehicle environment. As discussed in greater detail below, as part of this reassignment process, new data and control pathways will also be created, so that the newly assigned regions continue to communicate properly with other regions of the IC, transparently, as if the reassignment never occurred. Depending upon the nature and scope of the new functionality assigned to this region, IC portion 106 may or may not continue to perform its video functionality, or may perform this functionality with lower bandwidth or speed. In either case, in spite of damage to the IC 100, the higher priority ABS functions continue to be operational, and no catastrophic failure has occurred.

Subsequently, during time period "γ", regions 114 and 116 (marked with "X's") of IC portion 108 have become unusable, and their functions are reassigned to regions 118 and 120, respectively. In this case, as traction control (of region 104) generally could have a higher priority than the operation of the navigational system, it is likely that region 118 was available and not being completely used by the traction control functions (e.g., one or more composite circuit elements and/or contexts were available, as discussed below). As more of the IC has degraded, however, a signal or other indication may be provided to the user, such as to have the vehicle serviced in the near future for IC replacement, for example. In addition, as mentioned above and as discussed in greater detail below, depending upon the availability of target destinations for the functionality to be reassigned and depending upon how the functionality is reassigned, the reassigned functions may no longer perform optimally (e.g., they may be slower or have less bandwidth), but still perform. Again, such decline in performance is gradual and not catastrophic, with the capability for ample warnings to be provided.

Subsequently, during time period "δ", regions 122, 124, 126 and 128 (marked with "X's") of IC portion 104 have become unusable, and their functions are reassigned to regions 132, 138, 134 and 136, respectively. In this case, as traction control (of region 104) generally would have a higher priority than the operation of the video system of IC portion 106, those higher priority functions are reassigned to the unaffected areas of the IC. In this instance, it is plausible that the video functionality could cease entirely, as the remaining usable portions of the IC are performing these higher priority functions, such as braking and traction control. As more of the IC has degraded, however, a warning, signal or other indication also may be provided to the user, such as to have the vehicle serviced immediately for IC replacement, for example. Again, such decline in performance is gradual and not catastrophic, with the capability for high priority functions to continue to operate, despite significant failures within many portions of the IC that would cause a prior art IC to fail completely, suddenly, and potentially catastrophically.

The biological parallels in the operation of the apparatus 100 are striking. As in a biological system which can heal itself, such as a neurological system, in the event of a damage such as a stroke with loss of neurons and corresponding neurological function, other existing neurons are recruited, with new connections (synapses) created, to take over and restore the functionality previously performed by the damaged neurons. In the case of the apparatus 100, in the event of damage to one or more parts of the IC, other existing portions of the IC (circuit clusters and composite circuit elements (discussed below)) are recruited, with new connections created, to take over and restore the functionality previously performed by the damaged regions of the IC. As a consequence, as in a biological system, the apparatus 100 is self-healing, enabling ongoing functionality despite IC damage.

A. Apparatus Architecture

FIGS. 2-3 are block diagrams illustrating, in increasing levels of detail, exemplary first and second apparatuses 100, 140 in accordance with the teachings of the present invention, typically embodied as an IC or portion of an IC. As illustrated, the apparatus 100, 140 is highly distributed and computationally "flat", with all computation performed by the plurality of composite circuit elements 260. An "action" is the type of function or activity to be performed by a composite circuit element 260 (through its incorporated computational or other type of circuit element 270), such as multiplication or bit manipulation. As illustrated, there are various types of composite circuit elements 260, illustrated as different types of composite circuit elements (equivalently referred to and abbreviated as "composite elements" ("CE")) $CE_A$, $CE_B$, $CE_C$, $CE_D$, $CE_E$, and $CE_M$, which perform different actions and which may be configurable or non-configurable (illustrated and discussed with reference to FIGS. 5-8). The plurality of composite circuit elements 260, with other circuit structures discussed below, as a first grouping, are grouped into a corresponding plurality of circuit "clusters" 200. The various groupings may also be considered arrays of a plurality of composite circuit elements 260, at corresponding levels.

The apparatus 100, 140 may then be logically divided into or comprised of a plurality of levels, with this lower level referred to as a "cluster" level (or a first array), with the plurality of circuit clusters 200 then grouped through various (second) communication elements 210 and a second channel (or bus structure) 220 into an intermediate level (or a second array), as a second grouping, referred to as a cluster-grouping or "supercluster" level (a plurality of superclusters 185), which in turn are further grouped through various (third) communication elements 190 and third channel (or bus structure) 195 into a higher level, as a third grouping, referred to as a "matrix" level (a plurality of matrices 150) or unit level (or a third array), which are further grouped through a fourth channel (or bus structure) 160 into the apparatus 100, 140 or device level, as a fourth grouping or array.

The various communication channels (e.g., busses or bus structures) 160, 195, 220 and communication elements 190, 210, 250 collectively may be referred to and defined as interconnect 155 of the present invention, allowing communication of data and control information between and among any of the various clusters 200 and other IC components.

Each of the apparatuses 100, 140 typically is embodied as an integrated circuit, and may be a separate IC or part of a larger system-on-a-chip ("SOC") or part of a network of ICs, such as coupled to other ICs on a circuit board, wiring network, network mesh, and so on. The two apparatus embodiments 100, 140 differ only in the location (and/or type) of the components within the various clusters 200 utilized to provide input and output ("I/O") to other, external or non-integrated ICs or other devices, such as external memory (e.g., DDR-2) or external communication channels or busses (e.g., PCI or PCI-express (PCI-e)). For apparatus 140, such external I/O has been concentrated within a selected matrix 150, while for apparatus 100, such external I/O has been distributed among a plurality of matrices 150. In all other respects, the apparatuses 100, 140 are identical. As a consequence, any reference to apparatus 100 will be understood to mean and include the second embodiment illustrated as apparatus 140, and apparatus 140 otherwise will not be further discussed as a separate embodiment. Also, while FIGS. 2 and 3 illustrate two matrices 150, it should be understood that the apparatus 100, 140 may include one or more matrices 150, and that exemplary embodiments may include any number of matrices 150, depending upon selected applications and various design parameters, such as IC area and power requirements.

Referring to FIGS. 2-3, as indicated above, the apparatus 100 is logically divided into or comprised of a plurality of matrices 150. Each matrix 150 is coupled through a corresponding plurality of third communication elements 190 and a fourth communication channel (or bus structure) 160, and each has at least two input and two output data and control paths, separately illustrated as input and output ("I/O") 170 and I/O 180 (of fourth channel (or bus structure) 160). Depending upon the selected embodiment, the fourth channel (or bus structure) 160 (with I/O 170 and 180) may have combined control and data I/O paths (as illustrated), with data, configuration and control information utilizing the same bus structures, or such data, configuration and control may be separated onto different bus or interconnect structures (not separately illustrated). In an exemplary embodiment, at this matrix 150 level, such a plurality of third communication elements 190 are implemented through exemplary communication circuitry such as packet routing or waypoint circuitry. In the event of a failure of a third communication element 190 and/or one of the I/O 170, 180, or any portions thereof, another third communication element 190 and the remaining I/O 170, 180 are available to provide identical functionality, albeit potentially with a reduction in available communication bandwidth. In an exemplary embodiment, the third communication elements 190 are implemented as a single, combined circuit element having four independent up link channels and four independent down link channels (with corresponding bus structures); alternatively, the various channels may also be implemented to provide full duplex communication.

This use of a plurality of (at least two) communication elements and corresponding I/O portions of the bus structures (having combined control and data I/O paths), in exemplary embodiments, is repeated at each of the various logical, hierarchical levels, providing corresponding resiliency in the event of a failure of any of the various communication elements or I/O paths. For selected embodiments requiring less resiliency or subject to other constraints, however, such one or more additional sets of communication elements and corresponding I/O are optional and may be omitted.

Each matrix 150, in turn, is logically divided into various hierarchical levels or subgroups, also with circuitry for communication between and among the various levels, such as the plurality of third communication elements 190 adapted to perform packet-based routing, self-routing, tunneling, or other types of data, configuration and control communication. More specifically, a matrix 150 is logically divided into a plurality of superclusters 185, which are coupled to each other through the plurality of third communication elements 190 and third channel (or bus structure) 195, and which further are coupled to superclusters 185 of other matrices 150 via fourth channel (or bus structure) 160 and other corresponding third communication elements 190.

The superclusters 185, in turn, are logically divided into a corresponding plurality of circuit clusters 200 (abbreviated and referred to herein simply as "clusters" or a "cluster"), which in turn are comprised of a plurality of circuitry elements referred to as composite circuit elements 260 (or, equivalently referred to and abbreviated as "composite elements" ("CE") 260) and other components (including first communication elements 250 and state machine elements 290) discussed below. The communication between and among these various clusters 200 is provided through a plurality of second communication elements 210 (which also may provide packet-based routing, self-routing, tunneling, or other types of data, configuration and control communication) and a second channel (or bus structure) 220. The various clusters 200 within a supercluster 185 are then further coupled to other clusters 200 of other superclusters 185 of the same or other matrices 150 via second channel (or bus structure) 220, second communication elements 210, third channel (or bus structure) 195, and third communication elements 190, and then to other matrices via fourth channel (or bus structure) 160. In addition, as an optional variation, "fast path" connections may be provided between adjacent clusters, illustrated as connections 215 in FIG. 2, and discussed in greater detail below.

The various second and third communication elements 210, 190 and levels of communication channels (bus structures) 160, 195, 220 collectively form an interconnect structure 155 of the present invention. As indicated above, the second and third communication elements 210, 190 may be implemented as known or as becomes known in the art for transfer, routing or switching of data, configuration and control to and from addressable clusters 200. The second and third communication elements 210, 190 may be implemented as routing elements, self-routing elements, waypoints, circuit-switched, hybrid routing and circuit-switched elements, other switch-based communication elements, or other types of communication elements, and are considered equivalent. The various communication channels (bus structures) 160, 195, 220 may be implemented utilizing any conductive paths which may be available in IC fabrication and processing.

In exemplary embodiments, this interconnect 155 (communication channels (bus structures) 160, 195, 220) will generally be "n" bits wide, with the number "n" selected depending upon the objectives of the selected embodiment. For example, in an exemplary embodiment, "n" is 17 or more bits, providing for a 16 bit data word and one or more control or signaling bits. In addition to the interconnect 155 comprising one or more busses, wires, conductors, transmission media or connection structures as illustrated in FIGS. 2-3, the interconnect 155 also includes a plurality of communication elements (190, 210) which accommodate the n-bit width and which provide routing or other transmission for data words (or packets), configuration words (or packets), and/or control words (or packets), between and among matrices 150, superclusters 185, and clusters 200. In exemplary embodiments, these communication elements (190, 210) may also provide arbitration or other routing conflict resolution, depending upon the degree of interconnectivity to be provided.

Within the cluster 200 level, the first communication elements 250 provide cluster I/O, providing intra-cluster circuit-based (or circuit-switched) connection capability in addition to inter-cluster data, configuration and control routing, creating direct communication links or connections to and from components within a cluster 200 and data, configuration and control routing from and to components of other clusters 200. In exemplary embodiments, a message manager 265 within a cluster 200 or supercluster 185 is also utilized to provide inter-cluster communication of configuration and control and external input and output communication of any type of data, configuration and control.

It should be noted that the selection of the number of levels within the apparatus 100 may be varied in any given embodiment, as a balancing of the amount of physical interconnect to be utilized in comparison with routing complexity, for a given number of computational elements. In the exemplary embodiment, for the same number of composite circuit elements 260, the use of four levels (matrix, supercluster, cluster, and composite circuit element levels) in comparison to three levels (with more components per level), for example, enables a substantial reduction in the amount of busses and wires of interconnect, resulting in a savings of area and capacitance, at the expense of additional routing complexity.

Continuing to refer to FIGS. 2 and 3, as an option or alternative, depending upon the selected embodiment, one or more additional controllers (or processors, equivalently) 175 may be utilized, at any of the various matrix 150, supercluster 185 or cluster 200 levels. For example, exemplary embodiments of run-time binding (discussed below with reference to FIG. 14) may utilize such additional controllers 175, may instead utilize one or more state machine elements 290 (discussed below) as one or more controllers, or both. In an exemplary embodiment, the controller or processor 175 is implemented utilizing a commercially available processor or microprocessor, e.g., ARM or Micro-Blaze. The processor 175 also may be in a separate system, or may be integrated as part of the die of the apparatus 100, 140, etc., and may be any type of processor or controller, or also may be implemented using one or more SMEs 290. In addition, the apparatus 100 (or 140) may also include other components, such as any other circuits or other devices which may be integrated or coupled with the apparatus, such as radio-frequency or cellular communication circuitry, memory circuitry, processors, microprocessors, etc., with all such variations considered within the scope of the present invention.

As an introduction to the operation of the apparatus 100, data computations and manipulations are performed within the plurality of clusters 200, through composite circuit elements 260. These circuit elements 260 are referred to as "composite" circuit elements 260 because in the exemplary embodiments, they are comprised of a first, constant or fixed portion, and a second, variable portion, which may be configurable or non-configurable (depending upon the type of composite circuit element 260). More particularly, each composite circuit element 260 is comprised of: (1) a uniform or constant element interface and control 280, which is the same for every composite circuit element 260; and (2) a selected type of "computational" or other circuit element 270 from a plurality of types of computational elements 270 (configurable or non-configurable), which are illustrated and discussed in greater detail with reference to FIGS. 5-8.

The computational circuit element 270 (also referred to more simply as an element 270 or circuit element 270) within composite circuit elements 260 vary by type and configurability; the computational elements 270 are referred to as "computational" for ease of reference only, as the various types of circuit elements 270 may have functionality which is not computational in any strict sense, such as memory functions, finite state machine functions, communication functions, etc. For example, some circuit elements 270 may be static or configurable computational elements of a plurality of types, static or configurable memory elements of a plurality of types, static or configurable communication elements or interfaces of a plurality of types, static or configurable state machine elements, and so on, resulting in a plurality of types of composite circuit elements 260, such as configurable composite circuit elements 260, configurable or nonconfigurable memory composite circuit elements $260_M$, or configurable or nonconfigurable composite I/O or other communication circuit elements 260 (which may provide I/O interfaces for external communication, for example). Accordingly, any reference herein to a composite circuit element 260 will be understood to mean and include any of the various types, special cases or specific instances or instantiations of composite circuit elements 260, such as configurable composite circuit elements 260, state machine elements 290, first communication elements 250, and composite memory elements $260_M$, unless the context requires or indicates otherwise.

Also for example, the first communication elements 250 (cluster I/O) may be implemented as a type of composite circuit element 260, having an element interface and control 280 presented to other composite circuit elements 260, and having a computational element 270 designed for communication functionality, and which may or may not be configurable. In addition, as discussed below, additional circuitry typically embodied as a state machine and referred to as a "message manager" circuit 265 is provided within various or selected clusters 200 to perform external communication functions, such as providing communication interfaces to external memory, busses and communication systems, e.g., providing interfaces which comply with various communication and other data transfer standards, and may also include interfaces for communication with other portions of an IC when the apparatus 100 is embodied as part of an SOC. For example, depending upon the selected embodiment, a message manager 265 (as dedicated hardware) or a composite circuit element 260 (having a computational element 270 adapted for a communication function) may be utilized for such external communication, such as providing an Ethernet interface, a PCI interface, a PCI Express interface, a USB or USB2 interface, a DDR SDRAM interface or other type of memory interface, a wireless interface, an interface to another IC, and so on. In exemplary embodiments, the message manager may also be utilized for communication within the apparatus 100, such as communication between clusters 200 and communication between state machine elements 290, as discussed in greater detail below, such as for configuration and control messaging.

In other exemplary embodiments, external communication (such as for DDR-2, PCI, PCI-e) is provided by other components coupled to the interconnect 155, and the message manager circuit 265 provides for interfacing between stream-based communication within a supercluster 185 and/or cluster 200 and packet-based communication on the interconnection networks 220, 195, 160, 170, 180, essentially replacing the first and/or second communication elements 250, 210, such as in supercluster 185C and cluster 200C embodiments. In this embodiment, the message manager circuit 265 may also be implemented as a finite state machine or as a state machine in conjunction with various combinational logic gates, and the message manager circuit 265 processes three kinds of messages: incoming messages, outgoing acknowledgements, and outgoing messages, all via interconnect 155. Two types of messages are utilized, Data Write messages, and Data Copy messages. Data Write messages cause the payload data in the message to be written to an address specified in the message. Data Write messages, for example, may be user task writes, writes to second memory element 255, or writes over the configuration/control bus 285, such as for writing to the SME 290 and modifying SME 290 executable code, or writes to configure any composite circuit element 260 within a cluster 200. In this embodiment, also for example, the message manager circuit 265 may write to the SME 290, to provide SME 290 control. Data Copy messages cause a Data Write message to be sent from a specified source address to a specified destination address. Outgoing acknowledgements are generated by the message manager circuit 265 in response to an incoming Data Write message requesting a reply, and are themselves Data Write messages. Outgoing messages are assembled in the second memory element 255 (e.g., cluster 200 RAM) by the SME 290 and are then transmitted by the message manager circuit 265, such as by setting a pointer to the start of the message and specifying the message size. The message assembly may be applicable to outgoing messages which do not require acknowledgment or extended to those which do require acknowledgment.

In an exemplary embodiment, the second memory element 255 forming cluster 200 RAM is implemented as eight 1K times 16 blocks, with address generators provided within the memory-type composite circuit element $260_M$, rather than use of the SME 290 for address generation. An additional register is also utilized, which if set, reserves the memory-type composite circuit element $260_M$ for use by the SME 290, such as for storing instruction sets, and which if not set, enables use by other composite circuit elements 260. Address generation may include, for example, FIFO, block read/write (including counting and striding), and 2-D or 3-D address generation. The second memory element 255 also could be a hierarchical memory with or without paged or cached memory structures. Priority for data input into the second memory element 255 is typically the message manager circuit 265, to avoid data back ups on the interconnect 155, the memory-type composite circuit element $260_M$, followed by the SME 290. The memory-type composite circuit element $260_M$ has additional features, such as being synchronous, and further allowing multiple processes/contexts to execute simultaneously (as long as there is no data collision).

In another exemplary embodiment, the message manager circuit 265 is also configured or adapted to manage the memory-type composite circuit elements $260_M$ distributed throughout the apparatus 100. For example, the message manager circuit 265 is adapted to provide a uniform address space for the distributed plurality of memory composite circuit elements. Through this use of the message manager circuit 265, the distributed plurality of memory-type composite circuit elements 260 appears to the other composite circuit elements 260 and may be managed as one large memory array.

Each of the configurable computational elements 270 are comprised of combinational logic (i.e., a group of logic gates forming a functional unit, such as an adder, a multiplier, arithmetic logic unit ("ALU") etc.) having input, output, and other internal connections which are adapted to be changeable or are otherwise capable of being modified. More specifically, each configurable computational element 270 is designed such that its logic gates or other functional units may be coupled or connected (or decoupled or disconnected), through switching circuits, elements or other switching structures such as switches, multiplexers, demultiplexers, pass transistors, crossbar switches, routing elements, or other transistor configurations, in any of a plurality of ways, to perform a corresponding plurality of functions. Each different way of connecting the various gates (or functional units) is a "configuration", and a selected configuration may be represented as a plurality of bits which control the corresponding switches, multiplexers, demultiplexers, pass transistors, or other transistors or switching arrangements, creating the specific connections of the selected configuration. For example, adders, multipliers and registers may be coupled in any number of various ways to perform a wide variety of functions, from simple arithmetic to discrete cosine transformation. In other circumstances, a configuration may also indicate how input data is to be interpreted or used, such as signed or unsigned, a constant or a variable, consumable or non-consumable, etc. Other types of configurations and ways of configuring are known in the electronic arts, are considered equivalent and within the scope of the present invention.

Each of the available or selected configurations for a configurable computational element 270 is stored locally within a memory of the element interface and control 280 of the composite circuit element 260. As discussed in greater detail below, each of these configurations, in conjunction with other information such as selected inputs, output destinations and control information is defined as or comprises a corresponding "context". For example, the same configuration of elements may have multiple contexts, with each context using different inputs and providing outputs to different locations, or utilizing different constants. Also for example, different configurations will also provide different contexts, even if the different configurations will utilize the same inputs and provide outputs to the same destinations. The operations and control of composite circuit elements 260 is discussed in greater detail below with reference to FIGS. 5-8 and 16, following the discussion of the internal and external communication and addressing utilized in exemplary embodiments of the invention.

In exemplary embodiments, the various connections between composite circuit elements 260 within a cluster 200, and routing or tunneling from one cluster to another (via communication elements 250, 210, or 190), are established at run-time by the operating system of the apparatus 100, for implementation of a selected program, algorithm or function. In addition, such connections may change over time, and depending upon the selected embodiment, generally will change over time as may be needed, as briefly discussed above with reference to FIG. 1 and as discussed in greater detail below, for creation of new functionality, changing contexts and configurations, changing functionality, or resilient self-healing. In alternative embodiments within the scope of the invention, such as for applications which may not be subject to requirements for resiliency, the various connections also may be established prior to run-time and maintained in a memory within the apparatus 100, with the potential for subsequent modification as may be necessary or desirable.

Referring to FIGS. 2 and 3, a matrix 150 is logically divided into or comprises a plurality of superclusters 185 and one or more third communication elements 190. The third communication elements 190 are communication circuitry (e.g., routers, waypoints, gateways, switches, or tunneling devices) which provide packet routing, switching, hybrid routing and switching, or tunneling of data and control into and out of a matrix 150, for communication of data, configuration and control information, and may be considered to form part of interconnect 155. The third communication elements 190 may also be considered waypoints or gateways, and are one of several communication structures utilized in accordance with the present invention. In a first selected embodiment utilizing at least two or more third communication elements 190, each third communication element 190 is coupled to each supercluster 185 of a selected matrix 150 and to other third communication elements 190 (via bus structure 160), such that communication to and from each supercluster 185 may occur through either third communication element 190. As a result, in the event of a failure of any one of the third communication elements 190, another third communication element 190 is available to each supercluster 185 of a selected matrix 150 to provide identical communication functionality. While illustrated as separate third communication elements 190, it will be understood that these independent circuits may be combined into one or more larger circuit structures providing the same independent communication function. For example, in a selected embodiment, a single third communication element 190 is utilized, similarly connected to each supercluster 185 and to other third communication elements 190, with each third communication element 190 providing multiple and independent communication pathways (e.g., 4 down links and 4 up links), such that additional links are available in the event of failure of one or more links. Again, in the event of such a failure, significant functionality is preserved, with graceful degradation and not catastrophic failure.

Each supercluster 185 is further logically divided into or comprises a plurality of clusters 200 and one or more second communication elements 210. The second communication elements 210 are also communication circuitry which provide packet routing, tunneling, switching or other transfer of data and control into and out of a supercluster 185, for communication of data, configuration and control information, and also may be considered to form part of interconnect 155. The second communication elements 210 also may also be considered waypoints or gateways, and are one of several communication structures utilized in accordance with the present invention. In a first selected embodiment utilizing at least two second communication elements 210, each second communication element 210 is coupled to each cluster 200 of a selected supercluster 185, such that communication to and from each cluster 200 may occur through either second communication element 210. Also as a result, in the event of a failure of a second communication element 210, another second communication element 210 is available to each cluster 200 of a selected supercluster 185 to provide identical communication functionality. In a selected embodiment, these independent circuits may be combined into one or more larger circuit structures providing the same independent communication function. Also for example, a single, combined second communication element 210 is utilized, similarly connected to each cluster 200 and to one or more third communication elements 190. In this embodiment, each second communication element 210 provides multiple and independent communication pathways (e.g., 4 down links and 4 up links), such that additional links are available in the event of failure of one or more links. Again, in the event of such a failure, significant functionality is preserved, with graceful degradation and not catastrophic failure.

As a consequence, moving from a matrix 150 level to a supercluster 185 level and to a cluster 200 level, the interconnect 155 provides packet routing, self-routing, tunneling, switching or other transfer of data, configuration and control information through a plurality of communication elements 190 and 210 and communication channels (bus structures) 160, 195, 220. In addition, as discussed below, within a cluster 200, the interconnect 155 also provides circuit-switched (or circuit-based) communication, through first communication elements 250. Indeed, one of the novel features of the architecture of the present invention is the use of an interconnect structure 155 providing both packet-based and circuit-switched communication.

Continuing to refer to FIGS. 2 and 3, the exemplary interconnect 155 comprises: (1) a plurality of routing (tunneling, waypoint or gateway) elements, namely, a plurality of third communication elements 190, a plurality of second communication elements 210, and a plurality of first communication elements 250; (2) a plurality of circuit switching elements, namely, the plurality of first communication elements 250; and (3) their corresponding busses, wires or other forms of physical connections or date transmission media (e.g., illustrated, for example, as busses or wires 160, 195 and 220 which, as discussed above, are "n" bits wide). Within a matrix 150, one or more third communication elements 190 provide packet routing, self-routing, tunneling, switching or other transfer of data, configuration and control information, to and from other matrices 150 (via first bus 160 and I/O 170, 180), and to and from a plurality of superclusters 185, via one or more second communication elements 210 within each such supercluster 185. In turn, one or more second communication elements 210 within such a supercluster 185 provides packet routing, self-routing, tunneling, switching or other transfer of data, configuration and control information, to and from the third communication elements 190, and to and from a plurality of clusters 200 within the supercluster 185, via one or more first communication elements 250 within each such cluster 200.

In turn, the one or more first communication elements 250 within a cluster 200 provides packet routing, self-routing, tunneling, switching or other transfer of data, configuration and control information to and from the cluster 200, via the second communication elements 210, such as to and from other clusters 200, and provides circuit-switched communication for data and control within the cluster 200, enabling communication between other clusters 200 and the composite circuit elements 260, state machine element 290, message manager 265, memory elements 255 and/or other components within the cluster 200. For example, data produced from a composite circuit element 260 within a cluster 200 may be output through a direct or a circuit-switched connection to one of the plurality of first communication elements 250, which then converts the data to packet form and routes the data packet to the second communication element 210, for transmission to another cluster 200, another supercluster 185, or another matrix 150. Similarly, when a data packet arrives via a second communication element 210, which may be from another cluster 200, another supercluster 185, or another matrix 150, the first communication element 250 extracts the data and transfers the one or more data words to the corresponding composite circuit element 260, state machine element 290, memory elements 255 or other components within the cluster 200.

These various communication elements (third communication elements 190, second communication elements 210, first communication elements 250, the full interconnect element 275 and the distributed full interconnect element 295 discussed below) may be designed to have any selected capacity, such as full interconnectivity to more limited interconnectivity. For example, instead of the full interconnect element 275 or the distributed full interconnect element 295 providing for any output of a composite circuit element 260 to be coupled concurrently to any input of a composite circuit element 260 in the exemplary embodiments (with the exception of conflicts or contentions for the same inputs or outputs), more limited or partial interconnections within the cluster 200 may be provided, such as by using a partial interconnect element or a distributed partial interconnect element (not separately illustrated). Also for example, in exemplary embodiments, the first communication elements 250 may provide 2 or more concurrent connections or routing, such as two up links to and two down links from second communication elements 210, in addition to one or more concurrent connections to and from the composite circuit elements 260 and other components of a cluster 200. More connectivity may also be provided in any given embodiment, as a trade-off of potential collisions with IC area. In addition, where less than full interconnectivity is provided, the various communication elements (third communication elements 190, second communication elements 210, and first communication elements 250) may also provide an arbitration functionality, which may be based on priority, round robin, sequential, etc., selecting a connection or routing for data transfer at any given time.

While illustrated having cluster 200, supercluster 185, matrix 150 and apparatus 100 levels, it will be understood by those of skill in the art that the number of levels may be extended or decreased in any selected embodiment. For example, a plurality of fourth communication elements (not illustrated), with the other interconnect 155, may be utilized to create another level of hierarchy within the apparatus 100, and so on, creating any selected number of levels within the hierarchy of the apparatus 100.

Figure 4:
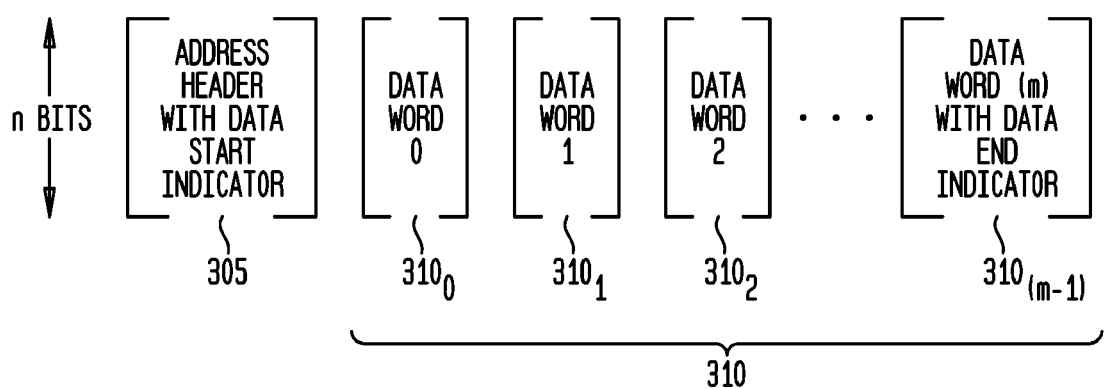
FIG. 4 is a diagram illustrating an exemplary data packet and data word sequence in accordance with the teachings of the present invention.

FIG. 4 is a diagram illustrating an exemplary data transmission sequence in accordance with the teachings of the present invention. In the exemplary embodiments, data and/or control packets are routed over the interconnect 155 by the various routing elements (third communication elements 190, second communication elements 210, and first communication elements 250) as a "train" or tunneling of data words, thereby reducing addressing overhead which would otherwise be associated with routing of individually addressed data words. More specifically, referring to FIG. 4, a data transmission sequence 300 is comprised of a plurality of words (fields or data structures) 305 and 310 and is "n" bits wide. Each such word 305 or 310 is transmitted sequentially, one after the other. The first word or field 305 comprises the address header with a data start indicator. The address header may comprise a destination address, or may comprise both a destination address and a source address (which may require more than one word). Such an address, in the exemplary embodiments, has the form of [matrix number, supercluster number, cluster number], with the number of bits utilized to designate the address dependent upon the number of matrices 150, superclusters 185 and clusters 200 implemented in the selected embodiment.

For example, when eight or fewer matrices 150 are implemented, and with each matrix 150 containing eight or fewer superclusters 185, and with each supercluster 185 containing eight or fewer clusters 200, 9 bits are sufficient to provide addressing as [MMM,SSS,CCC]. The data start indicator within the first word or field 305, which may comprise a first flag having a predetermined value (e.g., flag being set, or other first predetermined or predesignated bit being a selected value), indicates that the current word 305 is an address header and that all subsequent packets are data words to be routed to the same addressed destination. As a consequence, all of the "m" words or fields 310 of data following the first field 305 are designated and transmitted as data words, namely, data words $310_0, 310_1, 310_2$ through $310_{(m-1)}$, which are automatically routed to the same addressed destination, without any need for separate or additional headers or addresses for each data word. Additional flags or bits may also be utilized for other purposes, such as to designate that the subsequent data words are placeholder values, for use in synchronization, particularly for branching operations. The last data word, illustrated as word or field $310_{(m-1)}$, comprises both data and a data end indicator, to indicate that the current data word is the last data word being transferred, and may comprise a second flag having a predetermined value (or other second predesignated bit having a selected value).

This tunneling of data is implemented in an exemplary embodiment as a combination or hybrid of both packet routing and circuit switching. More particularly, the various routing elements (third communication elements 190 and second communication elements 210) provide for establishing one or more connections between and among clusters 200 using the address header of the first word or field 305, and reserving and setting up a dedicated path from a source cluster 200 to a destination cluster 200. The dedicated path may be formed by circuit-switching or other connections within, for example, a waypoint or gateway. The remaining data word (data words $310_0, 310_1, 310_2$ through $310_{(m-1)}$) arriving at the communication element (third communication elements 190, second communication elements 210), may be buffered and then transferred automatically as a packet on the switched or other dedicated path established within the communication element using the address header. The dedicated path is maintained until the complete packet has been transmitted, after which the various path elements are released for other communications. A plurality of paths may be used concurrently to support a broadcast mode. Also in the exemplary embodiment, a plurality of such data transmissions may occur concurrently between and among the same communication elements, such as by using the four uplinks and four downlinks previously mentioned for an exemplary embodiment, allowing transmission of multiple data streams concurrently. As a consequence, in the exemplary embodiments, the plurality of communication elements (including the first communication elements 250) support any selected mode of communication, such as one-to-one input and output data links, one-to many (broadcast) data links, and many-to-one data links.

In contrast, a first communication element 250 receives data words from the various components of the cluster 200, typically sequentially (one data word per one or more clock cycles) via the full interconnect element 275, provides an address header, and transmits the sequence to a second communication element 210 for transmission to another cluster 200, generally transmitting the entire sequence as a packet burst. For data from other clusters 200, the first communication element 250 receives and buffers the plurality of data words ($310_0, 310_1, 310_2$ through $310_{(m-1)}$), and sequentially provides them to the designated component of the cluster 200, typically via the switching of the full interconnect element 275. In exemplary embodiments, the source and/or destination addresses may be stored in any of a plurality of components, such as within any of the various routing elements (third communication elements 190, second communication elements 210, and first communication elements 250), and established during the binding process (discussed below) for each context utilizing intercluster communication.

More particularly, the one or more state machine elements ("SMEs") 290 (or other controller(s) 175 or off-chip controller(s) or processor(s)) performing the binding process (the "binder") assigns actions (i.e., functions or contexts) to the various composite circuit elements 260, and establishes a "virtual" data linkage or routing between or among the composite circuit elements 260, namely, assigning a data linkage between one or more composite circuit elements 260, without necessarily specifying how that data linkage is to physically occur. The various communication elements (first communication element 250, second communication elements 210, third communication elements 190, full interconnect element 275 and/or distributed full interconnect element 295), either clock cycle-by-cycle or at any given time, then are adapted to determine the physical route for the corresponding data transfer, creating the physical data linkage. For example, via switching and/or routing, a first physical data path or link between or within communication elements may be established for one instance of a transfer of a data packet (e.g., a train of data words) between two clusters 200 (and subsequently released), with a different physical data path or link established for a subsequent instance of a transfer of a data packet between the two clusters 200. Such physical data links may be stored and maintained, for example, within the various memories within the communication elements, such as stored as a routing table within the memories of the corresponding element interface and control 280 (discussed below), with any selected physical data link determined by the corresponding element controller 325 of the communication composite circuit element 260. Similarly, at any instant in time or clock cycle, different physical data links may be established (and released) for data communication within the cluster 200. In other exemplary embodiments, rather than establishing a virtual data link, the physical data linkages may also be established by the binder as part of the binding process.

Figure 5:
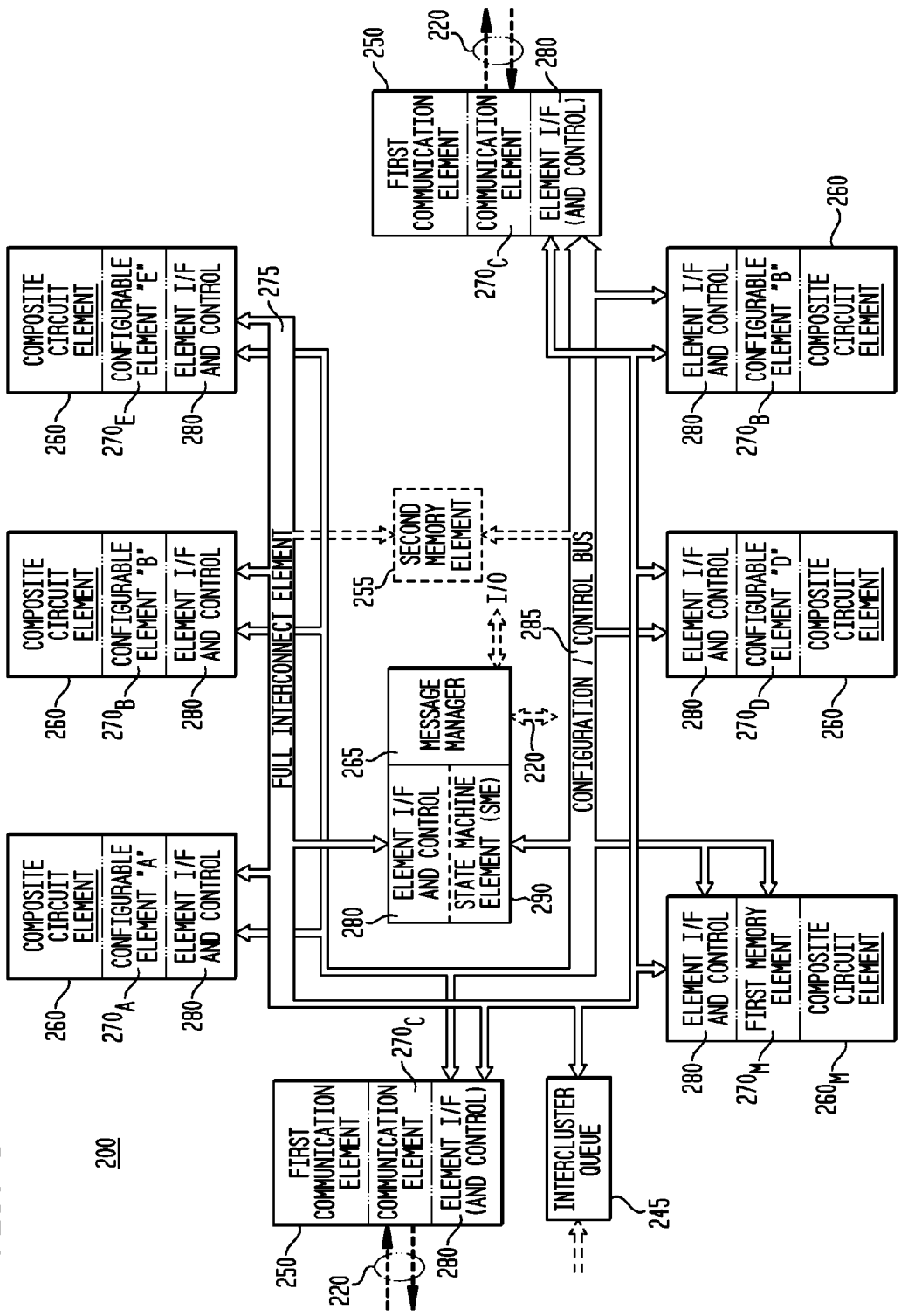
FIG. 5 is a block diagram illustrating a first exemplary circuit cluster in accordance with the teachings of the present invention.
Figure 6:
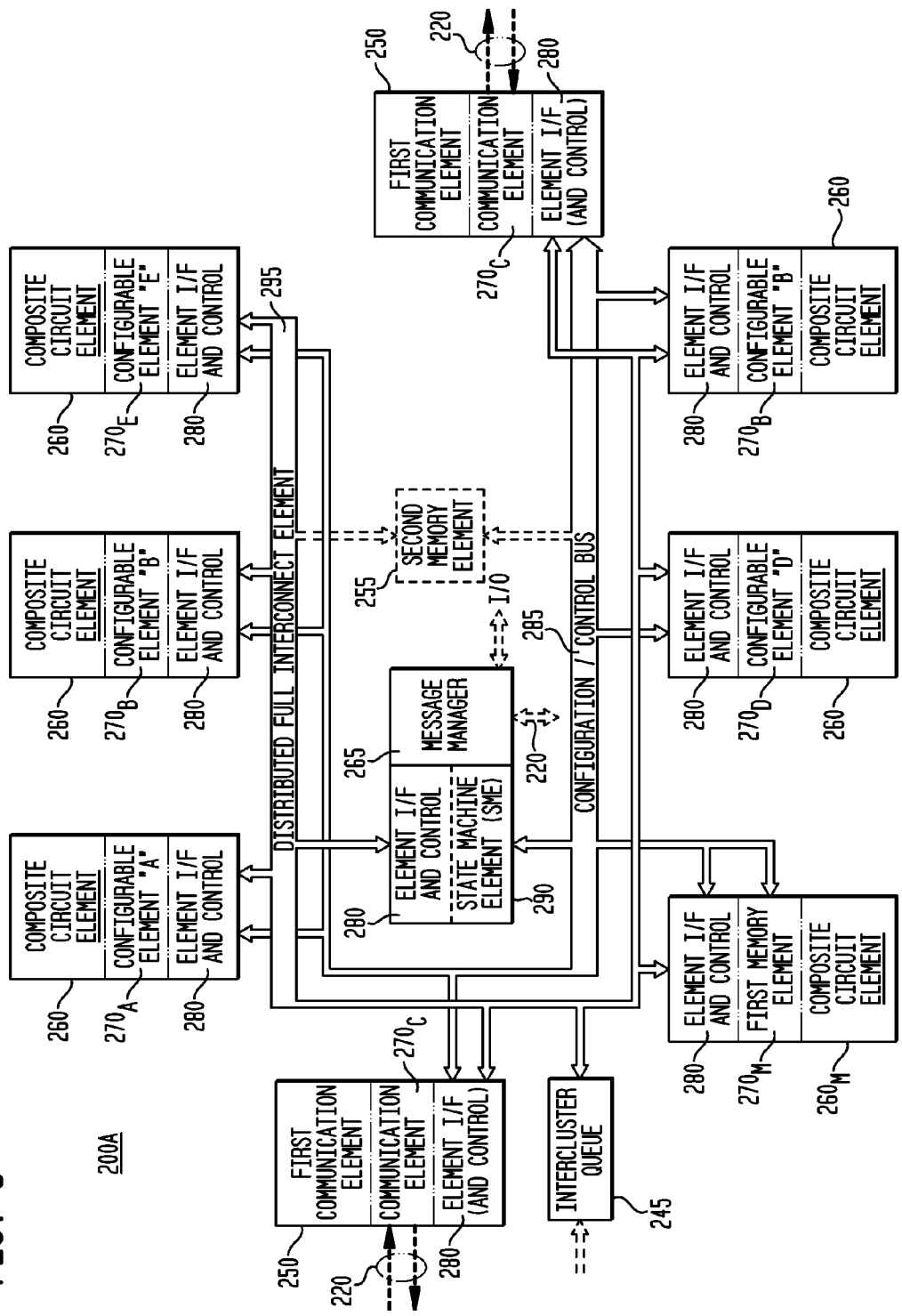
FIG. 6 is a block diagram illustrating a second exemplary circuit cluster in accordance with the teachings of the present invention.

FIG. 5 is a block diagram illustrating a first exemplary cluster 200 in accordance with the teachings of the present invention. FIG. 6 is a block diagram illustrating a second exemplary cluster 200A in accordance with the teachings of the present invention. In cluster 200, a full interconnect element 275 (as a single or unitary circuit component) is utilized to provide complete interconnections between inputs and outputs of each of the composite circuit elements 260 and other cluster components as illustrated. For example, the full interconnect element 275 may be implemented as a crossbar switch. In cluster 200A, a distributed full interconnect element 295 (as a distributed plurality of circuit components) is utilized to provide complete interconnections between inputs and outputs of each of the composite circuit elements 260 and other cluster components as illustrated. For example, the distributed full interconnect element 295 may be implemented as a plurality of multiplexers and/or demultiplexers, such as the multiplexer 335 illustrated in FIG. 8 for a selected composite circuit element 260. In all other respects, the clusters 200, 200A are identical. As a consequence, any reference to a cluster 200 will be understood to mean and include the second embodiment illustrated as cluster 200A (and a third embodiment illustrated as cluster 200B in FIG. 7), as one or more variations of a cluster 200, and cluster 200A (and cluster 200B) otherwise will not be further discussed as a separate embodiment.

As illustrated in FIGS. 5 and 6, the exemplary cluster 200 (200A) comprises a plurality of composite circuit elements 260 (or composite elements 260); a plurality of communication elements, namely, one or more first communication elements 250 and a full interconnect element 275 or a distributed full interconnect element 295 (also referred to as a full communication element or full interconnect bus ("FIBus")); a state machine element (SME) 290; a message manager 265; and various communication structures, such as busses or other types of communication media. It should be noted that a state machine element 290 and message manager 265 is not required in every cluster 200; in various embodiments, depending upon the application to be run, selected clusters 200 may comprise predominantly composite circuit elements 260 (e.g., having digital signal processing ("DSP") functions), with state machine and/or message management functionality provided by state machine elements 290 and message managers 265 of other clusters 200 (with corresponding communication via the first communication elements 250). In other exemplary embodiments, rather than or in addition to including one or more state machine elements 290 within the clusters 200, the corresponding functions may instead be implemented through the use of one or more external controllers 175 or other, off-chip controllers, state machines, or processors. In selected embodiments, the full interconnect element 275 may be implemented as a crossbar switch or pass-transistors (with or without arbitration capability), while the distributed full interconnect element 295 may be implemented as a plurality of switches, pass transistors, multiplexers and/or demultiplexers, for example.

Also in selected embodiments, as various options or variations, an exemplary cluster 200 may also include additional memory, such as second memory element 255, which may be a type of queue, such as a long queue, for example; may also include an intercluster queue 245, such as a FIFO, buffer or other memory structure, for transfer of data, control and/or configuration information between adjacent clusters 200 without utilizing the various first communication elements 250 and second communication elements 210 (creating the "fast path" connections 215 illustrated in FIG. 2); and may also include a separate or additional communication structure for communication between the SME 290 and other components within the cluster 200, illustrated as configuration/control bus 285.

Not separately illustrated in FIGS. 5 and 6, each element interface and control 280 also includes a memory, input queues, and an element controller (comprised of a plurality of conditional logic structures (gates)), discussed in greater detail with reference to FIG. 8. In addition, first communication elements 250 may also include a memory structure, to transfer incoming data to a selected composite circuit element 260, and to address and route outgoing data from a selected composite circuit element 260. While FIGS. 5 and 6 illustrate a cluster 200 (200A) comprising six composite circuit elements 260, two first communication elements 250, one state machine element ("SME") 290, one message manager 265, and one full interconnect element 275 or distributed full interconnect element 295, with possible additional memory such as second memory element 255 and one or more various communication structures such as intercluster queue 245, it will be understood by those of skill in the electronic arts that any amounts and combinations of these components may be utilized, and that any and all such amounts and combinations are considered equivalent and within the scope of the invention.

Each composite circuit element 260 is comprised of a computational circuit element 270 and a uniform (constant or fixed) element interface and control 280. While generally referred to as a "computational" circuit element 270, it is to be understood that a circuit element 270 may perform functions other than computations, such as bit reordering, memory functions, control functions, state machine functions, communication functions, instruction processing, and all such non-computational or other functionality is considered within the scope of a circuit element 270 of the invention regardless of nomenclature.

Figure 9:
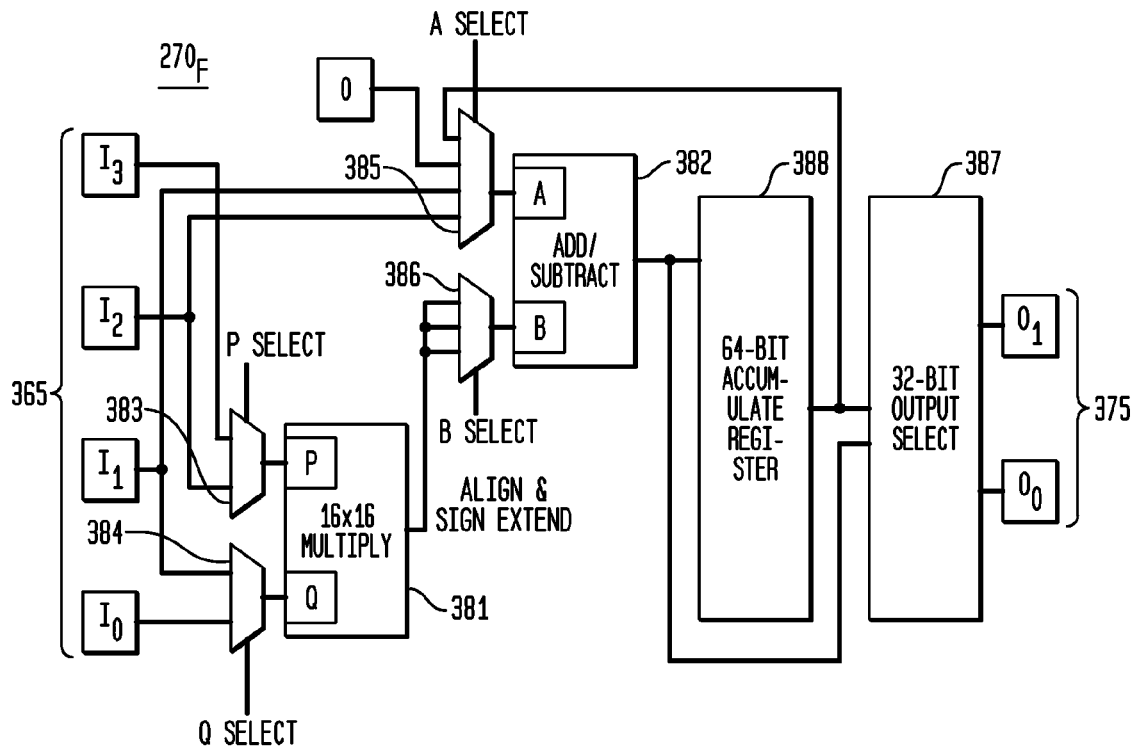
FIG. 9 is a block diagram of an exemplary multiplier configurable element in accordance with the teachings of the present invention.
Figure 10:
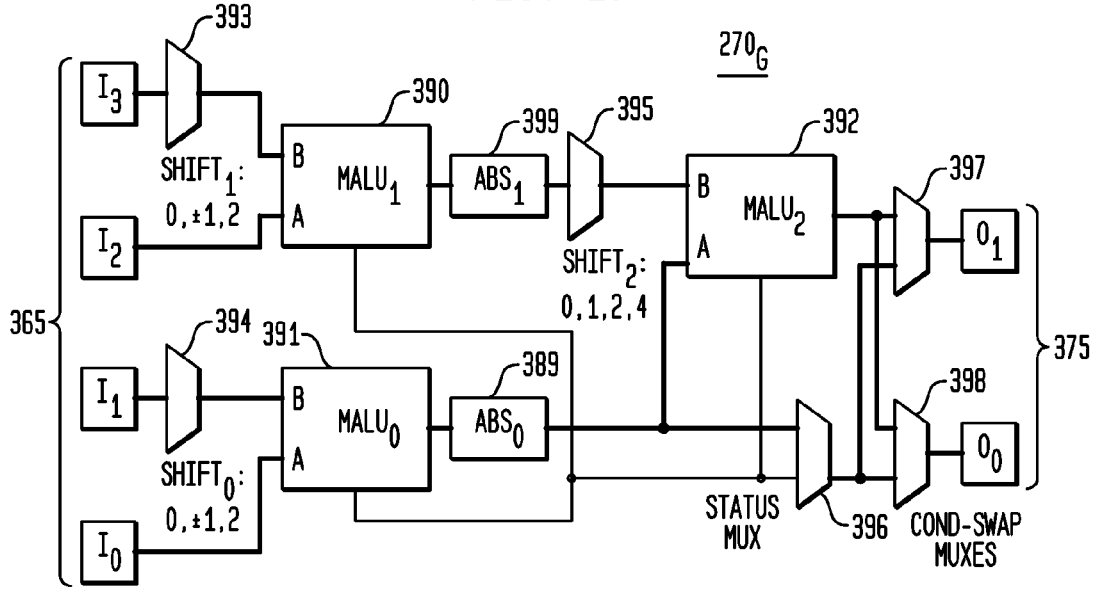
FIG. 10 is a block diagram of an exemplary triple-ALU configurable element in accordance with the teachings of the present invention.

Within a cluster 200, the composite circuit elements 260 have (computational) elements 270, which may be of the same or different type, and may be included within the cluster 200 in any selected combination or mix, and may be static (nonconfigurable) or configurable. As illustrated in FIG. 5, the elements 270 are a configurable element (type "A") $270_A$, two configurable elements (type "B") $270_B$, a configurable element (type "D") $270_D$, a configurable element (type "E") $270_E$, and a configurable or non-configurable first memory circuit element $270_M$. A communication circuit element $270_C$ is utilized in the first communication elements 250, which is typically non-configurable but which could be implemented to be configurable. In addition, any selected elements 270 may also be implemented to be nonconfigurable, and all such variations are within the scope of the invention. The configurable computational elements 270 generally perform computation and/or bit manipulation and may be, for example, configurable arithmetic logic units (ALUs), configurable triple ALUs, configurable multiply and accumulate (MAC) units, configurable bit reordering elements (BREOs), configurable multipliers, configurable Galois multipliers, configurable barrel shifters, configurable look-up tables, configurable and programmable controllers, super or large ALUs (capable of a wide variety of arithmetic calculations, functions, comparisons and manipulations), and so on. The configurable computational elements 270 generally are comprised of combinatorial logic gates, but may also include conditional logic structures, as necessary or desirable, such as to evaluate the existence of a condition or event. Exemplary configurable elements 270 are illustrated in FIGS. 9 and 10.

As mentioned above, elements 270 may also be implemented to provide communication functions, may be configurable or non-configurable, and may provide interfaces for internal communication, external communication, and memory access. In an exemplary embodiment, such external communication functions are provided through the message manager 265, which provides a selected communication function of a plurality of communication functions, which typically differ between and among the various clusters. The plurality of communication functions may include, for example, providing an Ethernet interface, a PCI interface, a PCI Express interface, a USB or USB2 interface, a DDR SDRAM interface or other type of memory interface, a wireless interface, an interface to another IC, etc. Typically, the message manager 265 of a given cluster 200 provides one type of communication function, with the message managers 265 of other clusters 200 correspondingly providing other types of communication functions. For example, the message manager 265 of a first cluster 200 may provide a PCI Express interface, while the message manager 265 of a second cluster 200 may provide a DDR-2 interface, while the message manager 265 of a third cluster 200 may provide an Ethernet interface.

In addition, the message manager 265 may also have a direct connection to the interconnect 155, or more particularly, the second communication channel or bus 220, for intercluster communication independently of the various first communication elements 250, such as for communication of configuration and/or control information between or among the state machine elements 290 and other components. For example, during run-time binding, the various configurations and data routings may be transmitted to the state machine elements 290 as messages via the message manager 265. As a consequence, the message manager 265 is illustrated as directly coupled to or part of the state machine element 290 (e.g., without intervening or separate bus or communication structures).

The first memory circuit element $270_M$, second memory element 255 and/or memory within the element interface and control 280 may be any form of memory, machine-readable storage or memory media, whether volatile or non-volatile, including without limitation, RAM, FLASH, DRAM, SDRAM, SRAM, MRAM, FeRAM, ROM, EPROM or $E^2$PROM, or any other type of memory, storage medium, or data storage apparatus or circuit, which is known or which becomes known, or combinations thereof. In a first exemplary embodiment, the first memory element $270_M$ and the memory within the element interface and control 280 are implemented as content addressable memories ("CAMs"). In a second exemplary embodiment, the first memory element $270_M$ and the memory within the element interface and control 280 are implemented as SDRAM.

The first communication elements 250 are similar to the composite circuit elements 260, including an element interface and control 280, and a circuit element 270 which, in this case, is a communication element $270_C$, which may be configurable or non-configurable, depending upon the selected embodiment. For example, configuration may occur to determine switching or routing paths within the communication element $270_C$. The communication element $270_C$ provides for packet switched data transmission and reception to and from the interconnect 155, and circuit-switched communication within the cluster 200.

Similarly, the state machine element 290 also comprises an element interface and control 280, with its "computational" element (270) being the more specific case of a state machine element, which also may be configurable or non-configurable, depending upon the selected embodiment. The various memories 330 and input and output queues 320, 315, for a state machine embodiment, alternatively may be provided as internal registers. Using the element interface and control 280, as discussed below, also provides for the state machine element 290 to have a plurality of contexts, such as for multithreading. In addition, the state machine element 290 is illustrated as having direct access to the element interface and control 280 of the composite circuit elements 260 (via configuration/control bus 285) for ease of directly populating configurations, control, and receiving interrupts, and a direct connection to the first memory element $270_M$ (and/or second memory element 255) (e.g., through one port of a dual port RAM), to facilitate corresponding memory accesses for instruction/code processing and other data access. As mentioned above, the state machine element 290, in conjunction with any of the available memories (e.g., a composite memory element $260_M$ or second memory element 255), constitutes a "controller" within the scope of the present invention, such as a cluster controller, a supercluster controller, a matrix controller, etc. Such a controller may also include the message manager 265 or similar functionality.

By utilizing the same (or similar) element interface and control 280, the first communication elements 250 and state machine element 290 appear to the composite circuit elements 260 within the cluster 200 as simply another composite circuit element 260, with corresponding advantages discussed below. For example, the other composite circuit elements 260 then do not need to have any knowledge that their output is provided to or input is being received from a first communication element 250 or a state machine element 290, and do not need to accommodate any different type of data reception or transmission.

In exemplary embodiments, the composite circuit elements 260 may include some form of identification by type or kind of composite circuit element 260 (i.e., type of circuit element 270 within the composite circuit element 260), to facilitate identification by a state machine element ("SME") 290 (or a controller 175). Such identification may be retained in an available memory within the cluster 200 in a wide variety of forms, such as hard-wired as a ROM within a composite circuit element 260 during fabrication, loaded into a memory during a boot process, and so on. Such type identification, for example, may be maintained in a memory composite element 260, second memory 255, or within the memory 330 of the element interface and control 280 discussed below.

The element interface and control 280 provides both (1) a uniform interface for input to and output from each configurable circuit element 270, memory element, communication element, or state machine element; and (2) a uniform control structure, and is discussed in greater detail below with reference to FIGS. 8 and 16. Because each element interface and control 280 has the same structure for every composite circuit element 260, first communication element 250, and state machine element 290 within every cluster 200, every such element 260, 250, 290 may be controlled in a uniform, repeatable manner, without regard to the type of element, such as whether the element (270) is a configurable ALU, a configurable barrel shifter, a communication element, or a state machine element. In addition, every such composite circuit element 260, first communication element 250, and state machine element 290 may communicate with any other composite circuit element 260, first communication element 250, and state machine element 290 in a uniform, repeatable manner, without regard to the type of element (e.g., a configurable circuit element 270). More particularly, every composite circuit element 260, first communication element 250, and state machine element 290 may be addressed in a uniform manner, through the addressing scheme discussed above.

As a first result of such uniformity, no composite circuit element 260, first communication element 250, and state machine element 290 is required to know anything about any other composite circuit element 260, first communication element 250, and state machine element 290 from which it receives input or to which it provides output, i.e., each composite circuit element 260 and first communication element 250 may be generally ignorant about its surroundings and functions. (Depending upon the implementation, the state machine element 290 may have additional functionality for monitoring, testing and controlling other elements, so that it is knowledgeable about its surroundings and functions). As a second result of such uniformity, each composite circuit element 260, first communication element 250, and state machine element 290 may be configured, addressed and queried in a uniform manner, also without regard to the type of element (e.g., type of circuit element 270).

As a third and very significant result, each composite circuit element 260 having a selected type of circuit element 270 is virtually completely interchangeable with any other composite circuit element 260 having the same selected type of circuit element 270, except to the extent of any locality (distance) constraints for the performance of a particular computation or algorithm. As a consequence, subject to such constraints, for execution of a given algorithm, the operations performed by any selected composite circuit element 260 having a selected type of circuit element 270 may be freely assigned or transferred to another composite circuit element 260 having the same selected type of circuit element 270, without any detrimental effect. In the event of a failure or defect in a particular composite circuit element 260 having a selected type of circuit element 270, its operations may be transferred to: (1) another available composite circuit element 260 having the same selected type of circuit element 270; (2) a group of available composite circuit elements 260 which together are capable of performing the same operations; or (3) an otherwise unavailable composite circuit element 260 having the same selected type of circuit element 270 (or group of composite circuit elements 260) which had been performing another or a lower priority operation. For example, in the event of a failure of a composite circuit element 260 having a triple ALU configurable element 270, its operations may be transferred to three composite circuit elements 260 which each have a single ALU configurable element 270, which may then be configured to perform the operations of the triple ALU. Similarly, the functions performed by a first communication element 250 or a state machine element 290 may also be transferred to other available first communication elements 250 and state machine elements 290, as needed.

The full interconnect element 275 and/or distributed full interconnect element 295, which respectively may be implemented as a full crossbar switch or as another arrangement of switches, multiplexers, demultiplexers, or other transistor arrangements, provides for any output of any composite circuit element 260, first communication element 250, and state machine element 290 to be coupled to any input of any (other) composite circuit element 260, first communication element 250, and state machine element 290, and/or to be coupled to any other component within its cluster 200 or, via intercluster queue 245, to the full interconnect element 275 and/or distributed full interconnect element 295 of an adjacent cluster 200 (for input to any composite circuit element 260, first communication element 250, and state machine element 290 or other component of the adjacent cluster 200). (Feedback of output to input within the same composite circuit element may, in selected embodiments, be accomplished internally within the composite circuit element 260, such as through a multiplexer or other switching arrangement, not separately illustrated.) In an exemplary embodiment, any output of a composite circuit element 260, first communication element 250, and state machine element 290 may be provided as an input to any other composite circuit element 260, first communication element 250, and state machine element 290, in parallel and concurrently, through full interconnect element 275 and/or distributed full interconnect element 295, for each composite circuit element 260, allowing complete and concurrent communication between and among all composite circuit elements 260, first communication elements 250, and state machine element 290 (with the exception of potential conflicts requiring arbitration or other resolution).

Depending upon the selected embodiment, the outputs from a composite circuit element 260 may be switched in a plurality of ways, all of which are within the scope of the present invention. For example, an optional output switching element 380 (illustrated in FIG. 8) may be provided for every composite circuit element 260, which may switch the outputs for internal feedback within the composite circuit element 260, switch the outputs to the full interconnect element 275 or distributed full interconnect element 295, switch the outputs directly to a first communication element 250, or switch the outputs directly to the state machine element 290. In the selected embodiment discussed below with reference to FIG. 8, internal feedback may be provided from any stage within a computational element 270, and the computational element 270 outputs are provided to an output memory (or output queue or register) 315 and then directly to the full interconnect element 275, for switching to other composite circuit elements 260, to the state machine element 290, or to the first communication elements 250. Similarly, inputs to a composite circuit element 260 may be provided in a plurality of ways, such as from the full interconnect element 275 or distributed full interconnect element 295, or directly from the full interconnect element 275 and other sources, such as from second memory element 255, the state machine element 290, and/or first communication elements 250.

This communication functionality may be implemented based upon either or both data sources and/or data destinations. For destination-based communication, destination addresses for each context are typically stored in a routing table of an output queue 315 (FIG. 8). Output is then provided for the corresponding address, with the full interconnect element 275 or distributed full interconnect element 295 configured for the corresponding destination address. For this embodiment, when one output from a composite circuit element 260 is to be applied as input to more than one composite circuit element 260, these additional inputs may be provided sequentially. In other exemplary embodiments, additional output fan-out may be provided, such that an output of one composite circuit element 260 may be input concurrently into a plurality of other composite circuit elements 260, also via full interconnect element 275, distributed full interconnect element 295 or other communication structures. Handshaking protocols may also be utilized, with the destination sending or not sending an acknowledgement upon receipt of data.

For source-based communication, implemented in an exemplary embodiment, source addresses for each context are typically stored in input queues 320. Every source provides its output on a selected bus or communication lines of the full interconnect element 275 or distributed full interconnect element 295. For incoming data, the corresponding input queue 320 determines whether the data is from a source designated for one or more of its contexts and, if so, when memory space is available, receives the corresponding data. This source-based communication provides ease of multicasting or broadcasting, as any and all destinations are enabled to concurrently receive any data of interest transmitted on the selected data lines. Handshaking protocols may also be utilized, with the destination sending or not sending a denial or other unavailability message when it is unable to receive the data transmitted (thereby providing for the source to resend the data at another time).

In another exemplary embodiment, no handshaking or other type of communication acknowledgement is utilized. Physical data links may be established at run time, as part of the binding process, with all corresponding computational processes allowed to execute, without a need to determine input data availability or space availability for output data. Such an implementation is useful for pipelining, such as for inner kernels of various algorithms. In addition, such an implementation is useful to avoid data stalls or data back pressure, when one data process may be waiting for incoming data and thereby affecting data throughput of other processes. In addition, combinations of these implementations may also be utilized, such as various components utilizing data flow-based operations, and other components not utilizing data flow-based operations. For example, data flow-based operations may be utilized for operations within a cluster 200, with other operations, such as communication operations, allowed to simply execute (e.g., route and switch).

Continuing to refer to FIGS. 5 and 6, the full interconnect element 275 and distributed full interconnect element 295 are illustrated generally, for ease and clarity of illustration, to represent generally the types of communication within a cluster 200, such as, for example: to provide for the input and output of any composite circuit element 260 to be coupled to other composite circuit elements 260, to the state machine element 290, to the message manager 265, or to either (or both) first communication elements 250 or intercluster queue 245, for data transfer to or from other clusters 200; communication between the state machine element (SME) 290 and any composite circuit element 260 (including memory elements and communication elements); communication between the SME 290 and either or both first communication elements 250, for transfer of control information, queries, query responses, and so on; communication between the message manager 265 and interconnect 155; and communication between the first communication elements 250 and the various memories within the cluster 200 (e.g., second memory element 255 and the other memories within the various components of the cluster 200); and any other communication between or among combinations of components within a cluster 200. It will be understood by those of skill in the art that a wide variety of communication structures and communication media are available, and all such variations are considered equivalent and within the scope of the present invention.

The state machine element (SME) 290 functions as a (comparatively small) microprocessor (or microcontroller), such as a RISC processor, for execution of instructions, determination of conditions and events, operating system management, and control of the composite circuit elements 260. The SME 290 can be utilized to implement legacy C programs and implement state for otherwise stateless dataflow operations of the composite circuit elements 260. The state machine element 290 is adapted to function as a sequential processor, and its operations are augmented by the composite circuit elements 260 within the same cluster 200. The SME 290 also may have internal memory, may utilize the second memory element 255, a memory composite circuit element $260_M$, or a memory 330 within a composite circuit element 260, for storage of data and instructions (or actions). For example, the second memory element 255 may be implemented as a plurality of "long" queues, having sufficient depth to store instructions which may be utilized by the state machine element 290. The SME 290 may utilize any of the composite circuit elements 260 to perform calculations or other functions which will be needed in its execution of its program, such as to add or to compare two numbers, for example. The state machine element 290 performs control functions of computations, such as determinations of conditionals, represented in programming languages using statements such as IF, CASE, WHILE, FOR, etc. The SME 290 may also have control registers or other types of internal memory, such as to define and keep track of its control functions. As previously mentioned, not every cluster 200 is required to have a state machine element 290.

In addition, the state machine element 290 is illustrated as having, in addition to direct access to the element interface and control 280 of the composite circuit elements 260 (via configuration/control bus 285), a direct connection to the first memory element $270_M$ (and/or second memory element 255), to facilitate corresponding memory accesses for instruction/code processing and other data access. Alternatively to the use of the configuration/control bus 285, such communication may be provided via the full interconnect element 275 or distributed full interconnect element 295, for example.

The state machine element 290 is utilized to implement a hardware operating system, and in a supervisory mode, has access to all of the resources within its cluster 200, thereby able to program, control, and monitor all of the composite circuit elements 260 within the cluster 200. For implementations in which one or more clusters 200 do not have a state machine element 290 included within the cluster 200, one or more other state machine elements 290 of other clusters 200 will perform these functions and operations. In addition to task control, the state machine element 290 is utilized in self-testing of cluster resources, loading or assigning tasks (actions (or instructions)), binding actions (or instructions) (e.g., run-time binding) to the composite circuit elements 260, and in creating the connections between and among the various composite circuit elements 260 and clusters 200. The assigning and binding process is discussed in greater detail with reference to FIG. 14. Collectively, the SMEs 290 within the clusters 200 function as a highly distributed controller, running the operating system of the apparatus 100 (in conjunction with any needed composite circuit elements 260), either with or without other controllers 175. In exemplary embodiments, various SMEs 290 may take on additional functions, such performing a system boot process, operating as a master controller, and determining and mapping functional and nonfunctional composite circuit elements 260 and other components, for example. The operation of the SME 290 is also explained in greater detail below with reference to FIGS. 8-14.

For example, the SME 290 may start a bound task of the composite circuit elements 260 within the cluster 200, suspend a task, suspend an action or function of a composite circuit element 260 (as part of an overall task), halt a task and free its resources (such as to load and run a higher priority task), set a task to perform in a single-step mode, and move a task to another location (such as to perform self-testing of the composite circuit elements 260 currently performing the task).

The message manager 265, in the first cluster 200 and second cluster 200A embodiments, is utilized for communication external to the apparatus 100, such as for an Ethernet interface, a memory interface (e.g., DDR-2 SDRAM), a PCI-Express interface, etc. The message manager 265 is coupled directly to the SME 290, and more generally, also may be coupled to the full interconnect element 275 or distributed full interconnect element 295, the first communication elements 250, and/or the composite circuit elements 260 (not separately illustrated). For example, data words provided by the full interconnect element 275 may be output by the message manager 265 for storage in an external memory. Similarly, also for example, incoming data, configuration or control may be transferred to the SME 290 (or stored in second memory element 255), such as to provide instructions for the SME 290, or transferred to a composite circuit element 260, for use and consumption in computations. In addition, in an exemplary embodiment, the message manager 265 is also coupled to the second communication channel or bus 220 (of the interconnect 155).

In an exemplary embodiment, as an additional alternative, the message manager 265 is also utilized for communication within the apparatus 100. In this embodiment, the message manager 265 is also utilized for cluster 200 to cluster 200 communication, and for SME 290 to SME 290 communication. For example, the message manager 265 is utilized for one composite circuit element 260 of a first cluster 200 to transfer information to another composite circuit element 260 of a second cluster 200.

Also, in an exemplary embodiment, not all message managers 265 in a matrix 150 are implemented to provide external communication. For example, in one alternative embodiment utilizing four matrices 150, each matrix 150 is provided with a total of six PCI-express interfaces implemented through the message managers 265 of six corresponding clusters 200 (one per supercluster 185, in an embodiment in which superclusters 185 are implemented identically). Similarly, in this four matrix example, each matrix 150 is provided with a total of one or two DDR-2 interfaces implemented through the message managers 265 of one or two corresponding clusters 200. As a result, there are remaining clusters 200 which have corresponding message managers 265 which are not providing interfaces and control for external communication. For these remaining clusters 200, their corresponding message managers 265 transfer data to these other clusters 200 having DDR-2 or PCI-express interfaces for storage in memory or external communication on a PCI-express bus, respectively, either through second communication elements 210 (supercluster-level) or third communication elements 190 (matrix-level).

The message manager 265 may be implemented in a wide variety of ways, depending upon the selected embodiment. In a first selected embodiment, the message manager 265 is implemented as a finite state machine and implements communication standards, such as those mentioned above. When implemented as a state machine, the message manager 265 may be implemented separately or combined as a part of the SME 290. In a second selected embodiment, the message manager 265 is implemented as dedicated computational logic gates, also for the provision of a communication interface, with the SME 290 utilized to perform any conditional logic or other state machine functions.

In exemplary embodiments, as indicated above, the composite circuit elements 260 will include some form of identification by type or kind of composite circuit element 260 (i.e., type of circuit element 270 within the composite circuit element 260), to facilitate identification by a state machine element ("SME") 290. Generally, a SME 290 will determine (and report to other SMEs 290, as necessary) the types and context availability of the composite circuit elements 260 within its cluster 200, for use in run-time binding. For example, for the illustrated cluster 200, the SME 290 may determine that the cluster has one configurable barrel shifter-type element (corresponding to type "A") $270_A$, two configurable triple-ALU-type elements (corresponding to type "B") $270_B$, one configurable Galois multiplier-type element (corresponding to type "C") $270_C$, one configurable bit reordering ("BREO")-type element (corresponding to type "D") $270_D$, and one content addressable memory element (corresponding to type "M") $270_M$. The SME 290 may also determine and report at another time that the BREO-type element of its cluster 200 is no longer functioning properly, so that the operations of its BREO-type element may be transferred to a BREO-type element of another cluster 200.

Continuing to refer to FIGS. 5 and 6, the second memory element 255 may receive input and provide output (be written to and read from) either directly or indirectly via the full interconnect element 275 or distributed full interconnect element 295, from a plurality of sources, such as: (1) to and from the first communication elements 250 (for input from other clusters 200, such as input of data, instructions or other control information for use by the SME 290 or for queuing data for use by composite circuit elements 260); (2) to and from one or more composite circuit elements 260 (including memory composite circuit element $260_M$) within the same cluster 200; (3) to and from the SME 290; or (4) to and from the message manager 265.

Figure 7:
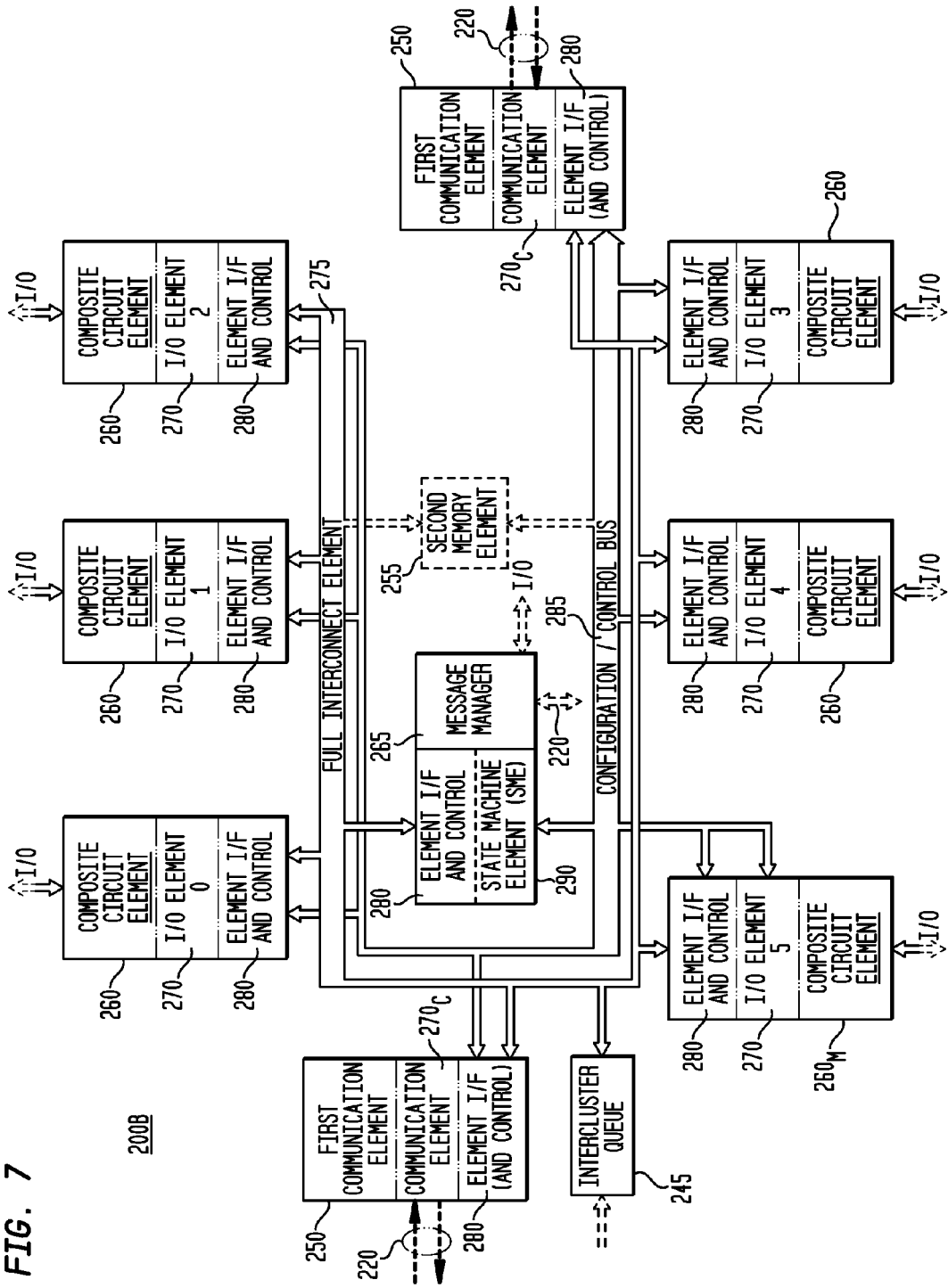
FIG. 7 is a block diagram illustrating a third exemplary circuit cluster in accordance with the teachings of the present invention.

FIG. 7 is a block diagram illustrating a third exemplary cluster 200B embodiment in accordance with the teachings of the present invention, as another variation of a cluster 200. In this embodiment, the cluster 200B contains composite circuit elements 260 having communication functionality, such as to provide external communication functionality, e.g., for the communication functionality concentrated within a selected matrix 150 as illustrated in FIG. 3. Also in this embodiment, as an option, the message manager 265 is not utilized for such external communication, which instead is provided within dedicated communication composite circuit elements 260, which may be configurable or nonconfigurable. In this embodiment, each communication composite element 260 is utilized to provide a standard I/O interface for (external) communication to and from the apparatus 100, such as DDR-2 or PCI-e interfaces. In addition, the communication composite elements 260 may have additional input and output bus or media structures to provide such interfaces, and are not confined to communicating outside the cluster 201 through the first communication elements 250. Depending upon the selected embodiment, additional communication composite elements 260 may be utilized for increased resiliency and immunity from catastrophic failure. In all other respects, the clusters 200, 200B are identical, and further differ from cluster 200A in use of a full interconnect element 275 rather than a distributed full interconnect element 295. As a consequence, any reference to a cluster 200 will be understood to mean and include the third embodiment illustrated as cluster 200B, as a variation or more specific case of a cluster 200, and cluster 200B otherwise also will not be further discussed as a separate embodiment. It should be noted, however, that the first cluster 200 embodiment may also be utilized for the communication functionality concentrated within a selected matrix 150 as illustrated in FIG. 3.

For the cluster embodiments, because of the same matrix, supercluster and cluster addressing, and because of the same element interface and control 280, any other cluster 200 (or composite circuit element 260) may communicate with the communication composite elements 260 and its cluster 201, or communicate with a cluster 200 having a message manager 265 with an external communication interface, in same manner as any communication with any other composite circuit element 260 or cluster 200. As a result, when a cluster 200 or composite circuit element 260 has a communication external to the apparatus 100, all that is required is for that cluster 200 or composite circuit element 260 to have the address of the corresponding communication composite elements 260 (with the interface corresponding to the selected form of communication) and/or its cluster 201, or the address of a cluster 200 having a message manager 265 with the interface corresponding to the selected form of communication. Such addressing may be provided by various components within the cluster 200, such as the message manager 265, the SME 290, or the first communication elements 250, for example. Such external communication is thereby provided through virtual addressing, e.g., via a message manager 265 or cluster 200, or via a communication composite elements 260 or cluster 201, and the composite element 260 does not need any further information concerning the location or type of the external interface. For example, a cluster 200 or composite circuit element 260 does not need any information concerning whether its external communication is with a DDR SDRAM or is via an Ethernet protocol, or where these interfaces may be located on the apparatus 100. Similarly, for internal communication, a composite circuit element 260 also does not need any information concerning whether its communication is within another composite circuit element 260 within the same cluster 200 or a different cluster 200.

Figure 18:
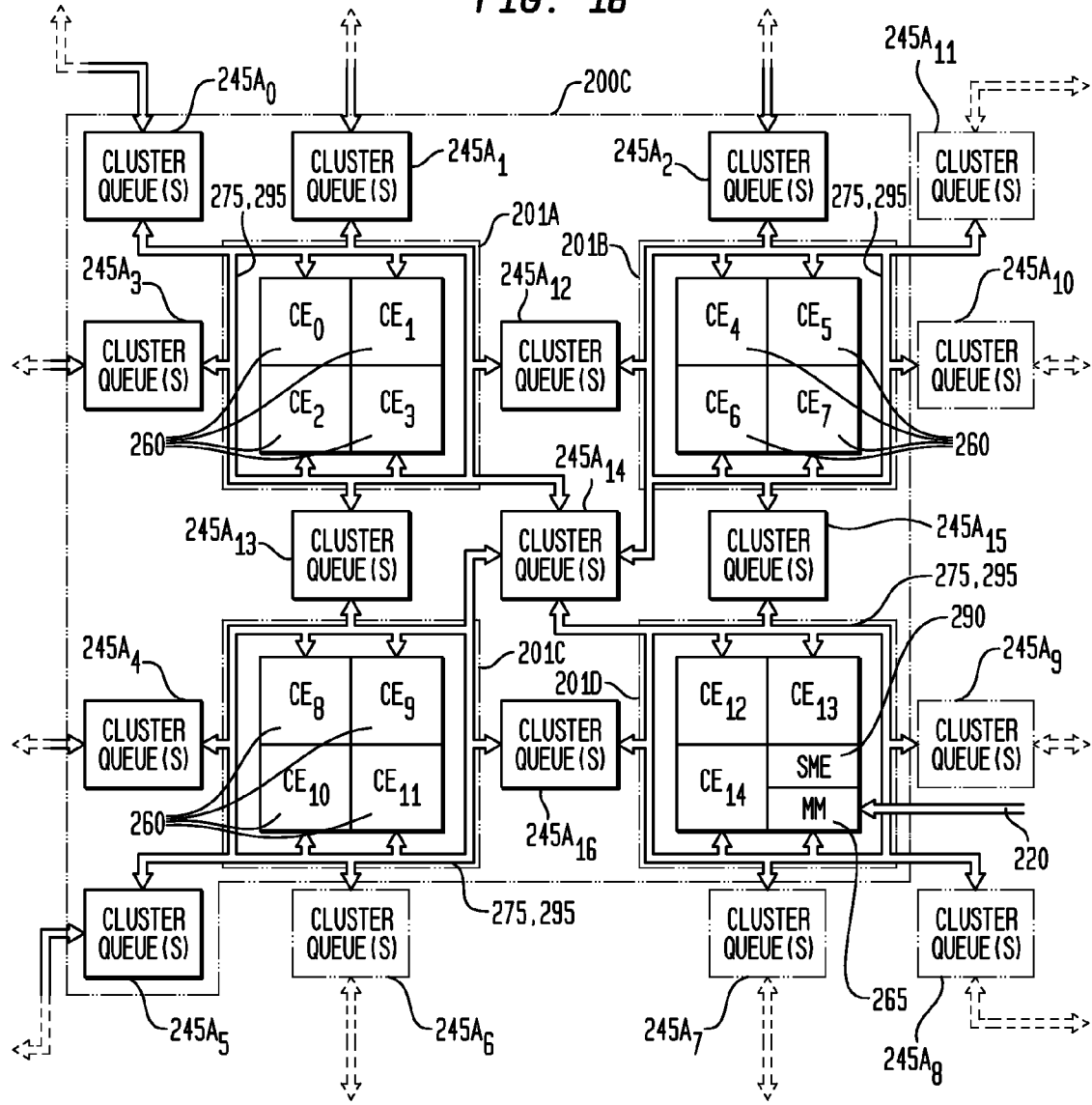
FIG. 18 is a block diagram illustrating a fourth exemplary circuit cluster in accordance with the teachings of the present invention.

FIG. 18 is a block diagram illustrating a fourth exemplary circuit cluster 200C in accordance with the teachings of the present invention. The fourth exemplary circuit cluster 200C differs from the cluster embodiments discussed previously in that its topology has a degree of internal hierarchy, with the fourth exemplary circuit cluster 200C divided into a plurality of zones 201, illustrated as zones 201A, 201B, 201C and 201D, with each zone 201 having four composite circuit elements 260 (as illustrated) which are coupled to a separate interconnect 275, 295 (which may be full or distributed), and with communication between each zone 201 occurring through a plurality of cluster queues 245A (which are effectively identical to the previously described intercluster queues 245). The cluster queues 245A are utilized for communication within a cluster 200C, and not merely for "fast track" communication between clusters 200. The full or distributed interconnect 275, 295 is also source-based, as described in greater detail below, with each destination composite circuit element 260 monitoring the interconnect 275, 295 for communication(s) from its corresponding data source. As an equivalent alternative, the full or distributed interconnect 275, 295 may be destination-based, as described herein.

The circuit cluster 200C does not include first communication elements 250. Instead, communication with other clusters 200, superclusters 185, matrices 150, or external communication (such as to a PCI-e bus) (via second channel (or bus structure) 220) is accomplished through the message manager 265, which provides the additional packet-based and circuit-switched communication functionality of the first communication elements 250. Each of the composite circuit elements 260, illustrated as $CE_0$ through $CE_{14}$, are coupled to the full or distributed interconnect 275, 295 as described previously, with 4 inputs and 2 outputs to and from each composite circuit elements 260. The cluster queues $245A_{12}$ through cluster queues $245A_{16}$, as illustrated, provide communication between and among the various zones 201 of composite circuit elements 260 within the circuit cluster 200C.

Typically, the cluster queues 245A are implemented as multiple unidirectional ports, using any type of memory as discussed herein, and are implemented to provide several communication paths in both directions between zones 201 (one "hop" to any destination within a cluster 200C, with one "hop" occurring per cycle, absent contention from other data sources) or between circuit clusters 200C (one or two cycles or "hops" to an adjacent cluster 200C, and one or more cycles or "hops" to any other destination). In an exemplary embodiment, each cluster queue 245A provides four communication paths, two in each direction. For example, cluster queue $245A_{15}$ provides two communication paths from zone 201B (as a data source) to zone 201D (as a data destination), and provides two communication paths from zone 201D (as a data source) to zone 201B (as a data destination). In an exemplary embodiment, each cluster queue 245A also has eight contexts, providing eight virtual connections across each cluster queue 245A in each direction and for each communication path.

Accordingly, for this embodiment, cluster queues 245A and message manager circuit 265 are also considered "communication elements" within the scope of the present invention.

Figure 19:
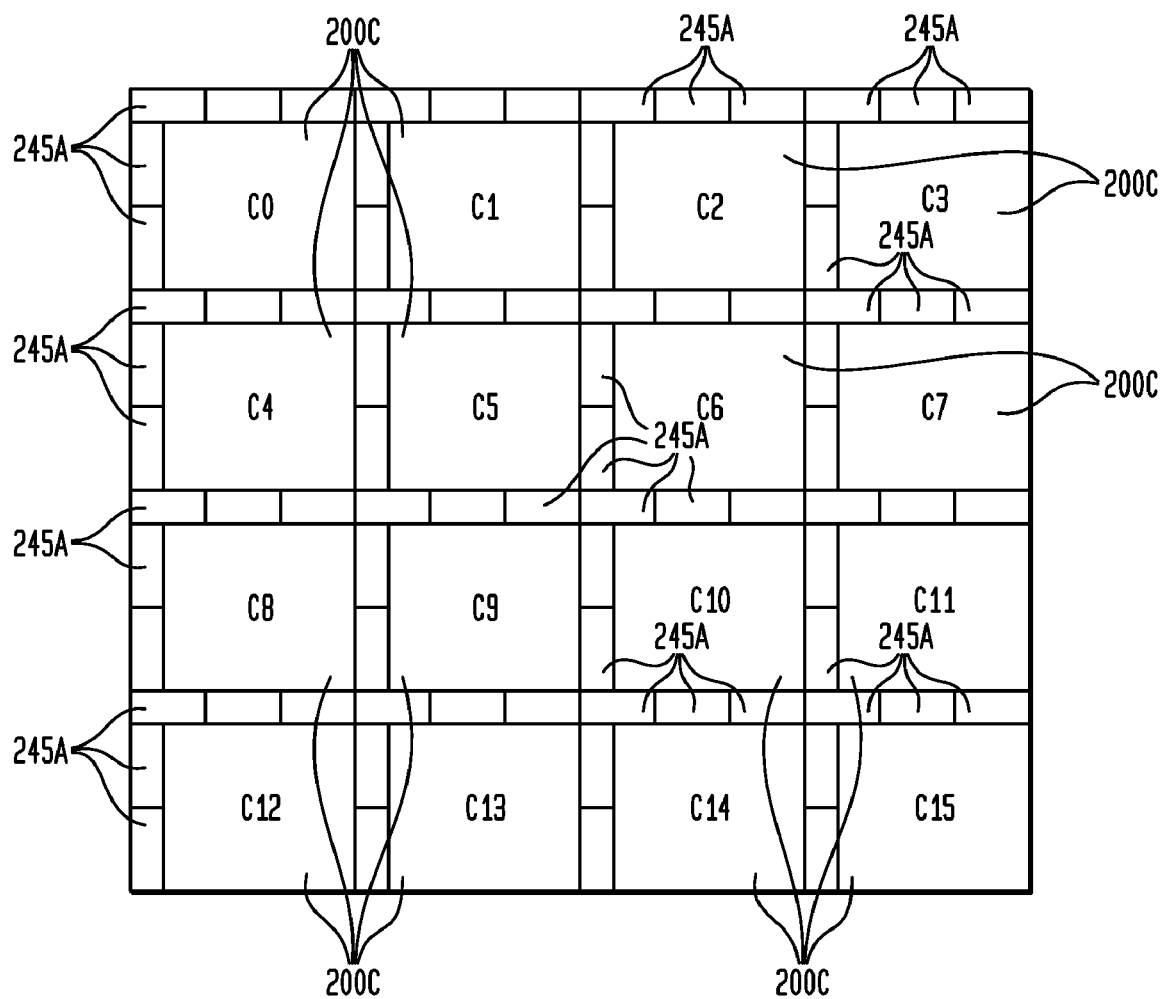
FIG. 19 is a block diagram illustrating an exemplary third apparatus embodiment in accordance with the teachings of the present invention.

FIG. 19 is a block diagram illustrating an exemplary third apparatus embodiment, comprising a supercluster 185C, in accordance with the teachings of the present invention. Using this topology for a circuit cluster 200C, the circuit clusters 200C may be effectively tiled or arrayed with each other, to form a supercluster 185, illustrated as supercluster 185C, having sixteen circuit clusters 200C, illustrated as C0 through C15. Each of the circuit clusters 200C communicates with adjacent circuit clusters 200C through the plurality of cluster queues 245A. Such superclusters 185C then do not utilize one or more second communication elements 210, and instead connect to one or more third communication elements 190 through one or more message managers 265 within the supercluster 185C.

Referring again to FIG. 18, for this embodiment, the cluster queues 245A also provide intercluster communication with adjacent clusters 200C, and may be viewed as a more generalized type of intercluster queues 245. As illustrated, the peripheral cluster queues 245A provide communication between the circuit cluster 200C and its adjacent circuit clusters 200C. For intercluster communication, the cluster queues 245A may be implemented to provide one or two communication paths in each direction, depending on the selected embodiment. For example, in an exemplary embodiment, the peripheral cluster queues 245A provide one communication path in each direction. Using typical geographic coordinates, for example, cluster queue(s) $245A_0$ provides communication between circuit cluster 200C and an adjacent "northwest" circuit cluster 200C, cluster queue(s) $245A_1$ and $245A_2$ provide communication between circuit cluster 200C and an adjacent "north" circuit cluster 200C, cluster queue(s) $245A_3$ and $245A_4$ provide communication between circuit cluster 200C and an adjacent "west" circuit cluster 200C, and cluster queue(s) $245A_5$ provides communication between circuit cluster 200C and an adjacent "southwest" circuit cluster 200C. Similarly, the cluster queue(s) $245A_{11}$ (which may be considered part of an adjacent cluster 200C) provide communication between circuit cluster 200C and an adjacent "northeast" circuit cluster 200C, cluster queue(s) $245A_{10}$ and $245A_9$ (which may be considered part of an adjacent cluster 200C) provide communication between circuit cluster 200C and an adjacent "east" circuit cluster 200C, cluster queue(s) $245A_8$ (which may be considered part of an adjacent cluster 200C) provides communication between circuit cluster 200C and an adjacent "southeast" circuit cluster 200C, and cluster queue(s) $245A_6$ and $245A_7$ (which may be considered part of an adjacent cluster 200C) provide communication between circuit cluster 200C and an adjacent "south" circuit cluster 200C.

In addition, for data routing assignments, such as in the run-time binding described below, rather than routing data or other information through a second communication element 210 to or from a supercluster 185 and/or through a first communication element 250 to or from a circuit cluster 200, routing may occur through a message manager 265 to or from a supercluster 185 or a circuit cluster 200, and by routing to a designated composite circuit element 260 within a supercluster 185C or a circuit cluster 200C through any of the various cluster queues 245A, using either the source-based or destination-based communication schemes described herein. This use of cluster queues 245A for intercluster communication has the potential advantage of reduced latency compared to use of the first communication element 250, insofar as multiple words are not required for assembly into a packet train, and instead may be communicated as they are generated. The supercluster 185C and circuit cluster 200C otherwise function as described herein for any supercluster 185 and circuit cluster 200, respectively. Accordingly, any reference to a supercluster 185 or to a circuit cluster 200 shall be understood to correspondingly mean and include a supercluster 185C or circuit cluster 200C, respectively.

Figure 8:
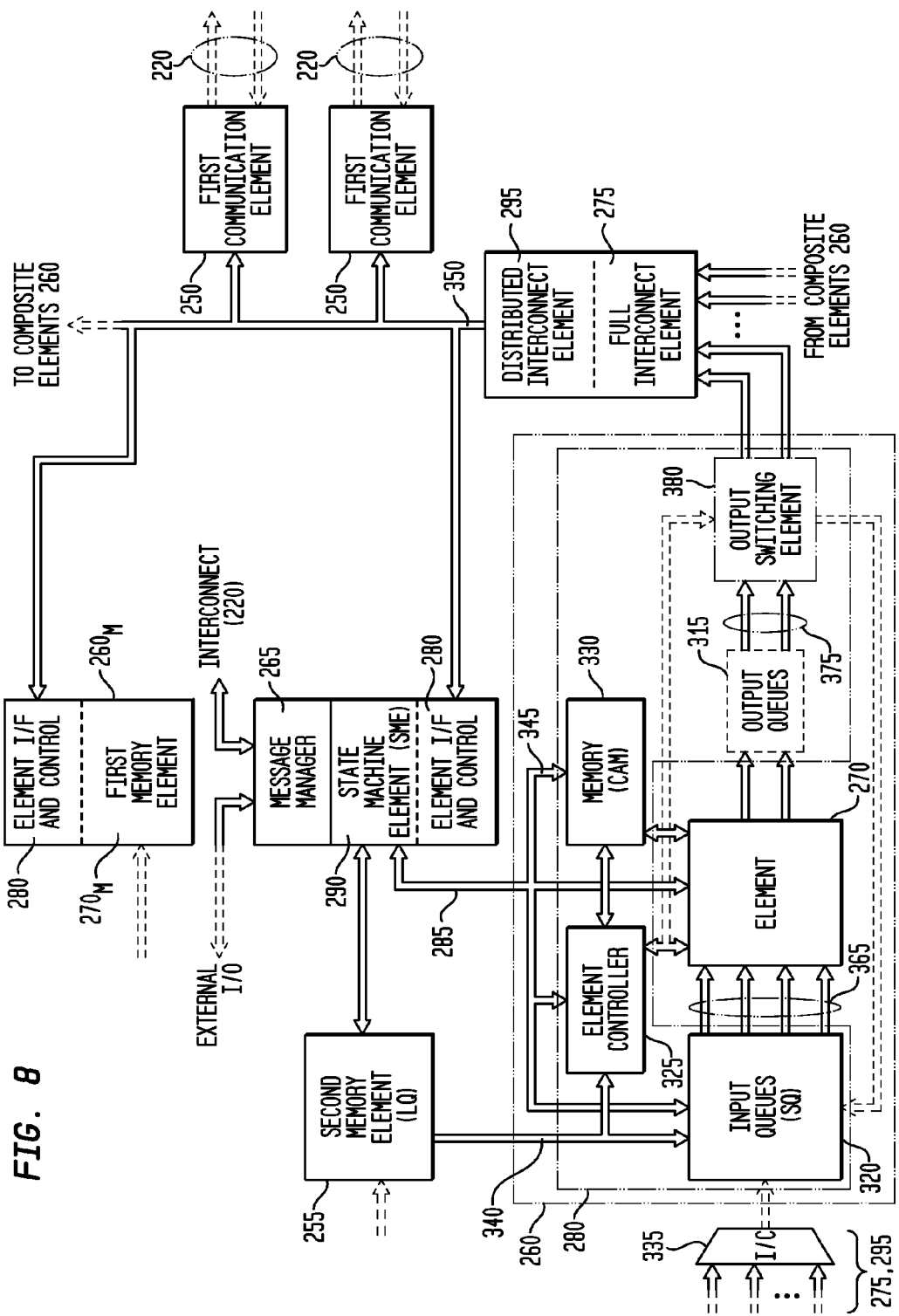
FIG. 8 is a block diagram illustrating in greater detail an exemplary composite circuit element within an exemplary circuit cluster in accordance with the teachings of the present invention.

FIG. 8 is a block diagram illustrating in greater detail an exemplary composite circuit element 260 within an exemplary cluster 200 in accordance with the teachings of the present invention. As illustrated in FIG. 8, the composite circuit element 260 comprises an element interface and control 280 and a circuit element 270 (also referred to as a computational element 270), which is generally a configurable computational element, but which may also be a non-configurable computational element, a configurable or non-configurable communication element, a configurable or nonconfigurable finite state machine element, may be a configurable or nonconfigurable memory element, or may be other forms of circuitry selected for any particular application of an apparatus 100.

In an exemplary embodiment, the element interface and control 280 comprises: (1) an element controller 325; (2) a memory 330 (such as a content addressable memory ("CAM") or random access memory such as SDRAM) which stores contexts and control information (e.g., configuration words); (3) input queues 320 (as a form of memory); and (4) output queues (or registers) 315 (also as a form of memory). In other exemplary embodiments, the element interface and control 280 may include the element controller 325, the memory 330, and either the input queues 320 or the output queues 315, but not both. In additional exemplary embodiments, the element interface and control 280 may include the memory 330, and either the input queues 320 or the output queues 315, but not the element controller 325. In the latter embodiment, once a SME 290 has assigned actions and established the data routing, no separate or additional control is utilized within the composite circuit elements 260, with the composite circuit elements 260 allowed to freely and/or continuously execute an assigned context.

As mentioned above, in selected embodiments, the element interface and control 280 may also include an optional output switching element 380 such as one or more switches, transistors, multiplexers or demultiplexers, to provide direct switching capability for output data, such as for internal feedback within the composite circuit element 260, or for providing output data to the SME 290, to the message manager 265, or to the first communication elements 250, in addition to providing output data to the full interconnect element 275 or distributed full interconnect element 295. As mentioned above, the memory 330, input queues 320 and output queues 315 may be implemented as any form of memory, including without limitation any of the memory types mentioned previously, such as CAM or SDRAM.

The input queues 320 provide a plurality of inputs 365 into the configurable circuit element 270, illustrated as an exemplary four inputs each having a width of one 16-bit data word. Alternatively, the width may be wider, such as to include a bit designating a placeholder, for example. The input queues 320 may be independent from each other or may be dependent upon each other, such as using 2 inputs for a combined 32-bit data word. In exemplary embodiments, input queues 320 are provided for each of the inputs into the circuit element 270, with each of the input queues 320 providing a separate queue for each context which may be utilized by the circuit element 270. In addition, the input queues 320 may be implemented as "short queues", having a depth of 1 or 2 data words, although deeper queues and other forms of memory are within the scope of the invention. For an exemplary embodiment, eight contexts are utilized, for each of 4 inputs, with a depth of at least 2 data words. Contexts may also be combined, such as to implement a larger queue, e.g., 16 words, for a selected context.

The input queues 320 may receive data from any of a plurality of input sources, depending upon the switching arrangements, either directly or via the full interconnect element 275 or distributed full interconnect element 295, such as: (1) from the first communication elements 250 (for input from other clusters 200); (2) from one or more other composite circuit elements 260 (including memory composite element 260$_M$) within the same cluster 200; (3) from the second memory element 255; (4) from the message manager 265; or (5) from the SME 290 (e.g., when utilized by the SME 290 for calculation of a value or comparison of 2 values, such as to evaluate a condition or an event). As illustrated in FIG. 8, the input queues 320 receive data from either a full interconnect element 275 or a distributed full interconnect element 295, illustrated as an exemplary multiplexer 335. For an exemplary embodiment, the multiplexer 335 is a 16-to-1 multiplexer, allowing the input queues 320 to obtain data from any assigned source by selecting busses of the interconnect 275, 295 for input data. An output from a circuit element 270 also may be fed back to be provided as an input, through the input queues 320, or directly within the circuitry of the element 270, via an output switching element 380 mentioned above, or simply via the full interconnect element 275.

In an exemplary embodiment, two output queues (registers or other forms of memory) 315 are provided, each having the corresponding eight contexts, each having a width of one 16-bit data word, and having a selected depth of 1, 2 or more data words. Alternatively, the width may be wider, such as to include a bit designating a placeholder, for example. The output queues 315 also may be independent from each other or may be dependent upon each other, such as using 2 output queues 315 for a combined 32-bit data word. The contexts may also be combined, such as to implement a larger queue, e.g., 8-16 words, for a selected context. In addition to storing output data, the output queues 315 (utilizing an incorporated state machine) may also replicate output data, such as providing the same output data to additional contexts for distribution to additional destinations.

A plurality of outputs 375 are provided from the output queues 315 of the circuit element 270, illustrated as two outputs, also each having a width of one 16-bit data word (or wider, as discussed above, such as for inclusion of a placeholder bit, control information, or other data). The outputs 375 also may be independent from each other or may be dependent upon each other, such as using 2 outputs for a combined 32-bit data word. The outputs 375 are provided to the full interconnect element 275 or distributed full interconnect element 295 (or the optional output switching element 380), which may independently provide each of the plurality of outputs 375 to any of the following (via corresponding communication structures or bus 350): (1) to the first communication elements 250 (for output to other clusters 200); (2) to one or more (other) composite circuit elements 260 (including memory composite element 260$_M$) within the same cluster 200; (3) to the SME 290 (such as when utilized by the SME 290 for calculation of a value or comparison of 2 values (e.g., to evaluate a condition or an event)); (4) to the message manager 265; or (5) to an optional second memory element 255, such as a long queue for input into the SME 290 or other components. As mentioned above, the optional output switching element 380 and other output switching arrangements are also available and will be apparent to those of skill in the electronic arts, are considered equivalent and are within the scope of the present invention.

In a selected embodiment, the memory 330 is implemented as a CAM, to facilitate searching and identification of stored task identifiers (task IDs) and stored action identifiers (action IDs). In another embodiment, the memory 330 is implemented as RAM, with searching and identification performed utilizing other search methods, such as binary searching. Other types and combinations of memory may be utilized, however, and all are considered equivalent and within the scope of the present invention, whether volatile or non-volatile, including without limitation any type or combination of RAM, FLASH, DRAM, SDRAM, SRAM, MRAM, FeRAM, ROM, EPROM or E²PROM, or any other type of memory, storage medium, or data storage apparatus or circuit, which is known or which becomes known, depending upon the selected embodiment.

The memory 330 is utilized in the exemplary embodiments to store both contexts and control information, utilized to configure the configurable element 270 and direct its operations. Such contexts and control information is stored as a configuration word in the exemplary embodiments, as a plurality of information fields, and is discussed below with reference to FIG. 16. In addition, through the state machine element 290, such configuration words may be altered, deleted, supplanted, added, and so on, and by modifying various bits within the configuration word, the execution of operations by the circuit element 270 may also be controlled. This local storage of contexts and control information provides for extremely fast execution capability, as configurations or instructions do not need to be fetched and read from a remote memory, but are instantly available as contexts for immediate configuration and control of the circuit element 270. As such, the apparatus 100 is not subject to the "von Neumann" bottleneck which limits the execution capabilities of typical processors. Indeed, the various memories 330 function as a large, very highly distributed instruction memory which may be utilized advantageously, such as for distributed processing, distributed digital signal processing, distributed programming, and distributed rebinding of instructions (or actions) in the event of a component failure, for example.

This use and local storage of contexts also allows for significant time multiplexing of operations of composite circuit elements 260, first communication elements 250, and state machine elements 290. For example, while one context of a selected composite circuit element 260 may require input data which has not yet been created by another composite circuit element 260, another context may be able to be executed on the selected composite circuit element 260, rather than the composite circuit element 260 remaining idle. Similarly, the use of a plurality of contexts by a state machine element 290 allows multithreaded operation. For example, a SME 290 may commence execution of first code with a particular first data set for a first context, store interim results and a first code pointer, commence execution of second code with a second data set for a second context and provide an output, followed by returning to the first context for continued execution of the first code using the first code pointer and the stored, interim results. This use of time multiplexed contexts further allows interleaving of tasks and usage of resources which otherwise might be idle, allowing tasks to share resources and increasing the overall resource utilization of the IC.

The element controller 325 may be implemented through combinational logic gates and/or as a finite state machine, and is utilized to control how the circuit element 270 is configured and when the circuit element 270 operates, utilizing the configuration word (contexts and control information) stored in memory 330. More specifically, in exemplary embodiments, the circuit element 270 operates based on data flow, such that when it has data at its inputs, when it has an available destination to store or consume the output data to be produced, and when authorized by the element controller 325, the circuit element 270 will commence operations (or fire) and perform its calculations or manipulations on the input data and provide the corresponding output data. The element controller 325 controls this data flow operation, based on a plurality of conditions and priorities (and other information stored as one or more configuration words in memory 330). For example, when more than one context is ready for execution, the element controller 325 may arbitrate which runs first, such as through round-robin, or evaluation of one or more priorities, a scheduled execution of an activity, or when the activity last occurred (e.g., a most recently executed action may have a lower priority in the arbitration, while a least recently executed action may have a higher priority in the arbitration).

The element controller 325 may be implemented with varying levels of sophistication. As mentioned above, in one embodiment, the element controller 325 is not implemented, with the composite circuit elements 260 essentially operating in a continuous mode, subject to other constraints (e.g., control from any of the various SMEs 290). At the other extreme, the element controller 325 may provide multi-threaded operation of the circuit element 270, such as by storing a current state of a partial execution of a first context in the (first) memory 330, executing a second context (via the circuit element 270), and retrieving the current state and resuming execution of the first context by the circuit element 270.

Exemplary configurable, computational elements 270 are illustrated in FIGS. 9 and 10. FIG. 9 is a block diagram of an exemplary multiplier-type configurable element $270_F$, and FIG. 10 is a block diagram of an exemplary triple-ALU-type configurable element $270_G$. As illustrated, each has four 16-bit inputs 365 and two 16-bit outputs 375, and depending upon the context, each is capable of utilizing all inputs 365 and outputs 375. The configuration corresponding to a selected context is provided for mode selection of corresponding multiplexers, demultiplexers, and other switching elements to implement the selected configuration.

As illustrated in FIG. 9, the exemplary multiplier-type configurable element $270_F$ is configurable for several operating modes, such as for 32-bit multiplication, 16-bit multiplication, accumulation, and mixtures of 16- and 32-bit arithmetic. As a brief, high-level explanation, the multiplier-type configurable element $270_F$ may be configured using the 4 multiplexers 383, 384, 385, 386, using the 32-bit output select 387, and using other configuration bits input into the adder/subtracter 382 and the multiplier 381. The 32-bit output select 387 specifies whether the low 32 bits of the adder/subtracter 382 is output or which portion which portion of the 64-bit accumulation register 388 is output. The multiplexer 385 (A Select) specifies the A-input into the adder/subtracter 382, as zero, $I_1$, $I_2$, or the accumulation register 388; the multiplexer 386 (B Select) specifies the alignment of the B-input into the adder/subtracter 382, as one of four 16-bit portions of a 64-bit output from the multiplier 381; and configuration bits into the adder/subtracter 382 further specify whether the A-input is signed or unsigned and whether the B-input is added or subtracted. The multiplexer 383 (P Select) specifies the P-input into the multiplier 381, as $I_3$ or $I_2$, and whether signed or unsigned. The multiplexer 384 (Q Select) specifies the Q-input into the multiplier 381, as $I_1$ or $I_0$, and whether signed or unsigned. In addition, the multiplier-type configurable element $270_F$ also illustrates output feedback within the element 270, from the 64-bit accumulation register 388 to multiplexer 385.

As illustrated in FIG. 10, the exemplary triple-ALU-type configurable element $270_G$ is configurable for a wide variety of functions in including multiplication, addition and subtraction (in signed arithmetic), masking, arithmetic averaging, and rounding, for example. In addition, the exemplary triple-ALU-type configurable element $270_G$ may output a constant, pass one value (copying A or B to its output), perform logical functions (NOT, AND, OR, XOR), and may perform conditional or unconditional data flow. As illustrated in FIG. 10, depending upon the configuration bits, each of the shifters 393, 394, and 395 shift their corresponding inputs left (positive) or right (negative) by the designated amounts. The ABS blocks 389, 399 either compute the absolute value of the input or pass the input, also depending on the configuration bits. The status multiplexer 396 generates a status word using flag bits from each of the ALUs 390, 391 and 392, which may be provided to the SME 290, in which one flag bit designates a carry or comparison, a second flag bit indicates the result is the most significant bit, a third flag bit indicates the result is a negative one (−1), and a fourth flag bit indicates the result is zero. The condition-swap multiplexers 397 and 398 are utilized to provide conditional execution on inputs $I_3$, $I_2$, and based on the result, passing $I_0$ and/or $I_1$ to outputs 375, and further providing for swapping of inputs before being copied to outputs 375.

As mentioned above, in addition to these types of configurable elements 270, other anticipated configurable elements 270 include bit re-ordering elements ("BREOs"), single ALU elements, "super" ALU elements (32-bit ALU), barrel shifter elements, look-up table elements, memory elements, programmable controller elements, communication elements, etc.

B. Program Compilation for the Apparatus

Figure 11:
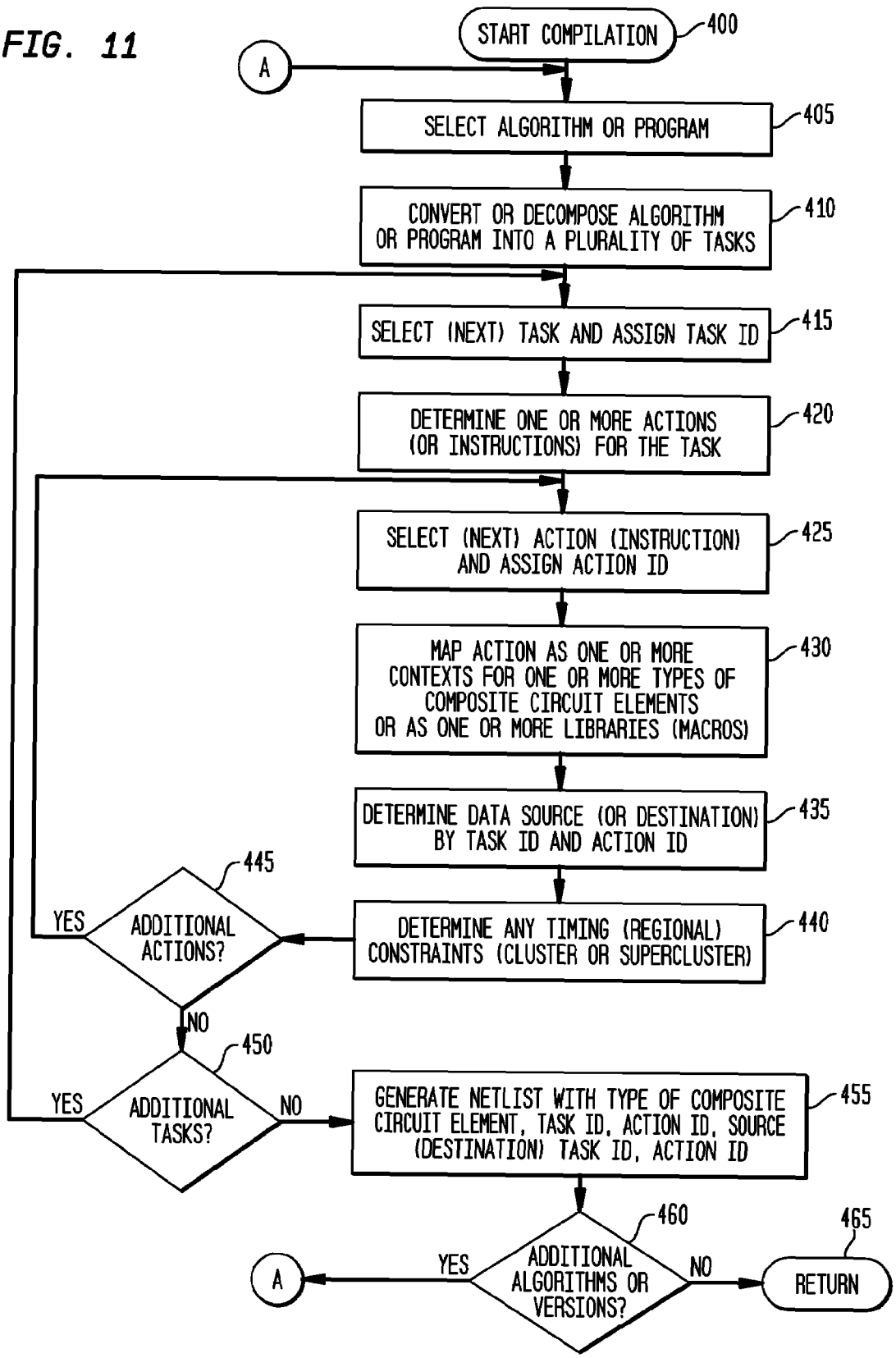
FIG. 11 is a flow diagram illustrating at a high level an exemplary compilation process in accordance with the teachings of the present invention.

FIG. 11 is a flow diagram illustrating at an exemplary compilation process in accordance with the teachings of the present invention. It should be understood that the following discussion is very high level for purposes of explaining the present invention. The compilation process may be performed using any computer system or network, workstation, processing device, one or more microprocessors, electronic design automation ("EDA") tools, electronic system-level ("ESL") tools, etc.

Referring to FIG. 11, the method begins, start step 400, with selection of an algorithm for compiling, step 405. Such an algorithm may be expressed in a wide variety of ways, from a mathematical description to a source code or object code listing for a microprocessor, for example. The algorithm is converted or decomposed into a plurality of "tasks", step 410, which are high level descriptions of a function or process, such as performing an inverse Fast Fourier Transformation (IFFT). A task is then selected from the plurality of tasks and is assigned a task identifier ("task ID"), step 415, which is typically a sufficiently unique identifier to differentiate the task from the other instances of tasks of the same algorithm or from tasks of other algorithms which will also be running concurrently on the apparatus 100.

The selected task is then converted or decomposed into one or more actions to be performed by a composite circuit element 260 (including computational, state machine, and/or communication composite elements 260, 290, 250) to execute the task, step 420. As mentioned above, an "action" is the type of function or activity to be performed by a composite circuit element 260, such as multiplication, bit manipulation, and instruction processing, for example, and may be considered equivalent to an instruction which would be executed by a processor or a function performed by an ASIC or FPGA to achieve the same result. For example, an IFFT task may be decomposed into a plurality of "butterfly" steps such as multiplication, addition and accumulation steps, each or all of which would constitute an action (or instruction), such as "multiply 'a' times 'b' (a×b)", and which would correspond to one of the operational configurations of one of the composite circuit elements 260. Accordingly, as used herein, the terms "action", "function" or "activity" are used equivalently and interchangeably to mean any such circuit processes. (As a result, such actions (or instructions), once assigned and bound, will be on the IC in the form of a configuration of one or more of the elements 270). Of the one or more actions (or instructions), an actions (or instructions) is selected and assigned an action identifier ("action ID"), step 425, which is a sufficiently unique identifier to differentiate the action (or instruction) from other actions (or instructions) for the selected task. The task ID and action ID are utilized in the run-time binding process, discussed below with reference to FIG. 14.

Each action (or instruction) is then mapped or assigned as one or more contexts of one or more composite circuit elements 260 by type of composite circuit element(s) to be utilized, step 430, and not to any specific composite circuit elements 260 or specific addresses within the architecture, to create a "symbolic", generic or non-specific compilation which is not tied to particular hardware components. For example, a multiplication and addition action (or instruction) may be mapped as a single context to an ALU-type composite element 260 (a composite element 260 having an ALU-type circuit element 270), and not to a specific ALU-type composite element 260 within a specific cluster 200. More complicated actions (or instructions) may be mapped to multiple contexts of multiple types of composite circuit elements 260. Later, as part of the binding process, one or more specific composite circuit elements 260 of the selected type will be assigned to perform the action (or, equivalently, execute the instruction), as one or more of its (or their) available contexts. This distinction is important, as it allows the action (or instruction) to be assigned initially to one or more composite circuit elements 260 and then potentially reassigned to other composite circuit elements 260, as may be needed, during operation of the apparatus 100. In addition, as indicated, in exemplary embodiments, this separate binding process may assign the action (or instruction) as one or more contexts which are available for the selected types of composite circuit elements 260, with other contexts potentially remaining available for assignment of other actions (or instructions).

As part of this process, corresponding "linkage" for each action (or instruction) is also determined, also at this generic, symbolic or non-specific level, step 435, namely, as generic or symbolic "pointers": for each action, information is generated and retained concerning either sources for input data or destinations for data output, or both. For example, action number "512" of task "418" will, in addition to being mapped to an ALU-type composite element 260, have associated information that it will receive its input from action number "414" of task "229", or that it will provide its output to action number "811" of task "319" (or both). Only one such set of either input linkage or output linkage is required, provided the set of information is generated consistently for all actions (or instructions), as linking an input to its data source automatically is linking the output of the data source to this input (destination) which will utilize the data, and vice-versa. In selected embodiments, it may be useful to have both sets of I/O linkage information. This relationship or "linkage" between input and output, through generic or symbolic pointers, is also useful as part of the task and action (or instruction) binding process discussed below. This input or output linkage determination of step 435 may be performed in the compilation process in a wide variety of orders and following any of various steps. For example, this determination may be performed following either step 440 or 445, such as when all actions (or instructions) for a task have been determined and mapped to the types of composite circuit elements 260, or when all actions (or instructions) and tasks have been determined and mapped to the types of composite circuit elements 260.

The compilation process also determines any timing constraints in the program or algorithm which would correspondingly require a degree of proximity or locality of execution by the various composite circuit elements 260, and provides corresponding regional constraints for the affected tasks and/or actions (or instructions), step 440. For example, for various timing requirements, some processes may need to be executed within a single cluster 200 or within a group of clusters 200 within the same supercluster 185, to avoid any delays which may be incurred from routing data packets on the interconnect 155 to and from other clusters 200 or other superclusters 185. In these circumstances, a regional requirement is provided in the compiled output (the "symbolic netlist" discussed below), such as by a "region" command or instruction designation, for example, to provide that the actions (or instructions) which follow must be performed within a single cluster 200 or within a single supercluster 185, followed by an "end region" indication for the actions (or instructions) confined to the single cluster 200 or single supercluster 185. Depending upon the selected embodiment, such regional constraints may also be extended to zones 201 within a circuit cluster 200, such as a circuit cluster 200C.

Following step 440, the method determines whether there are additional actions (or instructions) to be assigned an identifier and mapped to types of composite circuit elements 260, step 445, and if so, the method returns to step 425 and iterates, to select the next action (or instruction) and proceed through steps 425, 430 (potentially 435) and 440. When all actions (or instructions) for the task have been assigned an identifier and mapped to types of composite circuit elements 260 (and possibly input or output linked) in step 440, the method proceeds to step 450, and determines whether additional tasks are to be compiled. When additional tasks are to be compiled in step 450, the method returns to step 415 and iterates, selecting the next task, assigning a task ID, and so on.

When all tasks have been processed in step 450, such that the selected algorithm has been converted into a plurality of tasks and actions (or instructions), which have then been symbolically (generically or non-specifically) mapped to types of composite circuit elements 260 and symbolically linked by either data input sources or data output destinations (or both) (e.g., using symbolic pointers), the method generates a composite circuit element and routing "symbolic netlist" or symbolic compilation, step 455. This symbolic netlist, listing or compilation comprises a plurality of symbolic netlist elements, with each such symbolic netlist element corresponding to and containing information for execution of each action of each task of the algorithm or program. More particularly, each symbolic netlist element contains information concerning: (1) the task ID; (2) the action ID; (3) one or more types of composite circuit elements 260 and the number of contexts needed for each type of composite circuit element 260 for execution of the action (or instruction) of the corresponding task ID and action ID; (4) input or output (or both) linkage information; and (5) any regional (i.e., proximity) constraints for the corresponding tasks or actions (or instructions). In addition, the compilation method is applicable to any of the various circuit and interconnect topologies described herein, including to the supercluster 185C and circuit cluster 200C topologies.

As an alternative to mapping to one or more types of composite circuit elements 260 in step 430 and linking instructions in step 435, actions (or instructions) may also be mapped to "macro-definitions" or "libraries". Such "macro-definitions" or "libraries" are essentially pre-compiled tasks or actions, which have already been mapped to types of composite circuit elements 260 and which have been correspondingly linked (with regional constraints, if any), with a corresponding symbolic netlist. For example, an IFFT may be mapped to an IFFT library, which contains all of the composite element-type and composite element-linkage information to carry out an IFFT using the apparatus 100. Such library creation may occur at any of various levels, such as mapping various algorithms of H.264 for streaming media, for example.

Moreover, there may be multiple sets of such mappings and linkages for any selected action or task, which may be optimized for different goals, each of which may result in a different symbolic netlist. For example, as mentioned above, a task to be performed by a triple-ALU-type composite element 260 may instead be mapped to three single ALU-type composite elements 260. While this could potentially decrease bandwidth or speed of performance, it may allow performance by the apparatus 100 when other, higher priority algorithms are utilizing all available contexts of all available triple-ALU-type composite elements 260. Similarly, a task to be performed by an ALU-type composite element 260 may instead be mapped to a plurality of addition- and multiplication-type composite elements 260, creating yet another mapping and linking variation.

As a result of these mapping and linking variations which are available, any selected algorithm may have multiple symbolic netlists generated, each optimized or selected for a different goal, such as speed of performance, power minimization, ability to run with diminished resources, safety, redundancy, conflict resolution, and so on. For example, referring to FIG. 1, in the event a significant portion of the IC is damaged, such that the optimal algorithm for ABS no longer has sufficient IC resources to run, another (sub-optimal) version of the ABS functionality may be loaded and bound in the IC, enabling an important function to continue to operate and avoid potentially harmful consequences under circumstances in which another IC, such as a standard microprocessor, would fail completely.

Following symbolic netlist generation in step 450, the compilation method determines whether additional algorithms are to be compiled or, as discussed above, additional versions or alternatives for a selected algorithm are to be compiled, step 455, and if so, the method returns to step 405 and iterates. When no further algorithms or versions of algorithms are to be compiled in step 455, the method may end, return step 460.

C. Operating System

Figure 12:
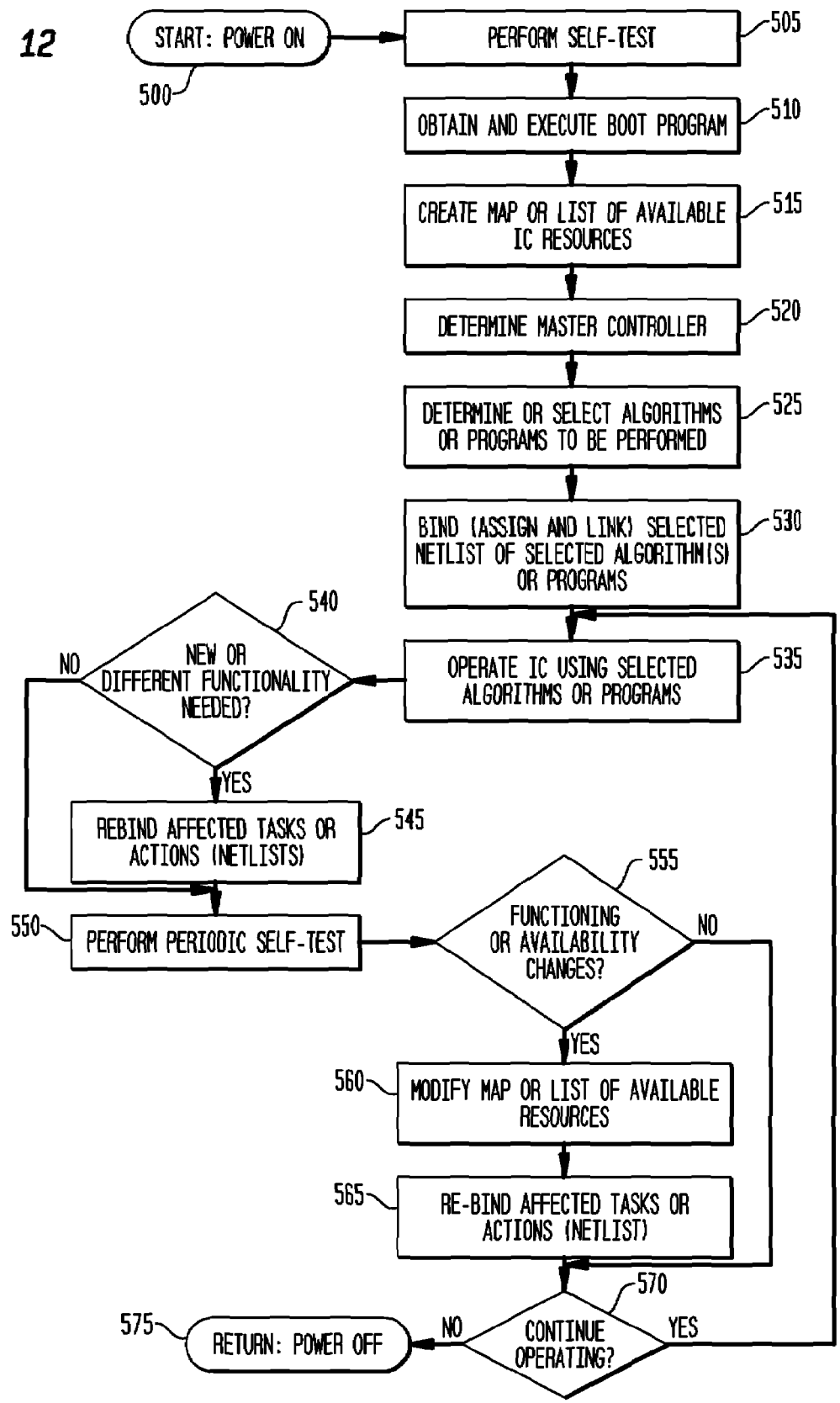
FIG. 12 is a flow diagram illustrating at a high level an exemplary operating system or process in accordance with the teachings of the present invention.

FIG. 12 is a flow diagram illustrating at a high level an exemplary operating system or process in accordance with the teachings of the present invention. It should be understood that the following discussion is very high level for purposes of explaining the present invention. In addition to being performed by the various SMEs 290, alternatively, this operating system functionality could be performed by one or more additional controllers 175.

The process begins, starting with step 500, with the apparatus 100 being powered on, such as part of an SOC or within another system, such as a vehicle, a computer, a complex system, a mobile telephone, a personal digital assistant, an MP3 player, and so on. A self-test is performed, step 505, typically by each of the state machine elements 290, which may test themselves and, in exemplary embodiments, the various composite circuit elements 260, first communication elements 250, full interconnect element(s) 275 or distributed full interconnect elements 295, other state machine elements 290, and other logic, communication or memory elements within their corresponding clusters 200 or other clusters 200 (e.g., for those clusters 200 implemented without corresponding SMEs 290). There are a wide variety of methods to determine whether these various components are operating properly. In an exemplary embodiment, the operational determination is performed by a composite circuit element (with composite circuit element utilized in its inclusive sense, including of all of the various composite circuit elements 260, first communication elements 250, full interconnect element(s) 275 or distributed full interconnect elements 295, other state machine elements 290, and other logic, communication or memory elements within their corresponding clusters 200 or other clusters 200), and is at least one of the following types of determinations: a periodic diagnostic performed by at least one composite circuit element of the plurality of composite circuit elements; a background diagnostic performed as a selected context of at least one composite circuit element of the plurality of composite circuit elements; or a comparison test performed by a plurality of composite circuit elements of the same circuit element type. For example, each of the various types of composite circuit elements, including the types of elements 270, may each perform a diagnostic self-test, followed by comparing their corresponding results. If the results of a first composite circuit elements does not match the expected result, such as by comparison of the results of other composite circuit elements 260 of the same type, the first composite circuit element is deemed defective or not properly operational, and is not included within the map or list of available resources (step 515, below).

One or more of the SMEs 290 (or controllers 175) will then obtain and execute a boot program, step 510, such as a program designed and stored for the apparatus 100 in an associated memory (e.g., flash or other EEPROM memory) or other data storage device, such as a hard disk drive, an optical drive, etc., which may be part of the same IC or associated system.

Two significant functions are performed as part of the boot process of the operating system in steps 515 and 520. One or more of the SMEs 290 creates a map or list of available apparatus 100 resources, such as a list within a cluster 200 or supercluster 185 of which composite circuit elements 260, first communication elements 250, and other components are functioning properly, step 515 (e.g., similar to creating a bad or good sector map for a memory or disk drive). Step 515 may be performed, for example, by each SME 290 for its corresponding cluster 200, or by one or more SMEs 290 (pre-designated or as determined in the boot program) for an entire supercluster 185 or matrix 150. In an exemplary embodiment, step 515 is performed by combinational logic elements, as illustrated in and as discussed below with reference to FIG. 13, which may be located or distributed within a composite circuit element 260, a cluster 200, and throughout the matrix hierarchy. In addition, in step 520, a master controller is determined, which may be one selected SME 290 or a plurality of SMEs 290 operating as a master controller, or may be one or more additional controllers 175 or other, off-chip controllers, processors, or state machines. In an exemplary embodiment, a master controller is determined as a SME 290 having the lowest address (at the time).

The operating system, through one or more state machine elements 290 (or controllers 175), potentially with user input, then determines or selects which programs, algorithms or functions are to be performed, step 525, such as selecting the ABS, traction control, video and navigational programs previously discussed. Next, in step 530, the operating system binds the symbolic netlist(s) of the selected programs to the available resources (determined in step 515), by assigning a task and action(s) (or instruction(s)) to a selected composite circuit element 260 (as one or more contexts), by linking the inputs of the selected composite circuit element 260 to the other corresponding composite circuit elements 260 which are its data sources, to provide its input data (which also correspondingly links these data source outputs to the inputs of the selected composite circuit element 260 as data destinations), and/or by linking the outputs of the selected composite circuit element 260 (as data sources) to the other corresponding composite circuit elements 260 which are its data destinations, to utilize the data produced by the selected composite circuit elements 260 (which also correspondingly links the inputs of these data destinations to the outputs of the selected composite circuit element 260 (as a data source)).

Once all tasks and actions (or instructions) are bound (assigned and linked), the apparatus 100 commences execution or running of the corresponding programs or operations, step 535, such as operating the ABS and traction control systems, playing a video for passengers, and providing a real-time navigational display for the driver. The binding (assigning and linking) process is discussed in detail below with reference to FIG. 14. The control of the program (or operational) execution process in each composite circuit element 260 is discussed in greater detail below with reference to FIG. 16.

The operating system may also determine that new or different functionality is needed, step 540, such as when a user or operator selects an additional program, or circumstances require a change in functionality, such as through a sensor detecting a particular condition. For example, in a vehicle environment, a sensor may detect a change in driving or road conditions, and adjust various programs accordingly. When new or different functionality is needed in step 540, the method rebinds (re-assigns and re-links) the affected tasks and actions (or instructions), step 545, and the apparatus 100 continues to operate with these various changes. The tasks and actions (or instructions) may be moved to new locations, or existing or new tasks and actions (or instructions) may be loaded, assigned and bound. The operating system may also bind or re-bind an entire program or functionality de novo. This re-binding step 545 may also include unbinding, that is, completely removing an assigned functionality, such as by deleting its corresponding contexts from memory. Such unbinding may occur, for example, when the apparatus 100 is already at capacity, and room must be created for the new or different functionality. Such unbinding was illustrated in FIG. 1, when video functioning was removed as the apparatus 100 increasingly lost capacity through IC damage.

The apparatus 100, through one or more state machine elements 290 (or controllers 175) performing the operating system (or as part of a built-in self test ("BIST")), periodically performs a limited or full self-test, step 550, to detect any changes in availability of resources, step 555. For example, the self-test may reveal that a BREO-type circuit element 270 is no longer functioning properly, and therefore should no longer be available for use within the apparatus 100. When such damage or loss of functionality occurs in step 555, the operating system (through the SMEs 290 or controllers 175) correspondingly modifies the map or list of available resources, step 560, rebinds the affected tasks and actions (or instructions) using the modified list or map, step 565, and the apparatus 100 continues to operate with these various changes.

When no such damage or loss of functionality has occurred in step 555, or following step 565, the method proceeds to step 570. In step 570, the apparatus 100 may continue operating, returning to step 535. In the event that operations are to cease in step 570, such as by the user selecting to turn off the device having the apparatus 100, the apparatus 100 may shut down or power off, return step 575.

Not separately illustrated in FIG. 12, in another exemplary embodiment, the plurality of composite circuit elements 260 may be implemented or adapted to store periodically a then current state, such as a "snapshot" of its current operations. Subsequently, in response to a detected fault, the composite circuit elements 260 are adapted to retrieve the stored state and recommence operation using the stored state.

D. Symbolic Netlist Assignment and Run-Time Binding

With this background in mind, the run-time binding process may now be explained. As indicated above, the inventive architecture in conjunction with the run-time binding of a symbolic netlist (or other program compilation) enable the self-healing and resiliency of the apparatus 100. More particularly, when any of the composite circuit elements 260, SMEs 290, first communication elements 250, full interconnect element(s) 275 or distributed full interconnect element(s) 295, other cluster 200 components, or routing or other communications elements (190, 210), either do not perform properly initially (as determined in step 515 during testing portions of the boot process) or during later operation (as determined during self-test or as determined by other components, steps 550, 555), they are not placed on or are removed from the map or list of available resources, respectively. If not performing properly initially, the affected component is never assigned any functionality in step 530. If the affected component was originally functioning and is no longer (step 555), it is removed from the list or map of available resources, and its assigned functionality is moved or loaded to another available component and re-routed, separately or as part of the rebinding of the corresponding tasks or instructions of step 565. If it has been determined that the data has been corrupted, the controlling task is notified so that the appropriate action can be taken. This binding process is explained in detail below.

1. Resource Availability

Figure 13:
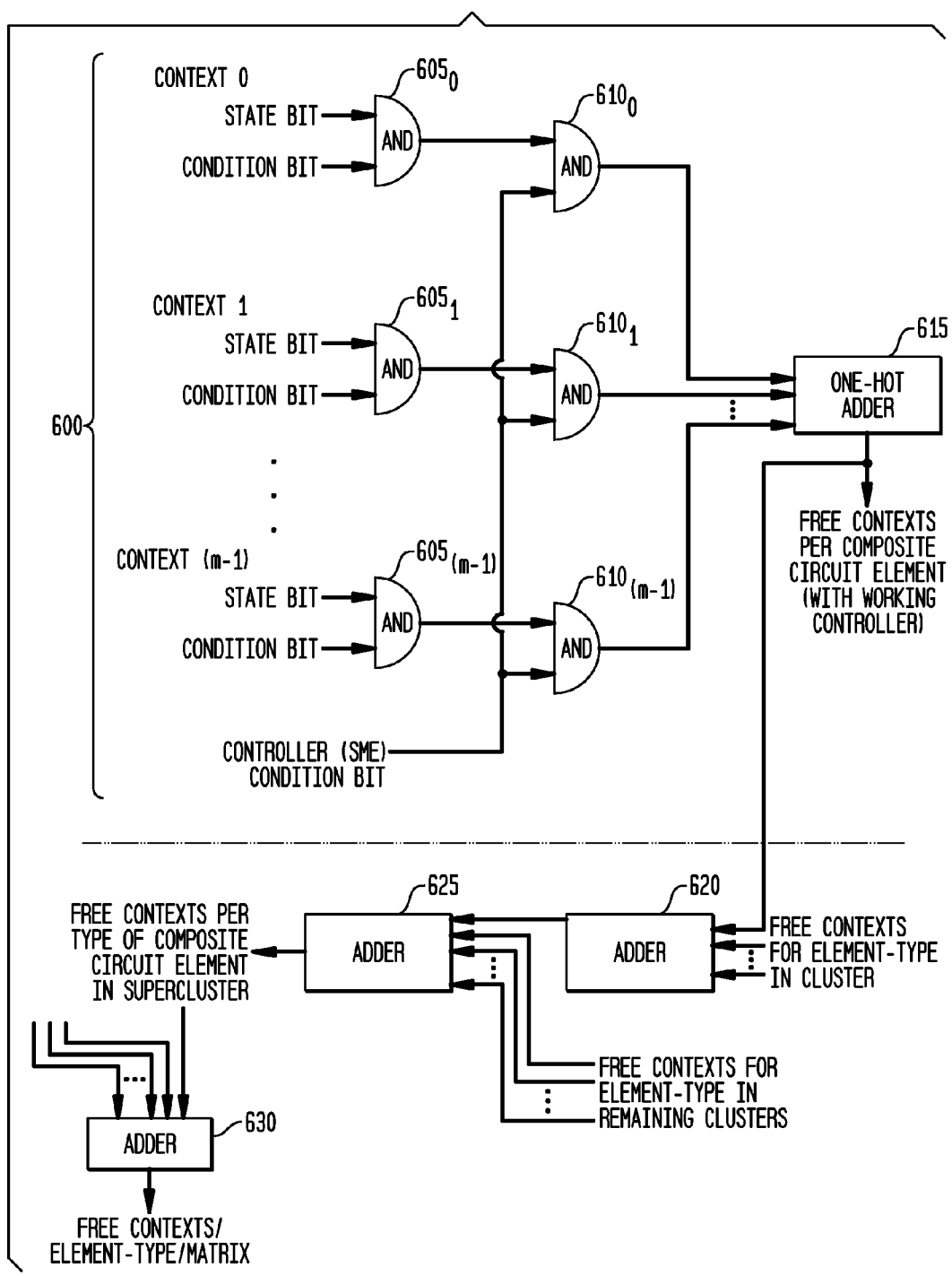
FIG. 13 is a block diagram illustrating exemplary combinational logic circuitry for context availability determination within an exemplary apparatus in accordance with the teachings of the present invention.

FIG. 13 is a block diagram illustrating exemplary combinational logic circuitry 600 for context availability determination within an exemplary apparatus 100 in accordance with the teachings of the present invention. Such circuitry 600 may be included within each composite circuit element 260, such as within a circuit element 270, an element controller 325, within a SME 290, or as separate combinational logic (not separately illustrated in FIG. 8). As mentioned above, the number of available contexts for each type of composite circuit element 260 is determined for use in binding (or re-binding) a program or algorithm for performance within the apparatus 100. Such determination may be made by one or more SMEs 290, controllers (or other processors) 175, or as illustrated in FIG. 13, dedicated combinational logic circuitry 600.

Referring to FIG. 13, as part of the information stored in the memory 330 within each composite circuit element 260 is a state bit and a first condition bit, for each context. The state bit indicates whether the context has been assigned or allocated to an action (or instruction) or not, and is therefore free or available to be assigned (logic high or one), or is not free and available to be assigned (logic low or zero). Alternatively, the state may be determined by examining the memory 330 to determine whether the action ID and task ID fields are zero or non-zero for the selected context, indicating available (no assigned or allocated action ID and task ID) or unavailable (already assigned or allocated action ID and task ID), and then inverted to be utilized as the state bit in FIG. 13. The first condition bit indicates whether the composite circuit element 260 is operational (logic high or one) or non-operational (logic low or zero), as determined from the various exemplary self-test processes discussed above. For each context (of "m" contexts), a first AND operation is performed on the corresponding state bit and first condition bit, via AND gates 605 (illustrated as the plurality of AND gates $605_0$, $605_1$, through $605_{(m-1)}$, such that the result of the AND operation indicates that the context is both available and that the composite circuit element 260 is working properly (logic high or one), or that either the context is not available or that the composite circuit element 260 is not working properly (logic low or zero).

A second, controller (SME 290) condition bit is utilized to indicate whether the SME 290 (within the cluster 200) is operational (logic high or one) or non-operational (logic low or zero), also as determined from the various exemplary self-test processes discussed above, and may be stored in any of the various memories within the composite circuit element 260 or cluster 200. A second AND operation is performed using this first AND result (state and first condition bit) and the second, controller condition bit (via the plurality of AND gates $610_0$, $610_1$, through $610_{(m-1)}$), such that the result of the second AND operation indicates that the context is both available and that both the composite circuit element 260 and SME 290 are working properly (logic high or one), or that the context is not available, that the composite circuit element 260 is not working properly, or that the SME 290 is not working properly (logic low or zero). The first and second AND operations also may be performed as a single, combined AND operation having at least three inputs (state bit, first condition bit, and second condition bit). The results of the second AND operation for each context may be added, such as by using a "one-hot" adder 615 (or a SME 290 or other controller), providing the number of free contexts per composite circuit element 260 (with a working SME 290).

As illustrated, this process may continue up the matrix hierarchy, with the number of free contexts per composite circuit element 260 added together for each type of composite circuit element 260 within a cluster 200, then added together for each type of composite circuit element 260 within a supercluster 185, then added together for each type of composite circuit element 260 within a matrix 150, and then added together for each type of composite circuit element 260 within the apparatus 100. These additional ADD operations may be performed using dedicated ADDERs (e.g., 620, 625, 630) or by using composite circuit elements 260 configured for ADD operations and under the control of their corresponding SMEs 290. As a result, availability counts for each type of composite circuit element 260 may be determined and maintained at each level, namely, at a cluster 200 level, a supercluster 185 level, a matrix 150 level, and an apparatus level.

Such counts at these various levels are particularly useful for determining whether a supercluster 185 or cluster 200 has availability to satisfy a regional constraint, such as when a number of operations must be performed with timing constraints using certain types of composite circuit elements 260 within a cluster 200 or supercluster 185. In addition, using such combinational logic circuitry, composite circuit element 260 availability is determined and maintained rapidly, concurrently and in parallel for all clusters 200, with delays only from several AND and ADD operations (e.g., two AND delays and four ADD delays total for an entire matrix 150).

As an alternative for availability determination, the SME 290 may be utilized to poll or examine the various registers of all of the memories 330 of the corresponding composite circuit elements 260 within the cluster 200, and add up the results by type of composite circuit element 260 for each cluster, with one or more selected SMEs 290 then adding up results for each supercluster 185 and matrix 150. Such availability determination may be top-down in the matrix hierarchy, such as initiated by a master controller (which may be a designated SME 290 or a controller 175), or bottom-up in the matrix hierarchy, such as illustrated in FIG. 13 or as provided by each of the SMEs 290 within each cluster 200. It will be apparent to those of skill in the electronic arts that there are innumerable ways of providing this availability determination, using combinational, conditional or control logic, all of which are considered equivalent and within the scope of the present invention.

2. Symbolic Netlist Assignment

Figure 14A:
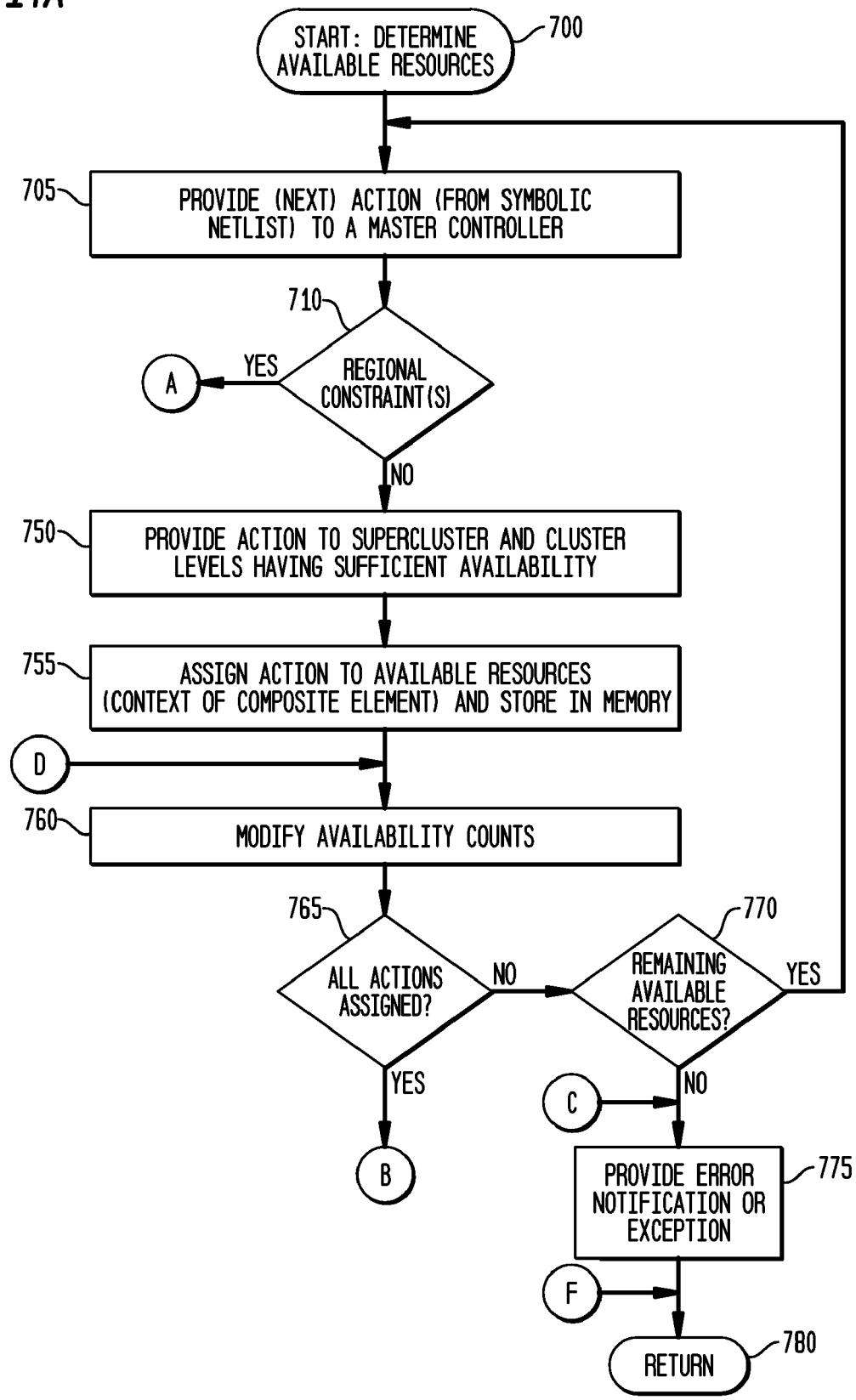
Figure 14B:
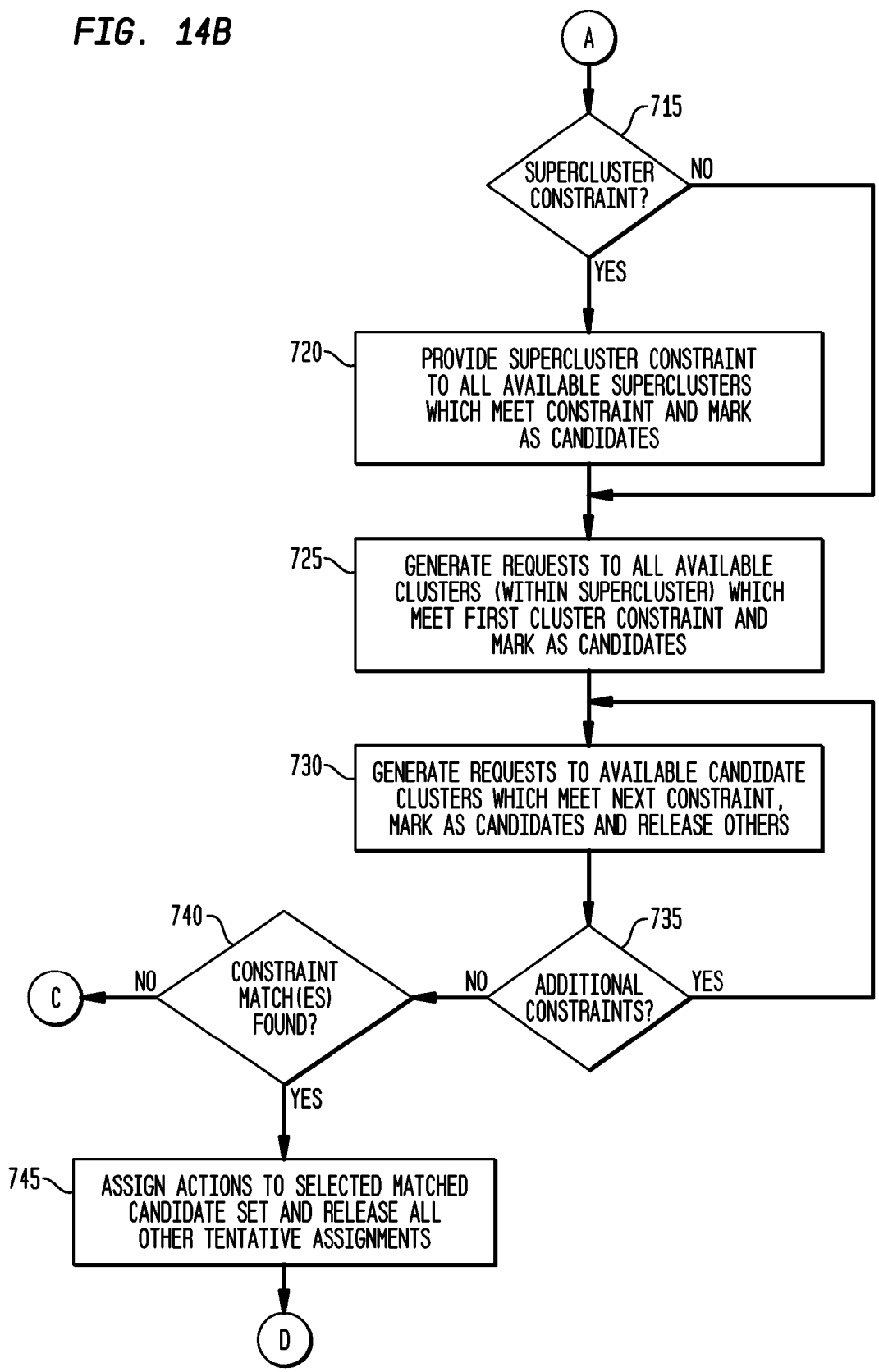
Figure 14C:
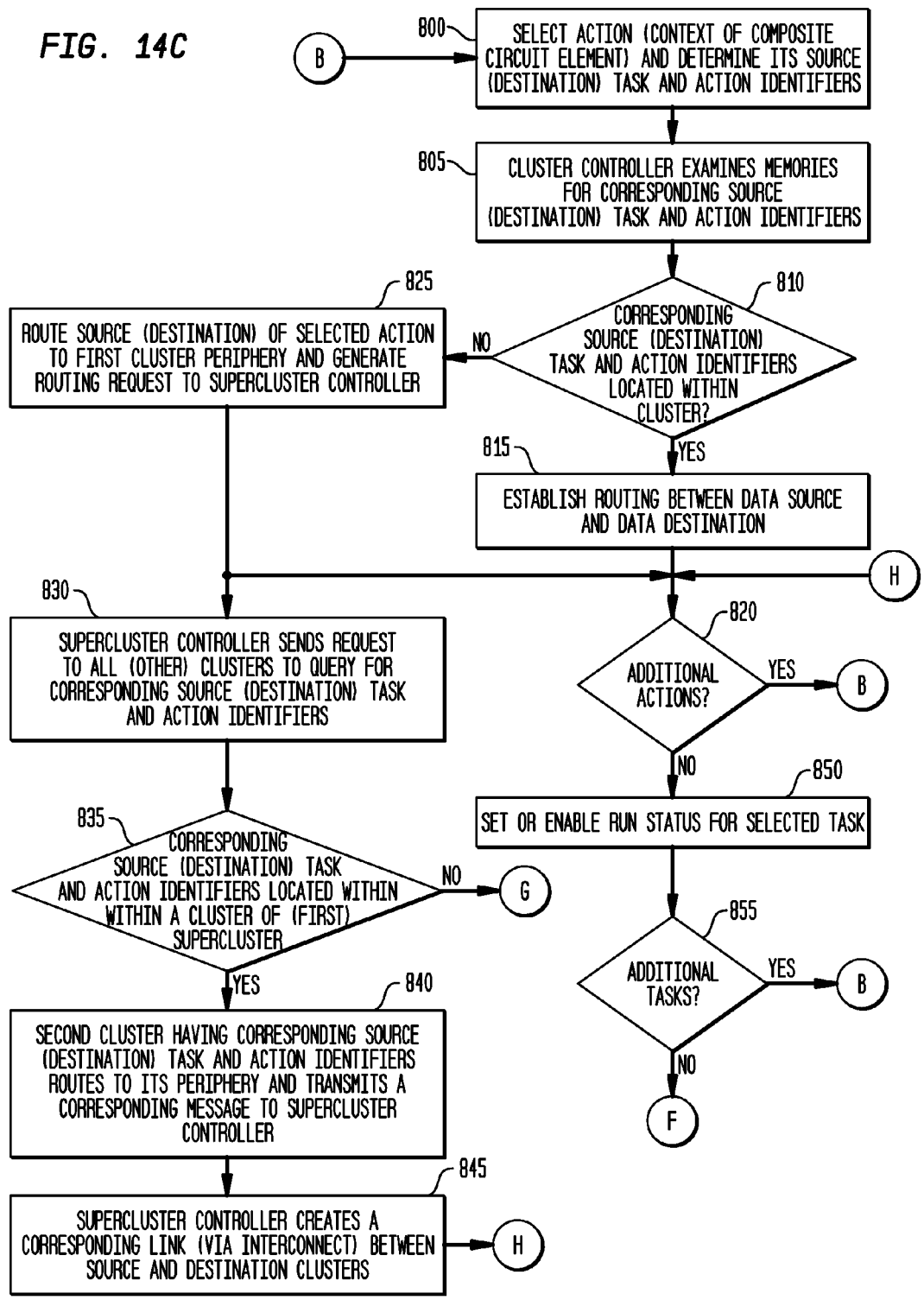

FIG. 14, divided into FIGS. 14A, 14B, 14C and 14D, is a flow diagram illustrating an exemplary algorithm or symbolic netlist run-time binding process in accordance with the teachings of the present invention, and further illustrates significant functionality associated with the state machine elements 290 distributed throughout the apparatus 100. Alternatively, this functionality could be performed by one or more additional controllers 175, such as a controller 175 designated as a master controller for the apparatus 100. In addition to the binding process illustrated, those of skill in the art will recognize that numerous variations of the methodology are available, and are considered equivalent and within the scope of the present invention. At least one such variation is also discussed below.

As mentioned above, the apparatus 100 performs a run-time binding operation of an algorithm provided as a symbolic netlist, which may be considered similar to a place and route operation for programmable resources with programmable routing. In this case, the programmable resources themselves have been placed on the IC, and the binding process then assigns an action (or instruction) (as part of a task) to one or more contexts of one or more available resources, and provides the corresponding routing or linkage of inputs and outputs. In contrast with prior art place and route methodologies, which may take hours or days to run, the methodology of the invention operates quite rapidly, on the scale of microseconds or milliseconds to seconds.

Referring to FIG. 14A (FIG. 14A), the method begins, start step 700, with the determination and/or maintenance of the availability counts for each type of composite circuit element 260, preferably at the cluster, supercluster, and matrix levels, as discussed above. The first (or next) action (i.e., function or instruction), as symbolic netlist elements, are provided to a master controller, step 705, which may be one or more designated SMEs 290 or one or more controllers 175, for example. The designated SME 290 or controller 175 then determines whether the action (function or instruction) includes a regional or proximity constraint, step 710, and if so, proceeds to step 715. When the action (or instruction) does not include a regional constraint in step 710, the action (or instruction) is provided to a supercluster and a cluster level having sufficient availability of resources for the instruction, step 750, such as a sufficient number of available contexts for the one or more types of composite circuit elements 260 provided in the symbolic netlist.

The SME(s) 290 of the available cluster(s) 200 assign(s) the action (or instruction) to one or more available composite circuit elements 260 in the cluster(s) 200, step 755, by storing the corresponding information (configuration, the task ID, the action ID, and the source (or destination) task ID and action ID) in the corresponding memory 330 of each such composite circuit element 260, or stored in a memory composite circuit element 260, the second memory element 255, or other memory accessible to the SME 290 and the composite circuit element 260. The amount and location of the stored information may vary among selected embodiments. In an exemplary embodiment, the action (or instruction) is stored locally in the memory 330 (or otherwise within the cluster 200) as a configuration, task ID, action ID, with corresponding linkage information (either data source for inputs or data destination for outputs, also by task ID and action ID). Following the assignment, the availability count is modified, step 760, such as automatically modified as described above for FIG. 13, or by decrementing a count maintained in a register when, for example, the various counts are maintained by a designated SME 290 or controller 175.

The method then determines whether all actions (or instructions) have been assigned, step 765. When there are actions (or instructions) remaining to be assigned, the method then determines whether there are available resources remaining, step 770. When there are available resources remaining in step 770, the method returns to step 705 and iterates, selecting and assigning the next action (or instruction). When there are no more actions (or instructions) remaining for assignment, the method proceeds to step 800 to commence with routing (i.e., linking) all of the assigned actions (or instructions).

When there are actions (or instructions) remaining to be assigned in step 765, but there are no more available resources in step 770, indicating that the selected algorithm may not be able to operate on the apparatus 100 as currently configured (or available), an error or exception message is generated, step 775, and the method may end, return step 780, as the symbolic netlist of the selected program cannot be currently assigned. In that event, there are many potential courses of action. For example, the designated SME 290 or controller 175 may delete lower priority programs or operations which are consuming or utilizing resources, to make room for the selected program or operations and allow the selected program to execute on the apparatus 100. In other instances, the designated SME 290 or controller 175 may select another version of the program which may be able to be assigned without removing such other programs. In other instances, it may indicate that a larger apparatus 100 with more resources is needed for the selected application.

When the selected action (or instruction) includes a regional constraint in step 710, the method proceeds to step 715, as illustrated in FIG. 14B. Such a regional constraint may take the form of, for example:

---
region 3 supercluster
    region 1 cluster actions I1, I2
        I1
        I2
    end region
    region 2 cluster actions I3, I4
        I3
        I4
    end region
end region

--- in which a supercluster regional (proximity) constraint incorporates two cluster-level regional constraints, each of which has included actions (or instructions) subject to the constraint ("constrained actions"). As mentioned above, zone 201 constraints may also be utilized. As illustrated in this example, actions (or instructions) I1 and I2 (as symbolic netlist elements) must be assigned within the same cluster 200, and actions (or instructions) I3 and I4 (as symbolic netlist elements) must be assigned within the same cluster 200 (as Region 2, which may be the same or a different cluster than the Region 1 cluster of I1 and I2). Both clusters 200, however, must be in the same supercluster, as incorporated within the supercluster constraint (region 3).

In step 715, the designated SME 290 or controller 175 determines whether the constraint is a supercluster constraint, which would require the set of constrained actions to be assigned within the same supercluster 185. When the regional constraint is for a supercluster in step 715, the designated SME 290 or controller 175 provides the supercluster constraint to all available superclusters 185 which meet the availability requirements of the constraint, and temporarily designates or marks those one or more superclusters as candidates, step 720. Following step 720, or when the constraint is not a supercluster constraint in step 715, the constrained actions are provided to all available clusters 200 which meet the first cluster constraint (within one or more superclusters, if required by the previous constraint), such as the various clusters which meet the Region 1 constraint of the example, and those clusters 200 are temporarily designated as candidates, step 725. The next set of cluster-level constrained actions, if any, are provided to all available clusters 200 which meet the next cluster constraint (within one or more superclusters, if required by the previous constraint), such as the various clusters which meet the Region 2 constraint of the example, and those clusters 200 are also temporarily designated as candidates, step 730. In addition, those superclusters or clusters which had previously been candidates, but now do not contain sufficient available clusters to meet these additional constraints, may now be released and no longer designated as candidates for the regional constraints. While not separately illustrated, the same methodology may also be employed for any zone 201 constraints. When there are additional constraints to be processed, step 735, the method returns to step 730, and continues the temporary designation process.

When no further constraints need to be processed in step 735, the method determines whether one or more matches (supercluster and/or cluster levels) have been found, step 740. When one or more matches have been found in step 740, the designated SME 290 or controller 175 selects at least one such match, assigns the constrained actions (or instructions) to the selected candidate set, releases all the other tentative assignments, and proceeds to step 760, to modify the availability counts and continue the assignment process, as discussed above. When no match has been found in step 740, indicating that the selected algorithm may not be able to operate on the apparatus 100 as currently configured (or available), the method returns to step 775 and generates an error or exception message, and the method may end, return step 780, as the symbolic netlist of the selected program with the constraints cannot be currently assigned. As mentioned above, in that event, there are many potential courses of action. For example, the designated SME 290 or controller 175 may delete lower priority programs or operations or may utilize another version of the program which may be assigned more readily.

3. Run-Time Binding

When all actions (or instructions) have been assigned in step 765, the actions (or instructions) may be connected or routed, to establish all of the data communication paths which will be utilized during operation of the apparatus 100 to execute the selected program or algorithm. As indicated above, each action (or instruction) has input or output information stored symbolically with the configuration for the selected context of a selected composite circuit element 260. More specifically, the input or output information is stored effectively as pointers, with one task ID and action ID pointing to another task ID and action ID as either its data source (for input data) or data destination (to provide output data). Such information is stored symbolically or generically, because until the action (or instruction) has been assigned, the actual address for the data source or data destination is unknown. Provided that either data source information is utilized consistently, or data destination information is utilized consistently, only one such set of information is needed, although both can be utilized to potentially increase resiliency. In accordance with the exemplary embodiments, such data source or data destination information is utilized to connect the data inputs (for the input queues 320) of a composite circuit element 260, for each context, with the data outputs 375 (via output queues 315) of a context of another composite circuit element 260 (or the same composite circuit element 260, for a feedback configuration). This creates either direct data connections (circuit-switched within a cluster 200) or packet-routed (hybrid packet-routed and circuit switched between clusters) data connections for data flow and, in either case, data is provided without requiring intermediate or separate steps of data storage in a register and data fetching from a register. Depending on the selected embodiment, such as for a supercluster 185C and circuit cluster 200C, the data connections may all be circuit-switched, through the cluster queues 245A and corresponding full or distributed interconnect 275, 295.

Following step 765, the routing process begins, step 800, as illustrated in FIG. 14C. In the exemplary embodiment illustrated in FIG. 14C, the process is "bottom-up", beginning at the cluster 200 level (or zone 201 and cluster 200C levels) and proceeding to higher levels (supercluster and matrix levels) as needed. Not separately illustrated, the process may also be initiated from a "top-down" perspective, such as by the designated SME 290 or controller 175 transmitting a request to the SMEs 290 of the clusters 200 to initiate the routing process of step 800.

Referring to FIG. 14C, step 800, one or more SMEs 290 of the corresponding clusters 200 begin the routing process by selecting an action (or instruction) of a first context of a composite circuit element 260, and determining the source (or destination) task and action identifiers stored as part of the selected action (or instruction). In exemplary embodiments, this process may be performed by each SME 290 of each cluster 200 as a parallel process, resulting in a very highly efficient binding routing process. In other exemplary embodiments, if not every cluster 200 has a SME 290, then another SME 290 within the supercluster 185 may be utilized.

As indicated above, these source (or destination) task and action IDs, in selected embodiments, are stored in the memory 330 of the element interface and control 280 of the composite circuit element 260. In alternative embodiments, the source (or destination) task and action identifiers may be stored in other memory elements, such as a memory-type composite circuit element $260_M$, second memory element 255, or other memory elements which may be included within a cluster 200. To facilitate routing, the memory 330 (or other memory element) may be implemented as a content addressable memory ("CAM"), as mentioned above, or as any other type of memory. Consequently, in step 805, for routing at a first level of hierarchy, a SME 290 may examine all of the memories (330, 255, $260_M$, etc.) within its cluster 200 by these source (or destination) task and action identifiers of the first context (the composite circuit element 260 context to be routed) to find the corresponding action (or instruction) of another, second context which matches these source (or destination) task and action identifiers. When other forms of memory are utilized instead of a CAM, e.g., SDRAM, then the SME 290 may perform a search of the memory (330, 255, 260$_M$, or other memory storing the task ID and action ID), such as a binary search, to find the corresponding action (or instruction) of another, second context which matches these source (or destination) task and action identifiers.

When the matching action (or instruction) (having the corresponding task and action identifiers) of a second context of a composite circuit element 260 has been found within a memory (330, 255, 260$_M$, etc.), in step 810, the SME 290 then knows to route the selected, first context to this second context having the matching or corresponding action (or instruction). As a consequence, in step 815, when source task and action identifiers are stored, the SME 290 routes the input(s) of the first context (as a data destination) to the corresponding output of the second context (as a data source), and when destination task and action identifiers are stored, the SME 290 routes the output(s) of the first context (as a data source) to the corresponding input(s) of the second context (as a data destination). Within the cluster 200 or zone 201, the SME 290 establishes these internal cluster connections via the full interconnect element 275 or distributed full interconnect element 295. Following step 815, when there are additional actions (or instructions) to be routed in step 820, the method continues iteratively, returning to step 800, with a SME 290 or other controller selecting the next action (or instruction) to be routed.

When the matching action (or instruction) (having the corresponding task and action identifiers) of a second context of a composite circuit element 260 has not been found within a memory (330, 255, 260$_M$, etc.) of its cluster 200, in step 810, the SME 290 then knows that the corresponding data source or destination is not within its cluster 200 (referred to as a first cluster 200). As a consequence, in step 825, the SME 290 both: (1) routes the selected, first context to the periphery of the first cluster 200 (to one of the first communication elements 250 for data transmission via interconnect 155, through the full interconnect element 275, distributed full interconnect element 295, or the message manager 265, or otherwise directly to the first communication element 250); and (2) generates a routing request (query) to the supercluster-level controller (which may be a designated SME 290 or controller 175 having this assigned duty) to find a second context in another cluster 200 of its supercluster 185 which may have the matching or corresponding action (or instruction). From the perspective of the SME 290 of the first cluster 200, its routing of the first context is complete, and it may proceed with routing of other contexts (actions (or instructions)), if any, returning to step 820, with the supercluster controller (designated SME 290 or controller 175) then proceeding to step 830.

Having received a routing request (designating the second context), in step 830, the supercluster controller transmits a request or query to all (other) clusters 200 within its supercluster 185, for those SMEs 290 to determine whether the corresponding action (or instruction) is located in one of their memories (330, 255, 260$_M$, etc.), for routing at a second level of hierarchy. When one of these other clusters 200, as a second cluster 200, has the matching or corresponding action (or instruction) (i.e., has the source (or destination) task and action identifiers of the first context) as a second context of one of its composite circuit elements 260, step 835, this second cluster 200 then knows that this second context is the source or destination for data which is to be routed to or from another, first cluster 200. As a consequence, in step 840, the second SME 290 of the second cluster 200 routes this second context to the periphery of the second cluster 200 (to one of the first communication elements 250 for data transmission via interconnect 155, through the full interconnect element 275, distributed full interconnect element 295, the message manager 265, or otherwise directly to the first communication element 250), and transmits a corresponding message to the supercluster controller (designated SME 290 or controller 175), indicating or providing information that it has the second context having the matching or corresponding action (or instruction). The supercluster controller, in turn, creates a corresponding linkage between the first cluster 200 and the second cluster 200, for the corresponding contexts, step 845, such as by storing corresponding routing information in a second communication element 210, and the cluster-to-cluster routing is complete. From the perspective of the SME 290 of the second cluster 200, its routing is also complete, and it may proceed with routing of its other contexts (actions (or instructions)), if any, also returning to step 820.

While not separately illustrated, in another variation, such as for supercluster 185C, one or more of the SMEs 290 within the supercluster 185C may perform all such routing within a cluster 200C or within the entire supercluster 185C, all through the various cluster queues 245A. Referring to FIG. 18, a SME 290 may provide: (1) corresponding routing within a selected zone 201B, such as directly from $CE_4$ to $CE_5$, for example, via the full or distributed interconnect 275, 295; (2) corresponding routing within a selected circuit cluster 200C, such as directly from $CE_4$ to $CE_{12}$ via the full or distributed interconnects 275, 295 and cluster queue 245$A_{15}$; (3) corresponding routing to a selected adjacent circuit cluster 200C, such as directly from $CE_4$ to another composite circuit element 260 of another cluster 200C within the supercluster 185C via the full or distributed interconnects 275, 295, any intervening (zone to zone) cluster queues 245A, and then through a peripheral cluster queue 245A, such as 245$A_{10}$; (4) corresponding routing to a selected, non-adjacent circuit cluster 200C within the supercluster 185C, such as directly from $CE_4$ to another composite circuit element 260 of another cluster 200C via the full or distributed interconnects 275, 295, any intervening (zone to zone) cluster queues 245A, and typically a plurality of peripheral cluster queues 245A; and (5) corresponding routing to a circuit cluster 200C which is not within the supercluster 185C, via a message manager 265.

For example, when routed through any of the cluster queues 245A, any selected cluster queue 245A (with a corresponding selected context) is a data destination for a selected context of data producing composite circuit element 260, and is in turn a data source for either a selected context of a data consuming composite circuit element 260 or another selected context of a cluster queue 245A (such as for data routing through a plurality of cluster queues 245A, such as for data routing between clusters 200C, for example, using either source- or destination-based communication, as described herein).

In step 835, when none of these other clusters 200 within the selected, first supercluster 185 has the matching or corresponding action (or instruction) (with the source (or destination) task and action identifiers of the first context) in a second context of one of its composite circuit elements 260, the supercluster controller then knows that the corresponding data source or destination is not within its supercluster 185 (referred to as a first supercluster 185). As a consequence, in step 860 (illustrated in FIG. 14D), the first supercluster controller both: (1) routes the first context to the periphery of the first supercluster 185 (i.e., to one of the second communication elements 210 or to one of the message managers 265);

and (2) generates a routing request to the matrix-level controller (which also may be a designated SME 290 or controller 175 having this assigned duty) to find a second context in another supercluster 185 of its matrix 150 which may have the matching or corresponding action (or instruction), for routing at a third level of hierarchy. From the perspective of the designated SME 290 or controller 175 of the first supercluster 185, its routing is complete, and the method returns to step 820, to continue the routing process for other actions, as may be needed, and also proceeds to step 865.

Having received a routing request (designating the second context), in step 865, the matrix controller transmits a request or query to all (other) clusters 200 within its matrix 150, for those SMEs 290 to determine whether the corresponding action (or instruction) is located in one of their memories (330, 255, 260$_M$, etc.), for routing at this third level of hierarchy. This routing request may be transmitted directly to SMEs 290 of the clusters 200, or may be transmitted via supercluster controllers. When one of these other clusters 200, as a second cluster 200, has the matching or corresponding action (or instruction) (i.e., has the source (or destination) task and action identifiers of the first context) as a second context of one of its composite circuit elements 260, step 870, this second cluster 200 then knows that this second context is the source or destination for data which is to be routed to or from another, first cluster 200. As a consequence, in step 875, the second SME 290 of the second cluster 200 routes this second context to the periphery of the second cluster 200 (to one of the first communication elements 250 for data transmission via interconnect 155, through the full interconnect element 275, distributed full interconnect element 295, the message manager 265, or otherwise directly to the first communication element 250), and transmits a corresponding message to the matrix controller (designated SME 290 or controller 175), indicating or providing information that it has the second context having the matching or corresponding action (or instruction). The matrix controller, in turn, creates a corresponding linkage between the first cluster 200 and the second cluster 200, for the corresponding contexts, step 880, such as by storing corresponding routing information in a third communication element 190 and a second communication element 210, and the supercluster-to-supercluster routing is complete. From the perspective of the SME 290 of the second cluster 200, its routing is also complete, and it may proceed with routing of its other contexts (actions (or instructions)), if any, also returning to step 820.

In step 870, when none of these other clusters 200 within the selected, first matrix 150 has the matching or corresponding action (or instruction) (with the source (or destination) task and action identifiers of the first context) in a second context of one of its composite circuit elements 260, the matrix controller then knows that the corresponding data source or destination is not within the first matrix 150. As a consequence, in step 885, the first matrix 150 both: (1) routes the first context to the periphery of the first matrix 150 (i.e., to one of the third communication elements 190); and (2) generates a routing request to the other matrix-level controllers (which also may be a designated SME 290 or controller 175 having this assigned duty) to find a second context in another matrix 150 of the device 100 which may have the matching or corresponding action (or instruction), for routing at a fourth level of hierarchy. From the perspective of the designated SME 290 or controller 175 of the first matrix 150, its routing is complete, and the method returns both to step 820, to continue the routing process for other actions, as may be needed, and the method iteratively repeats steps 865-880, as needed, at the apparatus 100 level.

As all actions (or instructions) had been assigned previously, the matching or corresponding action (or instruction) is in a second context of a composite circuit element 260 in a cluster 200 of a supercluster 185 of one of the matrices 150, and the method searches up to the matrix or apparatus level, as needed, with those corresponding matrix- or apparatus-level controllers (designated SME 290 or controller 175) routing to their corresponding peripheries (e.g., third communication elements 190 and any intervening second communication elements 210) using interconnect 155 and transmitting queries to their corresponding lower-level superclusters 185 and clusters 200.

As a result, all actions (or instructions) become routed, connecting all data sources or data destinations with their corresponding data destinations or data sources, respectively, either within the same cluster 200 (step 815), or between clusters 200 (steps 825, 840, and 845) which are within the same supercluster 185, or within the same matrix 150 (steps 875 and 880), or just within the apparatus 100. When all actions (or instructions) have been routed in step 820, the designated SME 290 or controller 175 sets or enables the run status for the particular task ID, step 850. When there are additional tasks of a program or algorithm which have actions remaining to be routed, step 855, the method continues, returning to step 800, and when there are no further tasks having actions to be routed, the method may end, return step 780. It should also be noted that step 850, which sets or enables the run status for the particular task, may also be performed following step 855, when all of tasks have been routed.

The run status, as discussed below, is a field utilized in the configuration word for a context (stored in memory 330) and utilized by the element controller 325 to determine whether the circuit element 270 should execute a selected context (i.e., perform the corresponding action). In this case, it indicates that the task has been fully configured, with all actions (or instructions) assigned and routed, such that it may be ready to execute, provided that other conditions are also met, as discussed below. The run status may also be utilized to start or stop selected tasks, or to purge a selected task, such as to load a new task in its place.

In addition, it will be apparent to those of skill in the electronic arts that a number of variations of the methodology of FIG. 14 may be implemented equivalently and are within the scope of the present invention. For example, in the event that the actions (or instructions) are not stored locally in a memory 330, or in a memory composite element 260, or in second memory element 255, but are stored centrally in a separate memory, a top-down approach may be utilized. Continuing with the example, a top-level controller such as a matrix-level controller (designated SME 290 or controller 175) may initiate the routing process, examining the stored and linked actions (or instructions), determining the routing within and between the various clusters, and passing the various configurations (as contexts) to the affected composite circuit elements 260. As another variation, the top-level controller such as a matrix-level controller (designated SME 290 or controller 175) may simply transmit the corresponding actions (or instructions) to the clusters 200, which then initiate the routing process as described above with reference to FIGS. 14C and 14D.

Also, while one or more controllers 175 may be utilized to implement the assignment and routing processes, it is also apparent that the use of a designated SME 290 is a more robust and resilient solution. In these circumstances, any of the plurality of SMEs 290 (of the corresponding plurality of clusters 200) may perform the various roles of supercluster 185 controller, matrix 150 controller, or apparatus 100 controller. In the event of harm or damage to a given SME 290, innumerable other SMEs 290 are available to assume any of these roles.

Significantly, the time involved for this assignment and routing process is linear with respect to the number of actions (or instructions) "k", and proceeds quite rapidly, as it is performed concurrently in a massively parallel process within each cluster 200. For example, depending upon the number of cluster-, supercluster- and matrix-levels "n" involved, the worst case amount of time per context (or instruction) is typically 3n+1 or 4n+1 clock or computation cycles, for messages to be transmitted and routing to be completed to the corresponding peripheries of each level. This is in sharp contrast with prior art routing methodologies in which the routing time, at a minimum, is a function of $k^2$ and, if optimized, is non-deterministic and has an unpredictable routing time.

Another advantage of this assignment and binding process of the present invention is the ability to assign and route tasks and actions (or instructions) to a plurality of heterogeneous clusters 200. More particularly, clusters 200 are not required to be the same, and may be quite different, with different mixes of types of composite circuit elements 260, without impacting the ability to program the resulting device. For example, any cluster 200 with many multiplier-type composite circuit elements 260 will simply have more availability for assignment of multiplication operations, such that those types of actions (or instructions) will automatically gravitate to those types of clusters 200. In addition, the assignment and binding time would be the same for both homogeneous or heterogeneous clusters 200.

As discussed above with reference to FIG. 1, in the event of damage to or failure of one or more components within a cluster 200, such as a composite circuit element 260 or SME 290, the cluster 200 or the individual component may be designated or marked as unavailable. Under these circumstances, any tasks and/or actions (or instructions) assigned to an affected composite circuit element 260 should be placed with one or more other composite circuit elements 260, and this may be performed in a wide variety of ways.

FIG. 15 is a flow diagram illustrating a first exemplary re-assignment and re-binding process in accordance with the teachings of the present invention. In this first approach, starting with step 900, such as due to a failure indication during self-testing, one or more SMEs 290 (from within the same cluster 200 if unaffected by the damage or failure, or from another cluster 200) marks or designates the affected composite circuit element 260 as unavailable, step 905, and directs the element controller 325 of the affected composite circuit element 260 to stop executing all contexts, step 910, typically utilizing the run status bit. The SME 290 would also transmit a message to the linked data source composite circuit elements 260, to direct those composite circuit element(s) 260 to stop producing data and transferring it to the affected composite circuit element 260, step 915. The SME 290 then determines which (if any) other composite circuit elements 260 are available to take over the affected functionality (i.e., the functionality which had been performed by the affected and now unavailable composite circuit element 260), and copies the contexts stored in the memory 330 of the affected composite circuit element 260 to one or more memories 330 of the available composite circuit element(s) 260 of the same type which have available contexts, step 920. In an exemplary embodiment, the SME 290 may store and maintain a transformation table, which indicates which composite circuit elements 260 have availability and have the requisite type of circuit element 270 for such a transfer of functionality. The SME 290 may also copy the contents of the associated input queues 320 to the input queues 320 of the available composite circuit elements 260, step 925; alternatively, for certain types of real-time data, the input data may be discarded or, equivalently, allowed to remain in the associated input queues, with operations resuming at the available composite circuit element(s) 260 using newly produced data.

The SME 290 then re-routes the connections to and from the available composite circuit elements 260, step 930, such as by doing source (or destination) task and action identifier searches as discussed above and, in addition, if both source and destination task and action identifier information is not stored, performing a search for the affected actions (or instructions) in other memories 330 of other composite circuit elements 260, to determine the corresponding data destinations (or sources) to complete the routing. Other routing steps as discussed above also may be utilized as needed (e.g., for routing between clusters 200). In step 935, the SME 290 then resets the corresponding run status bits of the transferred contexts, to re-enable the execution of the affected actions (or instructions) by the available composite circuit element(s) 260, and the re-assignment and re-binding process may end, return step 940.

In a second approach, the task may be re-assigned and re-bound (e.g., as illustrated in FIGS. 12-14) and, given the affected components are no longer available, no actions (or instructions) will be assigned to them. This approach also has the advantage of preserving any locality constraints, as such constraints will be included within the task actions (or instructions). In addition, as the duration of the assignment and binding process is linear with respect to the number of actions (or instructions), this re-assignment and re-binding process proceeds rapidly, with minimal disruption, particularly when the number of affected actions (or instructions) is comparatively small. As part of this process, one of the designated SMEs 290 may also direct the element controller 325 of the affected composite circuit element 260 to stop executing all contexts, transmit a message to the linked data source composite circuit element(s) 260 to direct the source composite circuit element(s) 260 to stop producing data and transferring it to the affected composite circuit element 260, copy the contents of the associated input queues 320 to the newly assigned, available composite circuit elements 260, and reset the run status bits for the transferred contexts of the available composite circuit elements 260.

As a consequence, a program or algorithm that has been compiled as a symbolic netlist for the apparatus 100 has been assigned and routed within the apparatus 100, creating all of the composite circuit element 260 configurations (stored as contexts) and data path connections (via full interconnect element 275, distributed full interconnect element 295, or interconnect 155). While the apparatus 100 has been designed to enable such assignment and routing in real time, it is not required to be performed in real-time and may be performed in advance, with all such assignment and routing within the scope of the present invention. With this background, the operation of and control of execution within the apparatus 100 may now be explained.

E. Apparatus Operation and Control of Execution

FIG. 16 is a diagram illustrating an exemplary configuration and control word 1000 in accordance with the teachings of the present invention. As illustrated in FIG. 16, the exemplary configuration word 1000 is comprised of a plurality of data fields, and comprises at least two or more of the following data fields, in any order: an element configuration field 1010; a task ID field 1015; an action ID field 1020; a destination (and/or source) address field 1025 (designating a destination (or source) composite circuit element 260, a port, and context); an optional "fork" field 1030; a significant inputs ("SI") field 1035; a significant outputs ("SO") field 1040; an optional cycles ("CY") field 1045; a run status field 1050; an optional priority field 1055; an optional state ready field 1060; an optional next field 1065; an optional last context field 1070; an optional interrupts field 1075; an optional single-step field 1080; and an optional constant mode field 1085. A corresponding configuration and control word 1000 it utilized for each context of the composite circuit element 260. It will be apparent to those of skill in the electronic arts that additional or fewer fields may be utilized, depending upon the applications and objectives of the selected apparatus 100 and any incorporated system, and all such variations are within the scope of the present invention.

A plurality of configuration words, one for each context, are utilized by the element controller 325 to control the configuration and execution of a configurable element 270. Each configuration word is indexed by the context number. The one or more configuration bits which control how the configurable element 270 is to be configured or how data is to be interpreted is or are stored in element configuration field 1010. Similarly, the assigned and routed (bound) actions (or instructions) are stored as the corresponding task ID, in field 1015, and the action ID in field 1020.

The data output and/or data input locations, as bound destination (and/or source) addresses, are stored in field 1025. Alternatively, the data input and/or data output pointers (as source/destination task IDs and action IDs) may be stored, depending upon the methodology implemented for potential re-routing. For example, when an entire task is re-assigned and re-bound de novo, new routing information will be generated, rather than utilizing the previously stored source and destination information. The remaining control fields are utilized to control whether and when a given context is executed (for a corresponding action to be performed by the circuit element 270), how interrupts are serviced by the SME 290, and how output data is provided to one or more destination addresses.

Figure 17:
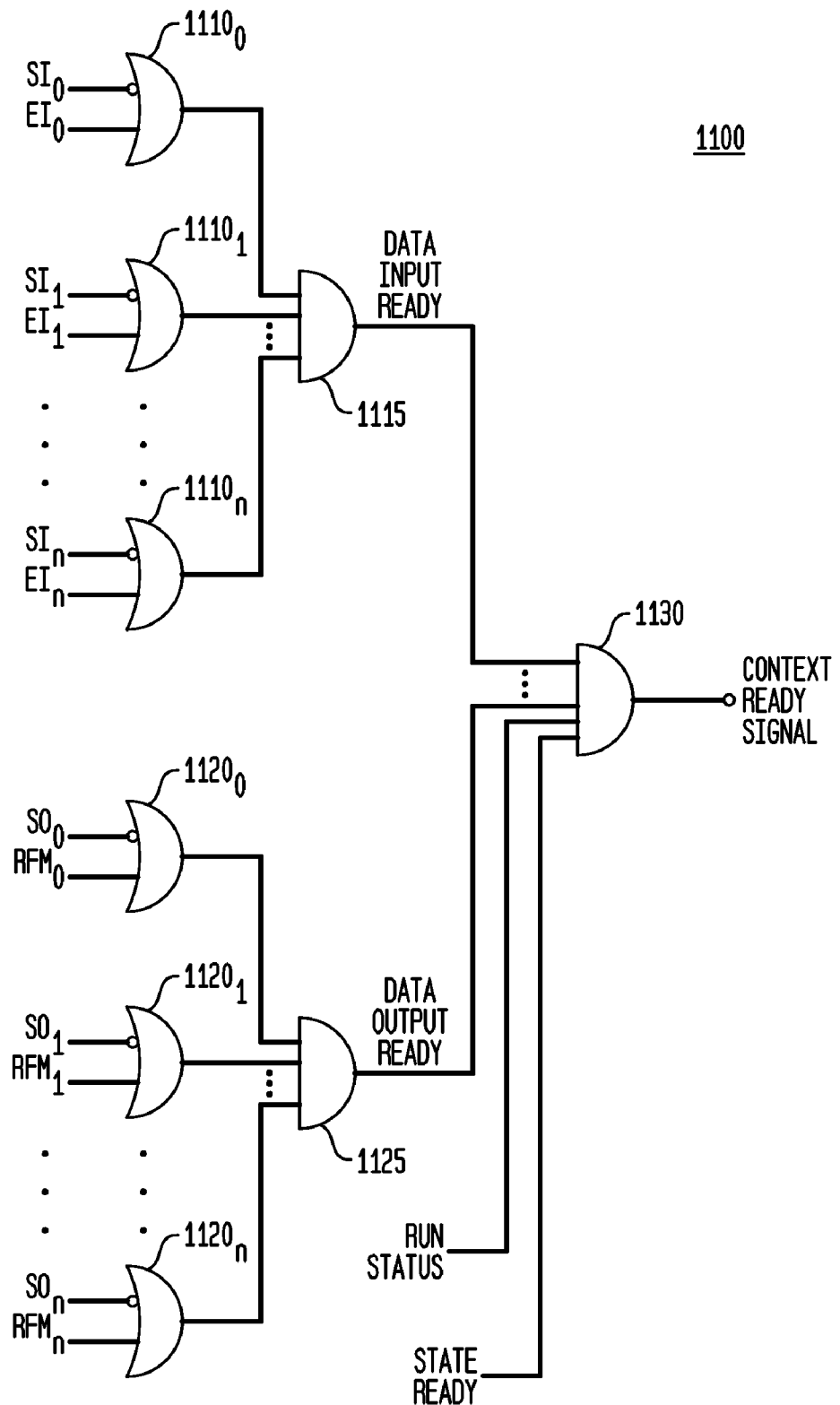
FIG. 17 is a block diagram illustrating exemplary combinational logic circuitry for context readiness determination within an exemplary apparatus in accordance with the teachings of the present invention.

The element controller 325, in exemplary embodiments, comprises combinational logic gates or elements, such as AND, OR and INVERTER gates, which provide a result (a given context executes or does not execute), based upon the values of the bits stored in the various fields (e.g., 1035, 1040, 1050, 1060) of the exemplary configuration and control word 1000. FIG. 17 is a block diagram illustrating exemplary combinational logic circuitry 1100 for context readiness determination within an exemplary apparatus in accordance with the teachings of the present invention.

As mentioned above, in a data flow environment, a context (task) may execute when it has sufficient input data and a sufficiently free or available destination for the resulting output data. As there are multiple inputs and corresponding multiple input queues 320 into the configurable element 270, the significant input (SI) bits (1035) designate which of those inputs are to be utilized in the selected context. In addition, the input queues 320 are adapted to provide a first signal, referred to as "enough input" ("EI"), indicating that there is sufficient data in the corresponding input queues 320. For example, in the element controller 325, each of the SI bits are inverted, and each of the inverted SI bits and its corresponding EI signal are ORed (OR gates $1110_0$ through $1110_n$), with all of their corresponding OR results (four results for four inputs) then ANDed together (AND gate 1115), to provide a "data input ready" signal, such that the AND result (data input ready) indicates that there is sufficient data available at the inputs which will be utilized by the selected context. More specifically, the data input ready signal is provided when (1) there is enough input data at the significant inputs, and (2) any other remaining input is not significant.

Similarly, as there are multiple output queues 315 and outputs 375 from the configurable element 270, the significant output (SO) bits (1040) designate which of those outputs and corresponding queues are to be utilized in the selected context. In addition, a second signal referred to as a "room for more" ("RFM") signal is provided to indicate that the corresponding destination(s) have sufficient space available for output data, either from the output queues 315 or from the input queues 320 of the data destination, or potentially from an output register tracking output data consumption. Also for example, in the element controller 325, the SO bits are inverted, and each of the inverted SO bits and its corresponding RFM signal are ORed (OR gates $1120_0$ through $1120_n$), with all of their corresponding OR results (two results for two outputs) then ANDed together (AND gate 1125), to provide a "data output ready" signal, such that the AND result (data output ready) indicates that there is sufficient memory space available for data output by the selected context, namely, space available in the corresponding output queues 315 (or destination input queues 320 (or other memory)). More specifically, the data output ready signal is provided when (1) there is room for output data at the significant outputs, and (2) any other remaining output is not significant.

These two results, the data input ready and data output ready then may be ANDed together (AND gate 1130), to provide an overall data "ready" status for a selected context. For example, the ready status is equal to a logic one when both the data input(s) and data output(s) are ready, and is zero otherwise. Alternatively, as illustrated in FIG. 17, the data input ready and data output ready results may be ANDed with other fields (state ready and run status, discussed below), to provide an overall indication that the context is ready for execution (a "context ready" signal).

The run status stored in field 1050 indicates whether the context has been enabled for execution, and may be set following data input-output routing in the binding process, or set (or reset) at other times by the SME 290. For example, the task (of which the selected context is a part) may still be in the process of being configured and routed for other configurable elements 270, and should not be enabled until such routing is complete. In other circumstances, one of the SMEs 290 may have halted a task, for possible resumption at another time, or may be in the process of deleting tasks. As a consequence, the element controller 325 will execute a context only when enabled, as indicated by the run status in field 1050.

The SME 290 may also utilize one or more state ready bits (stored in optional field 1060) to control context execution based on various conditions or other events. For example, when a condition has been met, such as an initialization, a selected context may need to be run next, and is designated with the state ready bits. All of these bits (run status, state ready, data output ready signal, data input ready signal) may be ANDed (AND gate 1130), and the result may also be stored within the run status field 1050 or another field accessible by the element controller 325. As a consequence, the conjunction of the state ready bits, the data input ready, data output ready and run status indicators, provide an indication to cause the element controller 325 to allow execution of the selected context. Alternatively, operations may be controlled through use of the run status (of field 1050), without the state ready bits, allowing the SME 290 to simply designate whether the context is or is not enabled for execution.

The optional cycles field 1045 is utilized to designate the number of clock cycles required to execute the corresponding action. This field is utilized to avoid another, second context being executed while computations of a first context are still in progress.

The optional single-step field 1080 is utilized to provide for a context to execute just once, such as for results to be examined by the SME 290. Various testing contexts are often run in a single-step mode, with the SME 290 setting or clearing a single-step bit (e.g., for a test to be run at selected times, and to not be always available to run).

In a selected embodiment, the optional context field 1070 may be utilized as part of arbitration among potential execution of a plurality of contexts. When a context has been executed, the last context bit is set (and the last context bits of the other contexts are reset to zero). In the event of competing contexts which are ready for execution, the last context bit is utilized to determine if one of the contexts just executed, and if so, allows the other context to execute, to avoid one context from completely dominating execution in the configurable element 270. In addition, in the event of competing contexts which did not just execute, one or more optional priority bits (stored in field 1055) may be utilized to arbitrate and allow the higher priority context to execute first.

In an exemplary embodiment, the optional next indicator (stored in field 1065), also referred to as a "chain" indicator, is utilized to determine the next context to execute, and is particularly useful for controlling the sequence in which contexts are executed, i.e., chaining together a sequence of operations. In this embodiment, the element controller 325 can commence execution of the "chain lead" context (the first context of the chain, also as designated within field 1065), when the other conditions discussed above have been met. Thereafter, the element controller 325 will execute the next context in the sequence, as designated in the field 1065, also when the other conditions (e.g., EI, RFM, etc.) have been met, and otherwise will wait for the next context to become available. If the next context is the same as the current context, then execution of the sequence has been completed. This field 1065 may also include a designation as to whether the data input(s) will be consumed.

In another exemplary embodiment, when destination-based (rather than source-based) data transmission is utilized, the optional "fork" field 1030 is utilized for output replication, when the same output is to be provided (or replicated) to multiple destinations. Additional contexts are utilized to store these additional destinations. In this embodiment, the element controller 325 can commence execution of the "fork lead" context (the first context of the fork, also as designated within field 1030), when the other conditions discussed above have been met. Thereafter, when the one or more bits of the fork field 1030 indicate another context, the current output will be provided (copied sequentially) as the output for that context, avoiding a need to re-execute a context based on the same data to provide the same output, just to a different location. Other contexts which are not part of the "fork" sequence are not executed during this sequential output replication. If the next context is the same as the current context, then execution of the forking (output duplication) has been completed. When no fork is indicated in field 1030, the element controller 325 simply determines what other contexts may be ready for execution, and proceeds accordingly.

In a selected embodiment, an optional "interrupts" field 1075 may also be provided. This field may designate, as part of the configuration word 1000, the setting, masking, and detecting of interrupts, including when a context executes. These interrupts are serviced by the SME 290.

Also in a selected embodiment, an optional constant mode field 1085 may be utilized, to designate that one or more of the input data words is a constant. For such a constant, it is generally maintained (until changed), so the constant is not consumed during data operations. In this embodiment, selected bits of the constant mode field 1085 are also utilized to indicate the next data read location (e.g., which data word in a two word input queue 320), such as for toggling or switching between two or more constant values.

As a consequence, as discussed above, the element controller 325 may be implemented using a plurality of combinational logic gates, which evaluate the various fields of the configuration and control word 1000 (and other control signals) for each context. When the various fields and other signal indicate that a context is both ready and should be run, the element controller 325 loads the configuration of the context, and the corresponding task or action (or instruction) is executed.

In summary, the present invention provides resilient and adaptive integrated circuitry with self-healing capabilities. Numerous advantages of the exemplary embodiments are readily apparent. The IC architecture of the present invention is resilient, providing adaptation for manufacturing defects, flaws which may arise during usage of the IC, and adaptability for new features, services, algorithms, and other events. This IC architecture is self-healing, because in the event a portion of the IC is damaged or otherwise becomes unusable, another portion of the IC is effectively "recruited" or reassigned to take over and perform the functions of the damaged portion. The present invention allows a single component to be switched out, and does not have the fixed wiring of the prior art. In addition, as the functions are reassigned, new control and data pathways are also created, so that the transferred operations continue to perform seamlessly with other IC operations. Such adaptive resilience and self-healing may occur in real-time or near real-time, depending upon the selected embodiment. Such resiliency provides for a graceful degradation of performance in the event of damage to the IC, rather than a catastrophic failure, and is especially significant in health and safety applications.

It is to be understood that this application discloses a system, apparatus, software and method for resilient and adaptive integrated circuitry with self-healing capabilities. Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

A "processor" as used herein may be any type of controller or processor, and may be embodied as one or more processors 175, adapted to perform the functionality discussed herein. The processor may be in a separate system, or may be integrated as part of the die of the systems 100, 140, etc., and may be any type of processor or controller, such as a commercially available processor or microprocessor, e.g., ARM or MicroBlaze, or may be implemented using one or more SMEs 290. As the term processor is used herein, a processor may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components. As a consequence, as used herein, the term processor should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or $E^2PROM$. A processor (such as processor 1215), with its associated memory, may be adapted or configured (via programming, FPGA interconnection, or hard-wiring) to perform the methodologies of the invention. For example, the methodology may be programmed and stored, in a processor/controller 175 with its associated memory (and/or other memory) and other equivalent components, as a set of program instructions or other code (or equivalent configuration or other program) for subsequent execution when the processor is operative (i.e., powered on and functioning). Equivalently, when the processor 1215 may implemented in whole or part as FPGAs, custom ICs and/or ASICs, the FPGAs, custom ICs or ASICs also may be designed, configured and/or hard-wired to implement the methodology of the invention. For example, the processor may be implemented as an arrangement of processors, controllers, microprocessors, DSPs and/or ASICs, collectively referred to as a "controller" or "processor", which are respectively programmed, designed, adapted or configured to implement the methodology of the invention, in conjunction with a memory.

"Memory", as used herein, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor), whether volatile or non-volatile, whether removable or non-removable, including without limitation RAM, FLASH, DRAM, SDRAM, SRAM, MRAM, FeRAM, ROM, EPROM or $E^2PROM$, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. In addition, such computer readable media includes any form of communication media which embodies computer readable instructions, data structures, program modules or other data in a data signal or modulated signal, such as an electromagnetic or optical carrier wave or other transport mechanism, including any information delivery media, which may encode data or other information in a signal, wired or wirelessly, including electromagnetic, optical, acoustic, RF or infrared signals, and so on. The memory may be adapted to store various look up tables, parameters, coefficients, other information and data, programs or instructions (of the software of the present invention), and other types of tables such as database tables.

As indicated above, the processor/controller 175 is programmed, using software and data structures of the invention, for example, to perform the compilation methodology of the present invention. As a consequence, the system and method of the present invention may be embodied as software which provides such programming or other instructions, such as a set of instructions and/or metadata embodied within a computer readable medium. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, SystemC, LISA, XML, Java, Brew, SQL and its variations (e.g., SQL 99 or proprietary versions of SQL), DB2, Oracle, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 1215, for example).

The software, metadata, or other source code of the present invention and any resulting bit file (object code, database, or look up table) may be embodied within any tangible storage medium, such as any of the computer or other machine-readable data storage media, as computer-readable instructions, data structures, program modules or other data, such as discussed above with respect to the memory 1220, e.g., a floppy disk, a CDROM, a CD-RW, a DVD, a magnetic hard drive, an optical drive, or any other type of data storage apparatus or medium, as mentioned above.

Any I/O interfaces may be implemented as known or may become known in the art, and may include impedance matching capability, voltage translation for a low voltage processor to interface with a higher voltage control bus, and various switching mechanisms (e.g., transistors) to turn various lines or connectors on or off in response to signaling from the processor. In addition, the I/O interface may also be adapted to receive and/or transmit signals externally to the system, such as through hard-wiring, IR or RF signaling, for example, to receive information such as algorithms for compiling, for example. The I/O interface may provide connection to any type of bus or network structure or medium, using any selected architecture. By way of example and not limitation, such architectures include Industry Standard Architecture (ISA) bus, Enhanced ISA (EISA) bus, Micro Channel Architecture (MCA) bus, Peripheral Component Interconnect (PCI) bus, SAN bus, or any other communication or signaling medium, such as Ethernet, ISDN, T1, satellite, wireless, and so on. The I/O interface may be implemented as known or may become known in the art, to provide data communication between the processor and the network, using any applicable standard (e.g., one of the various PCI, USB or Ethernet standards, for example and without limitation).

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An apparatus comprising:
a communication element;
a plurality of composite circuit elements coupled to the communication element, each composite circuit element comprising a uniform element interface and a circuit element of a plurality of circuit element types, a first composite circuit element of the plurality of composite circuit elements having a first action, a second composite circuit element of the plurality of composite circuit elements having a second action, a third composite circuit element of the plurality of composite circuit elements having the first action, wherein the second composite circuit element has an assignable first data link to the first composite circuit element for performance of a first function or has an assignable second data link to the third composite circuit element for performance of the first function.

2. The apparatus of claim 1, wherein the first data link or the second data link are assigned in a binding process substantially at or before run-time.

3. The apparatus of claim 1, wherein the first composite circuit element and third composite circuit element are assigned the first action and the second composite circuit element is assigned the second action in a binding process substantially at or before run-time.

4. The apparatus of claim 1, wherein the first data link or the second data link are assigned during compilation of an executable program.

5. The apparatus of claim 1, wherein the first composite circuit element and third composite circuit element are assigned the first action and the second composite circuit element is assigned the second action during compilation of an executable program.

6. The apparatus of claim 1, wherein the first composite circuit element and third composite circuit element are assigned the first action and the second composite circuit element is assigned the second action in an executable program.

7. The apparatus of claim 1, further comprising:
a state machine element coupled to the plurality of communication elements, the state machine element, in response to an unavailability of the first composite circuit element, to assign the first action to the third composite circuit element and to provide for the second data link between the second composite circuit element and the third composite circuit element.

8. The apparatus of claim 7, wherein the first composite circuit element is unavailable due to a detected fault.

9. The apparatus of claim 8, wherein the fault is detected by at least one of the following operational determinations: a periodic diagnostic performed by at least one composite circuit element of the plurality of composite circuit elements; a background diagnostic performed as a selected context of at least one composite circuit element of the plurality of composite circuit elements; or a comparison test performed by a plurality of composite circuit elements of the same circuit element type.

10. The apparatus of claim 7, wherein the first composite circuit element is unavailable due to an assignment by the state machine element of a third action having a higher priority than the first action.

11. The apparatus of claim 7, wherein the plurality of circuit element types comprises at least one of the following circuit element types: a plurality of configurable element types, a memory element type, a plurality of communication element types; and a plurality of non-configurable element types.

12. The apparatus of claim 11, wherein the first composite circuit element and the third composite circuit element each have a first configurable element type of the plurality of configurable element types, the second composite circuit element has a second configurable element type of the plurality of configurable element types, and wherein the state machine element further is to assign the first action as a first configuration of the third composite circuit element.

13. The apparatus of claim 11, wherein the first composite circuit element has a first configurable element type of the plurality of configurable element types, the second composite circuit element has a second configurable element type of the plurality of configurable element types, the third composite circuit element has a third configurable element type of the plurality of configurable element types, and wherein the state machine element further is to assign the first action as a first configuration of the third composite circuit element.

14. The apparatus of claim 1, wherein each uniform element interface comprises:
a first memory coupled to the corresponding circuit element, the first memory to store at least one configuration of the corresponding circuit element;
an element controller coupled to the corresponding circuit element; and
a second memory coupled to the corresponding circuit element, the second memory to provide a plurality of input queues for data input to the corresponding circuit element.

15. The apparatus of claim 14, wherein the first memory further is to store a plurality of contexts, each context of the plurality of contexts specifying a selected configuration of a plurality of configurations of the corresponding circuit element, and either or both one or more data input sources or one or more data output destinations.

16. The apparatus of claim 14, wherein the element controller further is to store in the first memory a current state of a partial execution of a first context the plurality of contexts, execute a second context of the plurality of contexts, and retrieve the current state and resume execution of the first context.

17. The apparatus of claim 14, wherein the uniform element interface further comprises:
a third memory coupled to the circuit element, the third memory to provide a plurality of output queues for data output from the circuit element.

18. The apparatus of claim 14, wherein the element controller is, for a selected context of the plurality of contexts, to direct an execution of the selected context by the circuit element when a selected input queue corresponding to the selected context has input data and when a status bit corresponding to the selected context is set for execution.

19. The apparatus of claim 18, wherein the element controller further is to arbitrate among a plurality of contexts which are ready for execution and to select a corresponding context for execution as a result of the arbitration.

20. The apparatus of claim 19, wherein the arbitration implements at least one of the following arbitration methods: a round-robin, a priority, a most recently executed, a least recently executed, or a scheduled execution.

21. The apparatus of claim 1, wherein the communication element comprises:
a corresponding element interface; and
a corresponding communication circuit element.

22. The apparatus of claim 1, wherein the communication element is both to route at least one first data word and to switch at least one second data word.

23. The apparatus of claim 1, wherein the communication element comprises an intercluster queue to transfer a data word between adjacent pluralities of composite circuit elements.

24. The apparatus of claim 1, wherein each uniform element interface comprises:
a first memory coupled to the circuit element, the first memory to store a plurality of configurations as corresponding contexts;
an element controller coupled to the circuit element;
a second memory coupled to the circuit element, the second memory to provide a plurality of input queues for data input to the circuit element; and
a third memory coupled to the circuit element, the third memory to provide a plurality of output queues for data output from the circuit element.

25. The apparatus of claim 1, wherein each uniform element interface comprises:
a first memory coupled to the circuit element, the first memory to store a plurality of configurations as corresponding contexts;
an element controller coupled to the circuit element;
a second memory coupled to the circuit element, the second memory to provide a plurality of output queues for data output from the circuit element.

26. The apparatus of claim 1, further comprising a plurality of communication elements, wherein the plurality of communication elements further comprise:
a queue to buffer a data word from a first array of the plurality of composite circuit elements and to transfer the data word to an adjacent second array of the plurality of composite circuit elements; and
a full interconnect element coupled to the first plurality of composite circuit elements and to the queue, the full interconnect element to couple any output of a composite circuit element of the first plurality of composite circuit elements to any input of another composite circuit element of the first plurality of composite circuit elements or to the queue.

27. The apparatus of claim 26, wherein the full interconnect element is distributed among a plurality of switches, pass transistors, multiplexers or demultiplexers.

28. The apparatus of claim 26, wherein the full interconnect element is a crossbar switch.

29. The apparatus of claim 26, wherein the full interconnect element is to provide at least one of the following physical data links: a plurality of one-to-one input and output data links, a one-to-many broadcast data link, a many-to-one data link.

30. The apparatus of claim 26, further comprising a state machine element to provide for the second data link as a virtual data link either through the queue or through the full interconnect element.

31. The apparatus of claim 30, wherein the plurality of communication elements further comprise:
a message manager circuit coupled to the state machine element, the message manager circuit both to route at least one first data word and to switch at least one second data word.

32. The apparatus of claim 1, wherein the communication element is to route or switch at least one data word between a first array of the plurality of composite circuit elements and a second array of the plurality of composite circuit elements.

33. The apparatus of claim 1, wherein the communication element is to buffer at least one data word from a first array of the plurality of composite circuit elements and to transfer the at least one data word to an adjacent second array of the plurality of composite circuit elements.

34. The apparatus of claim 1, wherein the plurality of communication elements further comprise:
a plurality of first communication elements, the plurality of first communication elements both to route at least one first data word and to switch at least one second data word; and
an interconnect element coupled to the plurality of composite circuit elements and to the plurality of first communication elements, the interconnect element to concurrently couple at least two of the corresponding outputs of the plurality of composite circuit elements to at least two of the corresponding inputs of the plurality of composite circuit elements or to the plurality of first communication elements.

35. The apparatus of claim 1, further comprising:
a message manager circuit coupled to the state machine element, the message manager circuit to provide a communication interface to an external bus or an external memory.

36. The apparatus of claim 1, further comprising:
a message manager circuit coupled to the state machine element, the message manager circuit to provide a uniform address space for a distributed plurality of memory composite circuit elements.

37. The apparatus of claim 1, wherein the plurality of circuit element types comprise at least two of the following circuit element types: a configurable arithmetic logic unit, a configurable multiplier, a configurable bit reordering element a configurable multiply and accumulate element, a configurable Galois multiplier, a configurable barrel shifter, a configurable look-up table, a programmable controller, a configurable controller, and a configurable plurality of arithmetic logic units.

38. The apparatus of claim 1, further comprising:
a state machine element coupled to the plurality of composite circuit elements through the communication element.

39. The apparatus of claim 38, wherein the state machine element is a controller or processor.

40. The apparatus of claim 38, wherein the state machine element further comprises:
a finite state machine circuit; and
a memory to store state information.

41. The apparatus of claim 1, wherein the communication element is to determine from the second data link at least one physical data link, of a plurality of physical data links, between the third composite circuit element and the second composite circuit element.

42. The apparatus of claim 41, wherein the communication element is further to create the plurality of physical data links at a selected time or a selected clock cycle using a routing table stored in a corresponding memory.

43. The apparatus of claim 1, wherein the plurality of composite circuit elements are to store periodically a then current state and, in response to a detected fault, to retrieve the stored state and recommence operation using the stored state.

44. An apparatus comprising:
a state machine element;
an interconnect element;
an intercluster queue coupled to the interconnect element, the intercluster queue to buffer a data word from a first plurality of composite circuit elements and to transfer the data word to an adjacent second plurality of composite circuit elements;
the first plurality of composite circuit elements coupled to the interconnect element, each composite circuit element comprising a uniform element interface and a circuit element of a plurality of circuit element types, a first composite circuit element of the first plurality of composite circuit elements having a first action, a second composite circuit element of the first plurality of composite circuit elements having a second action, the first composite circuit element having an assignable first data link to the second composite circuit element through the interconnect element, wherein each uniform element interface comprises:
a first memory coupled to the corresponding circuit element, and when the corresponding circuit element is configurable, the first memory to store at least one configuration of the corresponding circuit element;
an element controller coupled to the corresponding circuit element;
a second memory coupled to the corresponding circuit element, the second memory to provide a plurality of input queues for data input to the corresponding circuit element; and
a third memory coupled to the corresponding circuit element, the third memory to provide a plurality of output queues for data output from the corresponding circuit element.

45. The apparatus of claim 44, wherein the state machine element is, in response to a detected fault of the first composite circuit element, to assign the first action to a third composite circuit element of the plurality of composite circuit elements and to provide for a second data link between the third composite circuit element and the second composite circuit element through the interconnect element or the intercluster queue.

46. The apparatus of claim 44, wherein the first memory further is to store a plurality of contexts, each context of the plurality of contexts specifying a selected configuration of a plurality of configurations of the corresponding circuit element, and either or both one or more data input sources or one or more data output destinations.

47. The apparatus of claim 46, wherein the element controller is, for a selected context of the plurality of contexts, to direct an execution of the selected context by the circuit element when a selected input queue corresponding to the selected context has input data and when a status bit corresponding to the selected context is set for execution.

48. The apparatus of claim 47, wherein the element controller further is to arbitrate among a plurality of contexts which are ready for execution and to select a corresponding context for execution as a result of the arbitration, wherein the arbitration implements at least one of the following arbitration methods: a round-robin, a priority, a most recently executed, a least recently executed, or a scheduled execution.

49. The apparatus of claim 44, further comprising:
a communication element coupled to the interconnect element, the communication element both to route at least one first data word and to switch at least one second data word.

50. The apparatus of claim 44, wherein the interconnect element is to couple any output queue of a composite circuit element of the first plurality of composite circuit elements to any input queue of another composite circuit element of the first plurality of composite circuit elements or to the intercluster queue.

51. The apparatus of claim 50, wherein the full interconnect element is distributed among a plurality of switches, pass transistors, multiplexers or demultiplexers.

52. The apparatus of claim 50, wherein the full interconnect element is a crossbar switch.

53. The apparatus of claim 44, further comprising:
a message manager circuit coupled to the state machine element, the message manager circuit both to route at least one first data word and to switch at least one second data word.

54. The apparatus of claim 44, further comprising:
a message manager circuit coupled to the state machine element, the message manager circuit to provide a communication interface to an external bus or an external memory.

55. The apparatus of claim 44, further comprising:
a message manager circuit coupled to the state machine element, the message manager circuit to provide a uniform address space for a distributed plurality of memory composite circuit elements.

56. The apparatus of claim 44, wherein the state machine element is a controller or processor.

57. The apparatus of claim 44, wherein the state machine element further comprises:
a finite state machine circuit; and
a memory to store state information.

58. An apparatus comprising:
a plurality of circuit arrays, each circuit array of the plurality of circuit arrays comprising:
an interconnect element;
a plurality of communication elements coupled to the interconnect element, the plurality of communication elements to transfer data from a first circuit array to a second circuit array of the plurality of circuit arrays;
a plurality of composite circuit elements coupled to the interconnect element, each composite circuit element comprising an element interface and a circuit element of a plurality of circuit element types, a first composite circuit element of the plurality of composite circuit elements having a first action, a second composite circuit element of the plurality of composite circuit elements having a second action, the first composite circuit element having a first data link to the second composite circuit element through the interconnect element; and
a state machine element coupled to the plurality of composite circuit elements.

59. The apparatus of claim 58, wherein the state machine element is, in response to an unavailability of the first composite circuit element, to assign the first action to a third composite circuit element and to provide for a second data link between the second composite circuit element and the third composite circuit element.

60. The apparatus of claim 59, wherein the first composite circuit element is unavailable due to a detected fault or due to an assignment of a third action having a higher priority than the first action.

61. The apparatus of claim 58, wherein each element interface comprises:
a first memory coupled to the corresponding circuit element, the first memory to store at least one configuration of the corresponding circuit element;
an element controller coupled to the corresponding circuit element; and
a second memory coupled to the corresponding circuit element, the second memory to provide a plurality of input queues for data input to the corresponding circuit element; and
a third memory coupled to the circuit element, the third memory to provide a plurality of output queues for data output from the circuit element.

62. The apparatus of claim 61, wherein the first memory further is to store a plurality of contexts, each context of the plurality of contexts specifying a selected configuration of a plurality of configurations of the corresponding circuit element, and either or both one or more data input sources or one or more data output destinations.

63. The apparatus of claim 61, wherein the element controller is, for a selected context of the plurality of contexts, to direct an execution of the selected context by the circuit element when a selected input queue corresponding to the selected context has input data and when a status bit corresponding to the selected context is set for execution.

64. The apparatus of claim 63, wherein the element controller further is to arbitrate among a plurality of contexts which are ready for execution and to select a corresponding context for execution as a result of the arbitration.

65. The apparatus of claim 58, wherein the plurality of communication elements further comprise:
a queue to buffer a data word from a first circuit array plurality of circuit arrays and to transfer the data word to an adjacent circuit array of the plurality of circuit arrays.

66. The apparatus of claim 58, wherein the interconnect element is to couple any output queue of a composite circuit element of a first circuit array to any input queue of another composite circuit element of the first circuit array or to a communication element of the plurality of communication elements.

67. The apparatus of claim 66, wherein the interconnect element is a crossbar switch or is distributed among a plurality of switches, pass transistors, multiplexers or demultiplexers.

68. The apparatus of claim 58, wherein a selected communication element of the plurality of communication elements is to route or switch at least one data word between a first circuit array of the plurality of circuit arrays and a second array of the plurality of circuit arrays.

69. The apparatus of claim 58, wherein a selected communication element of the plurality of communication elements is to buffer at least one data word from a first circuit array of the plurality of circuit arrays and to transfer the at least one data word to an adjacent second circuit array of the plurality of circuit arrays.

70. The apparatus of claim 58, further comprising:
a message manager circuit coupled to the state machine element, the message manager circuit to provide a communication interface to an external bus or an external memory.

71. The apparatus of claim 58, further comprising:
a message manager circuit coupled to the state machine element, the message manager circuit to provide a uniform address space for a distributed plurality of memory composite circuit elements.

72. The apparatus of claim 58, wherein a selected communication element of the plurality of communication elements is to route, switch, or provide hybrid routing and switching of at least one data word from a first circuit array of the plurality of circuit arrays to a second circuit array of the plurality of circuit arrays.

73. An integrated circuit comprising:
a first plurality of composite circuit elements, a first composite circuit element of the first plurality of composite circuit elements to perform a first function;
a plurality of communication elements coupled to the first plurality of composite circuit elements;
an interconnect element coupled to the first plurality of composite circuit elements, the interconnect element to couple any output queue of a composite circuit element of the first plurality of composite circuit elements to any input queue of another composite circuit element of the first plurality of composite circuit elements or to a communication element of the plurality of communication elements;

a state machine element coupled to the first plurality of composite circuit elements; and a second plurality of composite circuit elements having a plurality of data links to the first plurality of composite circuit elements through at least one communication element of the plurality of communication elements for performance of the first function.

74. An integrated circuit comprising:

a first plurality of composite circuit elements, a first composite circuit element of the first plurality of composite circuit elements to perform a first function;

a memory coupled to the first plurality of composite circuit elements;

a plurality of communication elements coupled to the first plurality of composite circuit elements;

an interconnect element coupled to the first plurality of composite circuit elements, the interconnect element to couple any output queue of a composite circuit element of the first plurality of composite circuit elements to any input queue of another composite circuit element of the first plurality of composite circuit elements or to a communication element of the plurality of communication elements;

a state machine element coupled to the first plurality of composite circuit elements; and a second plurality of composite circuit elements having a plurality of data links to the first plurality of composite circuit elements through at least one communication element of the plurality of communication elements for performance of the first function.

* * * * *